United States Patent
Nakamura et al.

(10) Patent No.: US 10,332,859 B2
(45) Date of Patent: Jun. 25, 2019

(54) DISPLAY DEVICE WITH OVERLAPPED DISPLAY PANELS CAPABLE OF DISPLAYING A WIDE COLOR GAMUT IMAGE ON A SEAMLESS WIDE DISPLAY REGION

(71) Applicant: Semiconductor Energy Laboratory Co., Ltd., Atsugi-shi, Kanagawa-ken (JP)

(72) Inventors: Daiki Nakamura, Atsugi (JP); Yusuke Nishido, Atsugi (JP); Satoshi Seo, Sagamihara (JP); Toshiki Sasaki, Isehara (JP); Ryohei Yamaoka, Atsugi (JP); Akihiro Kaita, Ichinoseki (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 19 days.

(21) Appl. No.: 15/817,497

(22) Filed: Nov. 20, 2017

(65) Prior Publication Data

US 2018/0151539 A1    May 31, 2018

(30) Foreign Application Priority Data

Nov. 30, 2016  (JP) .................................. 2016-233446
May 18, 2017   (JP) .................................. 2017-098884

(51) Int. Cl.
*H01L 25/065*   (2006.01)
*H01L 27/32*    (2006.01)

(52) U.S. Cl.
CPC ...... *H01L 25/0652* (2013.01); *H01L 27/3206* (2013.01); *H01L 27/3211* (2013.01); *H01L 27/3267* (2013.01); *H01L 27/3293* (2013.01)

(58) Field of Classification Search
CPC ............. H01L 27/3206; H01L 27/3211; H01L 27/3213; H01L 27/322; H01L 27/3267; H01L 27/3293; H01L 25/0652
See application file for complete search history.

(56) References Cited

U.S. PATENT DOCUMENTS 5,801,797 A    9/1998  Iida et al.
7,425,794 B2   9/2008  Adachi
(Continued)

FOREIGN PATENT DOCUMENTS

CN    102484123 A    5/2012
CN    106537486 A    3/2017
(Continued)

OTHER PUBLICATIONS

Releasing the Industry's First 30-Inch Master Monitor Equipped with 4K Organic EL Panel, https://www.sony.co.jp/SonyInfo/News/Press/201411/14-114/, Nov. 19, 2014, Sony Japan[online].
(Continued)

*Primary Examiner* — Andrew Q Tran
(74) *Attorney, Agent, or Firm* — Robinson Intellectual Property Law Office; Eric J. Robinson

(57) ABSTRACT

A display panel includes a plurality of light-emitting elements. Light emitted from a first light-emitting element has a CIE 1931 chromaticity coordinate x of greater than 0.680 and less than or equal to 0.720 and a CIE 1931 chromaticity coordinate y of greater than or equal to 0.260 and less than or equal to 0.320. Light emitted from a second light-emitting element has a CIE 1931 chromaticity coordinate x of greater than or equal to 0.130 and less than or equal to 0.250 and a CIE 1931 chromaticity coordinate y of greater than 0.710 and less than or equal to 0.810. Light emitted from a third light-emitting element has a CIE 1931 chromaticity coordinate x of greater than or equal to 0.120 and less than or equal to
(Continued)

to 0.170 and a CIE 1931 chromaticity coordinate y of greater than or equal to 0.020 and less than 0.060.

27 Claims, 29 Drawing Sheets

(56) References Cited

U.S. PATENT DOCUMENTS

| | | | |
|---|---|---|---|
| 7,548,019 B2 * | 6/2009 | Omura | H01L 51/5265 313/504 |
| 8,305,294 B2 | 11/2012 | Cok et al. | |
| 8,789,968 B2 | 7/2014 | Ohsawa et al. | |
| 8,952,946 B2 | 2/2015 | Fukunaga et al. | |
| 8,957,442 B2 | 2/2015 | Seo et al. | |
| 9,000,458 B2 | 4/2015 | Seo et al. | |
| 9,006,755 B2 | 4/2015 | Seo et al. | |
| 9,088,006 B2 | 7/2015 | Yamazaki et al. | |
| 9,153,627 B2 | 10/2015 | Ohsawa et al. | |
| 9,172,059 B2 | 10/2015 | Seo et al. | |
| 9,343,515 B2 | 5/2016 | Sugisawa et al. | |
| 9,343,691 B2 | 5/2016 | Seo et al. | |
| 9,412,793 B2 | 8/2016 | Seo et al. | |
| 9,450,032 B2 | 9/2016 | Seo et al. | |
| 9,614,022 B2 | 4/2017 | Miyake et al. | |
| 9,653,705 B2 | 5/2017 | Uesaka et al. | |
| 9,691,825 B2 | 6/2017 | Seo et al. | |
| 9,711,110 B2 | 7/2017 | Yamazaki et al. | |
| 9,721,998 B2 | 8/2017 | Yamazaki | |
| 9,799,829 B2 | 10/2017 | Yasumoto et al. | |
| 9,905,788 B2 * | 2/2018 | Lee | H01L 51/5012 |
| 2002/0113546 A1 | 8/2002 | Seo et al. | |
| 2003/0032210 A1 | 2/2003 | Takayama et al. | |
| 2003/0090198 A1 | 5/2003 | Aston | |
| 2005/0285811 A1 | 12/2005 | Kawase et al. | |
| 2007/0001588 A1 | 1/2007 | Boroson et al. | |
| 2007/0035243 A1 | 2/2007 | Lee | |
| 2008/0122350 A1 | 5/2008 | Sakata et al. | |
| 2008/0158107 A1 | 7/2008 | Miller et al. | |
| 2010/0164906 A1 | 7/2010 | Fukunaga et al. | |
| 2010/0177018 A1 | 7/2010 | Wang et al. | |
| 2011/0050657 A1 | 3/2011 | Yamada | |
| 2011/0057861 A1 | 3/2011 | Cok et al. | |
| 2012/0075273 A1 | 3/2012 | Abe et al. | |
| 2012/0268445 A1 | 10/2012 | Ogata et al. | |
| 2013/0200783 A1 | 8/2013 | Van Heck et al. | |
| 2013/0201636 A1 | 8/2013 | Van Den Brand et al. | |
| 2013/0201637 A1 | 8/2013 | De Kok et al. | |
| 2013/0264549 A1 | 10/2013 | Yamazaki et al. | |
| 2014/0117339 A1 | 5/2014 | Seo | |
| 2015/0028316 A1 | 1/2015 | Kojima et al. | |
| 2015/0171360 A1 | 6/2015 | Kittichungchit et al. | |
| 2016/0014882 A1 | 1/2016 | Jongman et al. | |
| 2016/0037608 A1 | 2/2016 | Ikeda et al. | |
| 2016/0064682 A1 | 3/2016 | Yamae et al. | |
| 2016/0093678 A1 | 3/2016 | Seo et al. | |
| 2016/0190500 A1 | 6/2016 | Watabe et al. | |
| 2017/0154947 A1 | 6/2017 | Nakamura | |
| 2017/0271431 A1 | 9/2017 | Miyake et al. | |
| 2017/0331065 A1 | 11/2017 | Seo et al. | |
| 2017/0338289 A1 | 11/2017 | Seo et al. | |

FOREIGN PATENT DOCUMENTS

| | | |
|---|---|---|
| EP | 2476137 A | 7/2012 |
| JP | 2013-504092 | 2/2013 |
| JP | 2014-197522 A | 10/2014 |
| JP | 2016-072250 A | 5/2016 |
| JP | 2016-127287 A | 7/2016 |
| JP | 2016-206630 A | 12/2016 |
| KR | 2012-0059575 A | 6/2012 |
| KR | 2017-0040205 A | 4/2017 |
| TW | 201117376 | 5/2011 |
| TW | 201624789 | 7/2016 |
| TW | 201629586 | 8/2016 |
| WO | WO-2011/031605 | 3/2011 |
| WO | WO-2013/128740 | 9/2013 |
| WO | WO-2016/016765 | 2/2016 |
| WO | WO-2016/063812 | 4/2016 |

OTHER PUBLICATIONS

International Search Report (Application No. PCT/IB2017/057152) dated Feb. 20, 2018.
Written Opinion (Application No. PCT/IB2017/057152) dated Feb. 20, 2018.

* cited by examiner

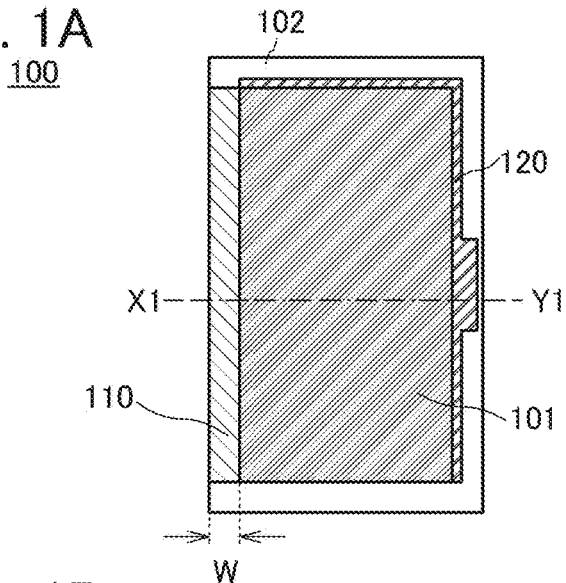
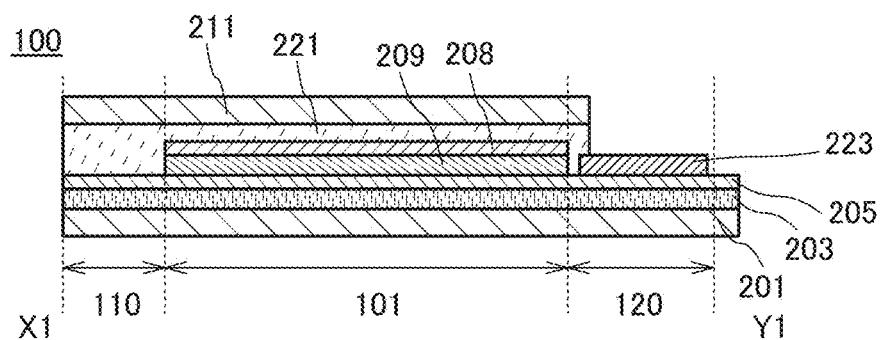
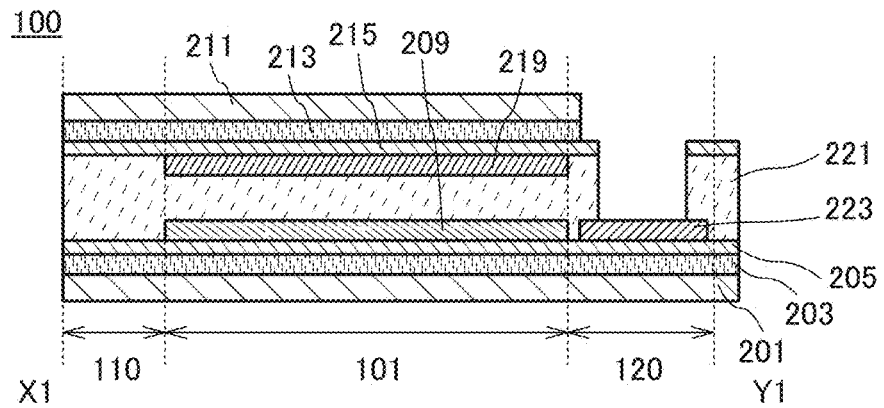

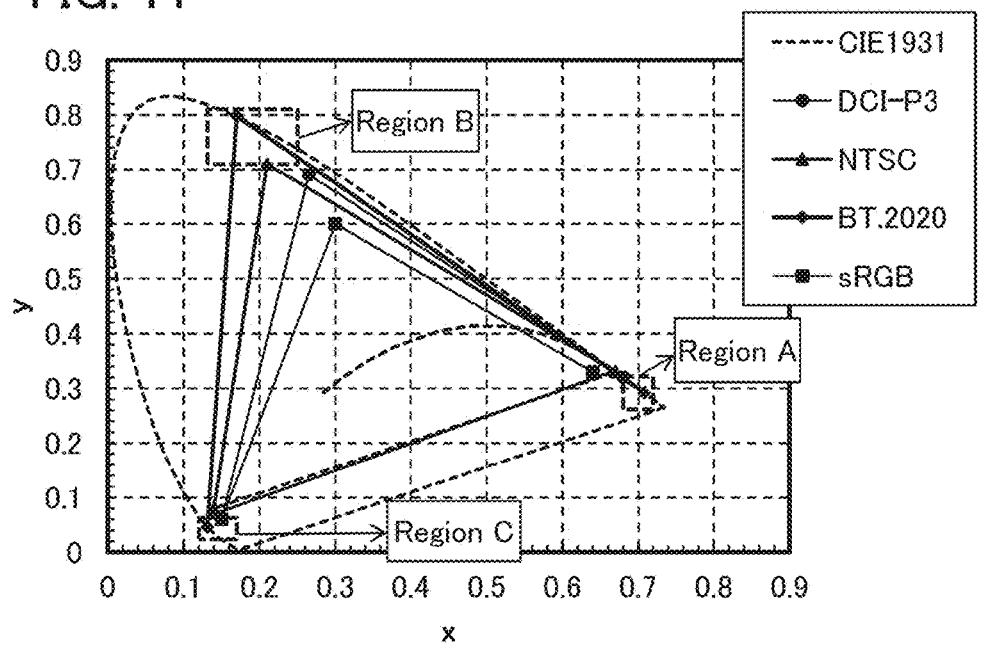

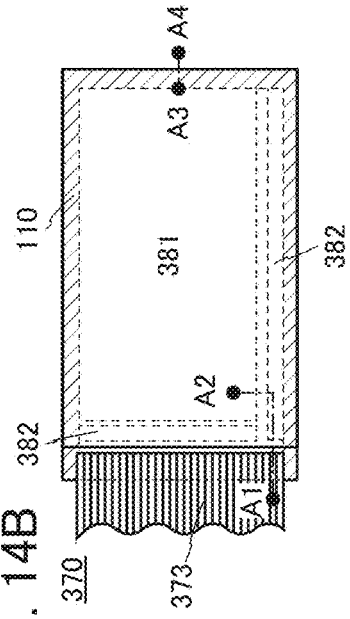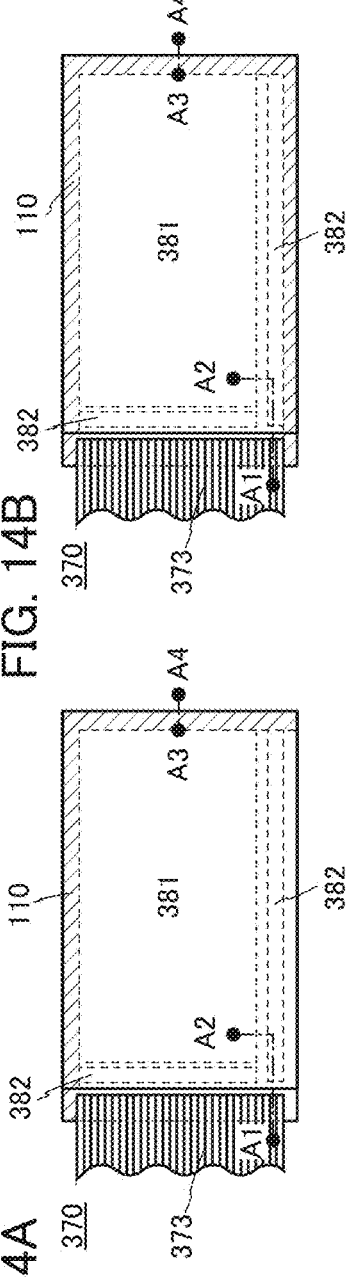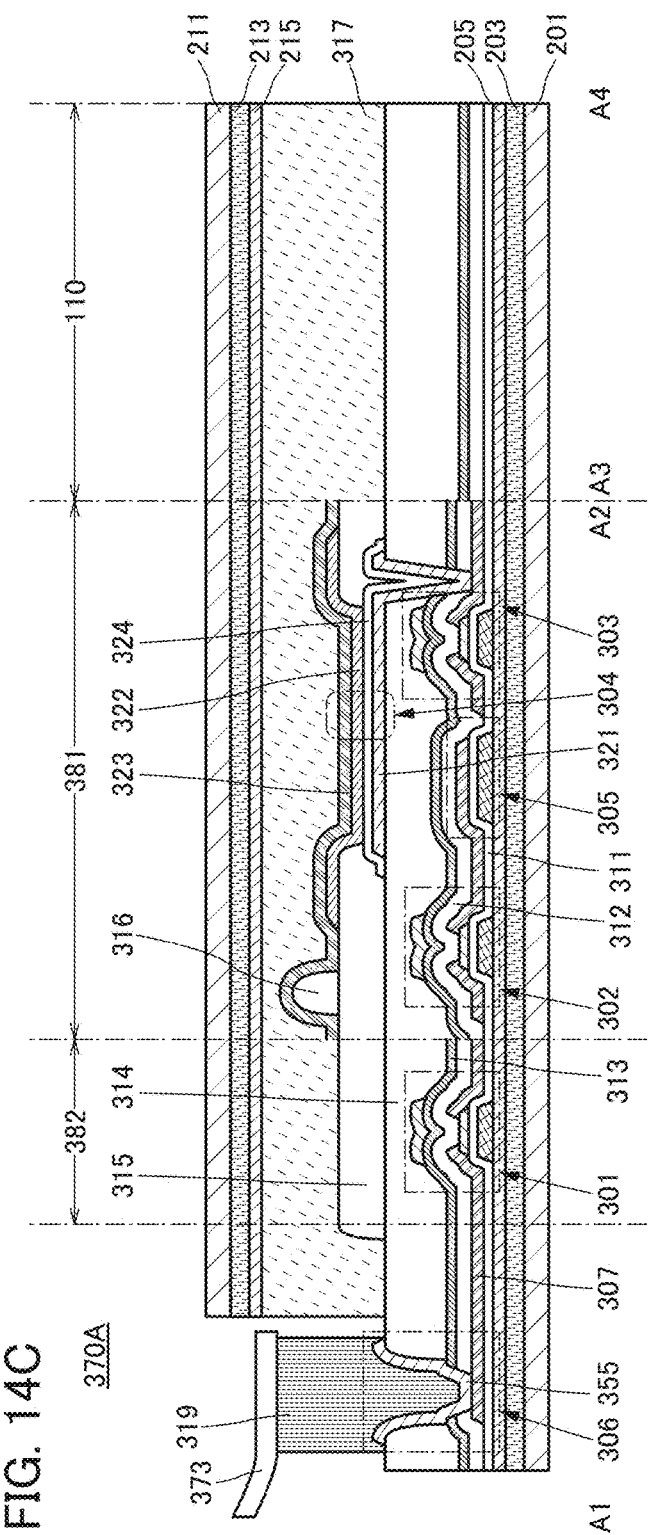

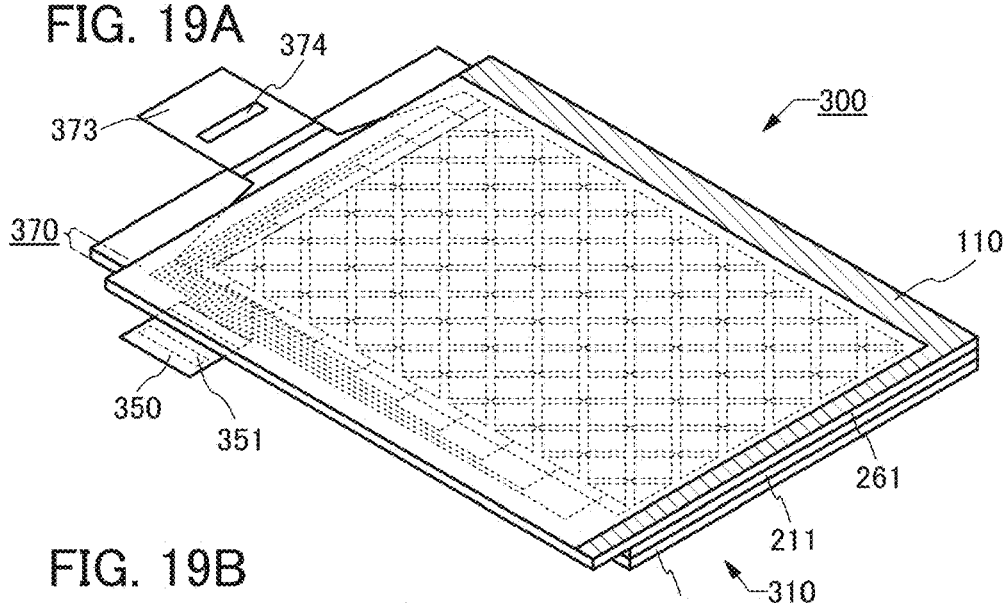
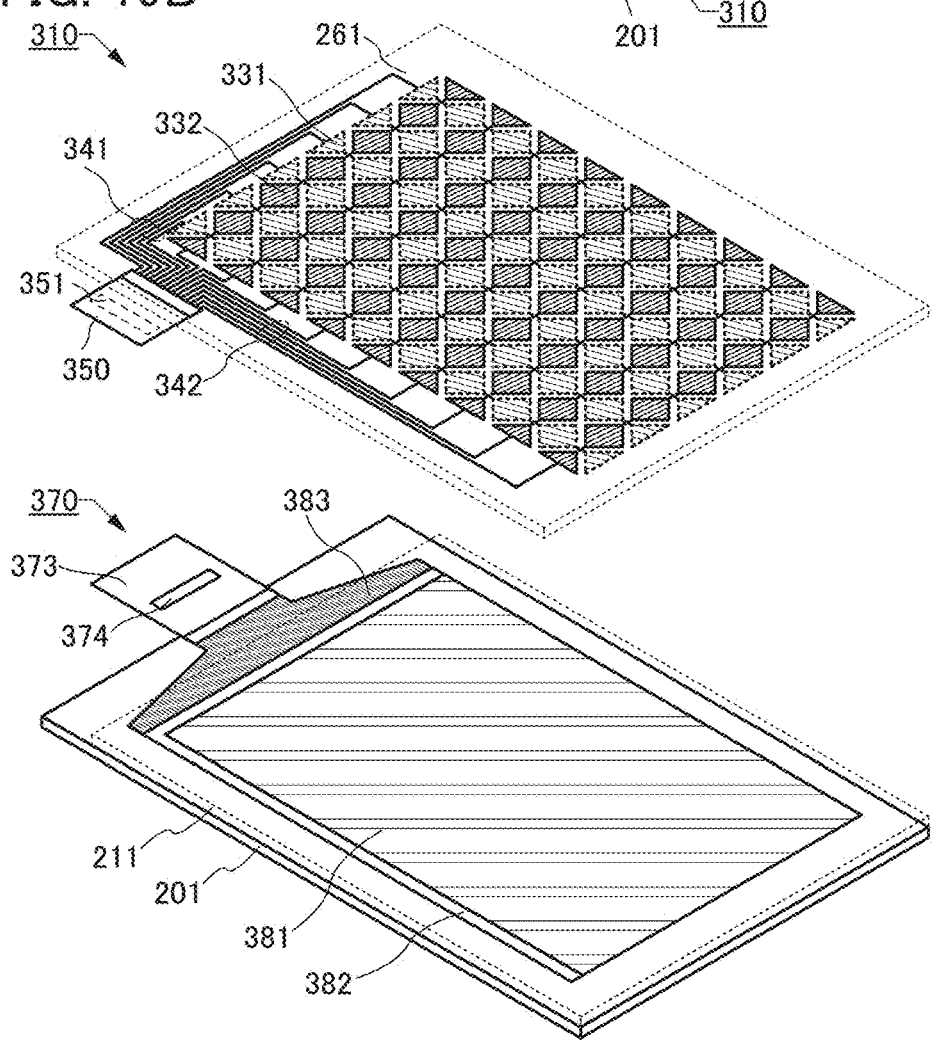

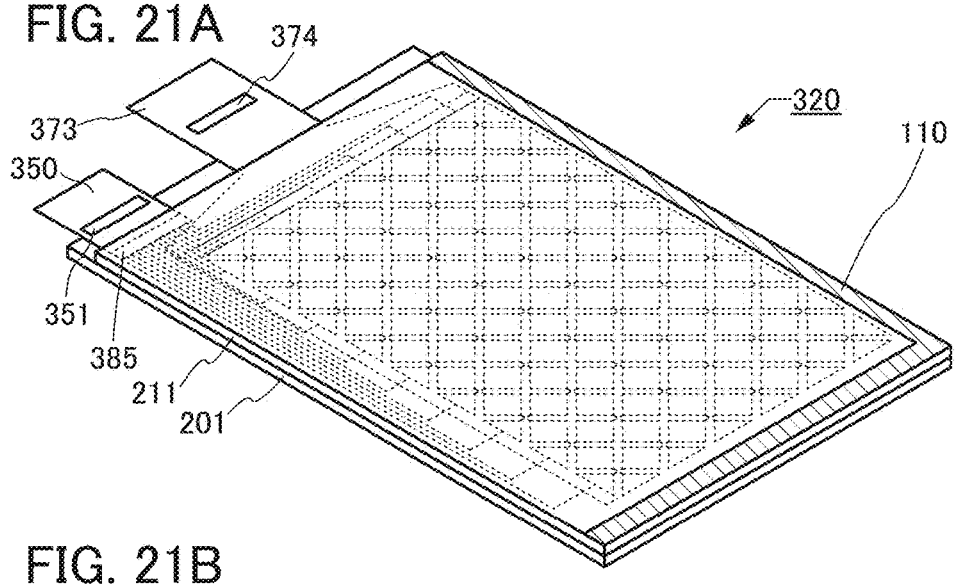
FIG. 21A
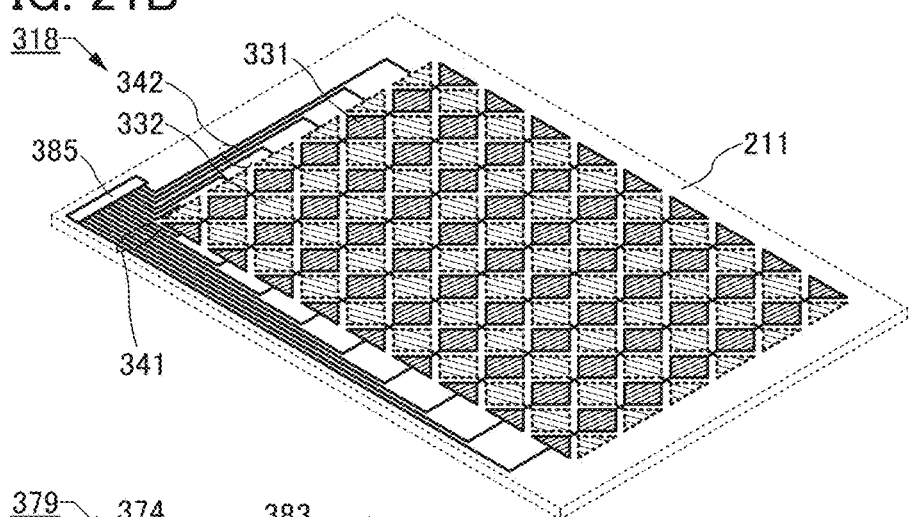
FIG. 21B
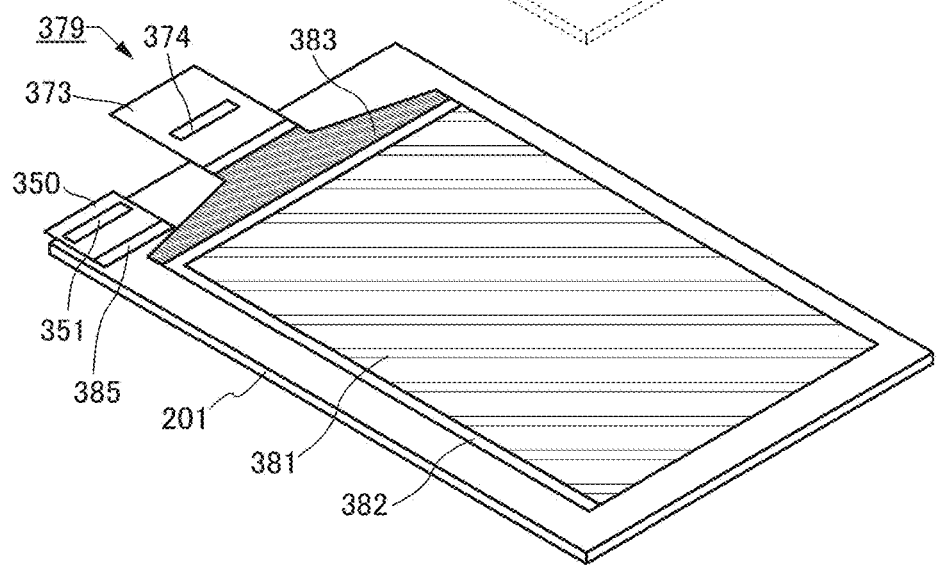

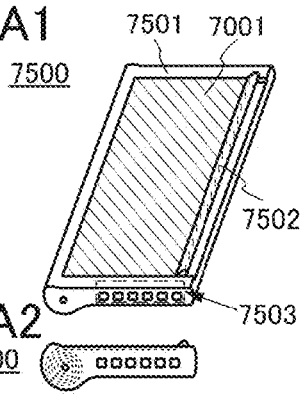
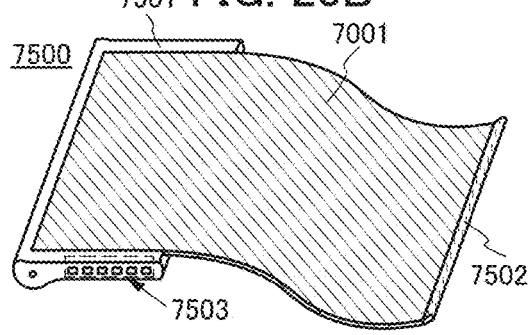
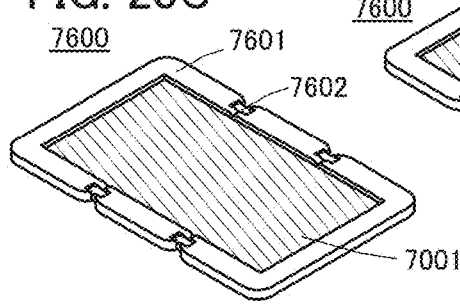
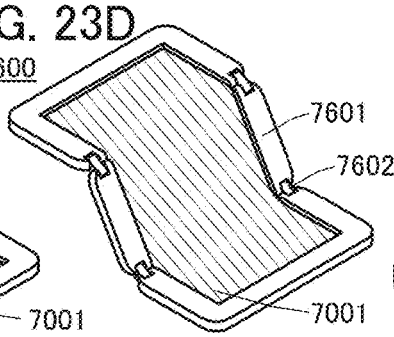
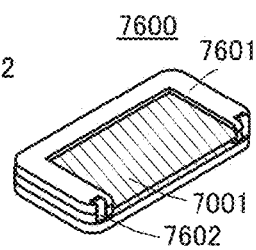
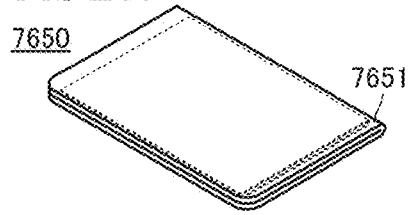
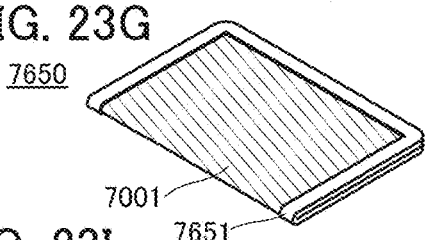
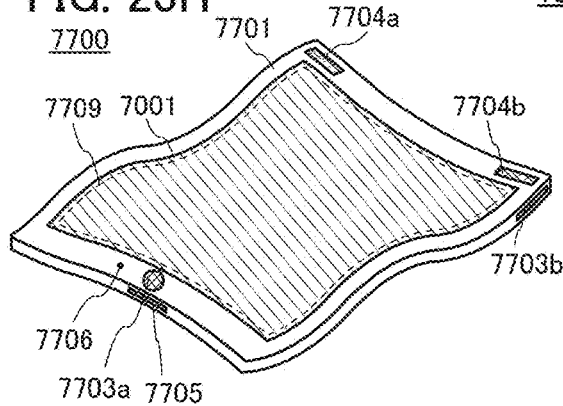
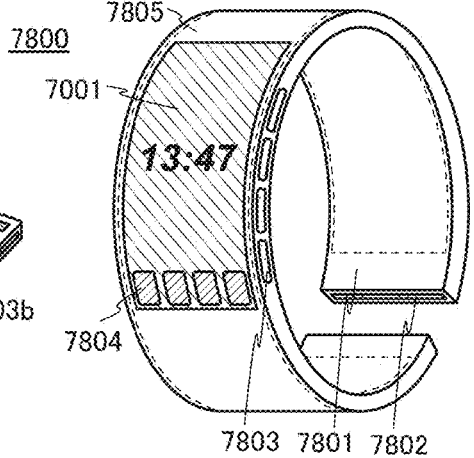

DISPLAY DEVICE WITH OVERLAPPED DISPLAY PANELS CAPABLE OF DISPLAYING A WIDE COLOR GAMUT IMAGE ON A SEAMLESS WIDE DISPLAY REGION

TECHNICAL FIELD

One embodiment of the present invention relates to a display device, an electronic device, and a manufacturing method thereof.

Note that one embodiment of the present invention is not limited to the above technical field. Examples of the technical field of one embodiment of the present invention include a semiconductor device, a display device, a light-emitting device, an electronic device, a lighting device, an input device (e.g., a touch sensor), an input-output device (e.g., a touch panel), a driving method thereof, and a manufacturing method thereof.

BACKGROUND ART

In recent years, larger display devices have been required. Examples of uses for a large display device include a television device for home use (also referred to as a TV or a television receiver), digital signage, and a public information display (PID). A larger display region of a display device can provide more information at a time. In addition, a larger display region attracts more attention, so that the effectiveness of the advertisement is expected to be increased, for example.

Light-emitting elements utilizing electroluminescence (also referred to as EL elements) have features such as ease of thinning and lightening, high-speed response to an input signal, and driving with a direct-current low voltage source; thus, application of the EL elements to display devices has been proposed. For example, Patent Document 1 discloses a flexible light-emitting device including an organic EL element.

REFERENCE

Patent Document

[Patent Document 1] Japanese Published Patent Application No. 2014-197522

DISCLOSURE OF INVENTION

An object of one embodiment of the present invention is to increase the size of a display device. Another object of one embodiment of the present invention is to provide a display device including a wide display region in which a seam is less likely to be noticed. Another object of one embodiment of the present invention is to provide a display device that can display an image with a wide color gamut. Another object of one embodiment of the present invention is to suppress display unevenness or luminance unevenness of a display device. Another object of one embodiment of the present invention is to reduce the thickness or weight of a display device. Another object of one embodiment of the present invention is to provide a display device that can display an image along a curved surface. Another object of one embodiment of the present invention is to provide a highly browsable display device. Another object of one embodiment of the present invention is to provide a novel display device.

Note that the description of these objects does not preclude the existence of other objects. In one embodiment of the present invention, there is no need to achieve all the objects. Other objects can be derived from the description of the specification, the drawings, and the claims.

A display device of one embodiment of the present invention includes a first display panel and a second display panel. The first display panel includes a first display region. The second display panel includes a second display region and a region transmitting visible light. The second display region is adjacent to the region transmitting visible light. The first display region includes a portion overlapping with the region transmitting visible light. The first display panel includes a first light-emitting element, a second light-emitting element, and a third light-emitting element. Light emitted from the first light-emitting element has a CIE 1931 chromaticity coordinate x of greater than 0.680 and less than or equal to 0.720 and a CIE 1931 chromaticity coordinate y of greater than or equal to 0.260 and less than or equal to 0.320. Light emitted from the second light-emitting element has a CIE 1931 chromaticity coordinate x of greater than or equal to 0.130 and less than or equal to 0.250 and a CIE 1931 chromaticity coordinate y of greater than 0.710 and less than or equal to 0.810. Light emitted from the third light-emitting element has a CIE 1931 chromaticity coordinate x of greater than or equal to 0.120 and less than or equal to 0.170 and a CIE 1931 chromaticity coordinate y of greater than or equal to 0.020 and less than 0.060. Alternatively, the first light-emitting element emits light that has a CIE 1931 chromaticity coordinate x of greater than 0.680 and less than or equal to 0.720 and a CIE 1931 chromaticity coordinate y of greater than or equal to 0.260 and less than or equal to 0.320. The second light-emitting element emits light that has a CIE 1931 chromaticity coordinate x of greater than or equal to 0.130 and less than or equal to 0.250 and a CIE 1931 chromaticity coordinate y of greater than 0.710 and less than or equal to 0.810. The third light-emitting element emits light that has a CIE 1931 chromaticity coordinate x of greater than or equal to 0.120 and less than or equal to 0.170 and a CIE 1931 chromaticity coordinate y of greater than or equal to 0.020 and less than 0.060.

A display device of one embodiment of the present invention includes a first display panel and a second display panel. The first display panel includes a first display region. The second display panel includes a second display region and a region transmitting visible light. The second display region is adjacent to the region transmitting visible light. The first display region includes a portion overlapping with the region transmitting visible light. The first display panel includes a first light-emitting element, a second light-emitting element, a third light-emitting element, a first coloring layer, a second coloring layer, and a third coloring layer. Light obtained from the first light-emitting element through the first coloring layer has a CIE 1931 chromaticity coordinate x of greater than 0.680 and less than or equal to 0.720 and a CIE 1931 chromaticity coordinate y of greater than or equal to 0.260 and less than or equal to 0.320. Light obtained from the second light-emitting element through the second coloring layer has a CIE 1931 chromaticity coordinate x of greater than or equal to 0.130 and less than or equal to 0.250 and a CIE 1931 chromaticity coordinate y of greater than 0.710 and less than or equal to 0.810. Light obtained from the third light-emitting element through the third coloring layer has a CIE 1931 chromaticity coordinate x of greater than or equal to 0.120 and less than or equal to 0.170 and a CIE 1931 chromaticity coordinate y of greater than or equal to 0.020 and less than 0.060. Note that color filters or the like can be used as the coloring layers.

The first coloring layer preferably has a 600-nm light transmittance of less than or equal to 60% and a 650-nm light transmittance of greater than or equal to 70%. The second coloring layer preferably has a 480-nm light transmittance of less than or equal to 60%, a 580-nm light transmittance of less than or equal to 60%, and a 530-nm light transmittance of greater than or equal to 70%. The third coloring layer preferably has a 510-nm light transmittance of less than or equal to 60% and a 450-nm light transmittance of greater than or equal to 70%.

The emission spectrum of the light obtained from the first light-emitting element through the first coloring layer preferably has a peak value of greater than or equal to 620 nm and less than or equal to 680 nm.

The first light-emitting element, the second light-emitting element, and the third light-emitting element may include an electron-transport layer between a pair of electrodes and may each include a light-emitting layer between the pair of electrodes. In that case, the light-emitting layer in the first light-emitting element, that in the second light-emitting element, and that in the third light-emitting element are preferably separated from each other. In addition, the first light-emitting element, the second light-emitting element, and the third light-emitting element preferably share the same electron-transport layer.

The first light-emitting element, the second light-emitting element, and the third light-emitting element may include a hole-injection layer between the pair of electrodes. In that case, the first light-emitting element, the second light-emitting element, and the third light-emitting element preferably share the same hole-injection layer. The hole-injection layer preferably contains a hole-transport material and an acceptor material.

The first light-emitting element, the second light-emitting element, and the third light-emitting element may each include a hole-transport layer between the pair of electrodes. In that case, the hole-transport layer in the first light-emitting element, that in the second light-emitting element, and that in the third light-emitting element are preferably separated from each other.

The first light-emitting element, the second light-emitting element, and the third light-emitting element may each include a reflective electrode and a transflective electrode as the pair of electrodes.

In the structure including the reflective electrode and the transflective electrode, an optical path length between the reflective electrode and the transflective electrode in the first light-emitting element is preferably set so that emission intensity of red light can be increased. An optical path length between the reflective electrode and the transflective electrode in the second light-emitting element is preferably set so that emission intensity of green light can be increased. An optical path length between the reflective electrode and the transflective electrode in the third light-emitting element is preferably set so that emission intensity of blue light can be increased.

The first light-emitting element, the second light-emitting element, and the third light-emitting element may each include an EL layer between the pair of electrodes. In that case, the EL layers included in the first light-emitting element, the second light-emitting element, and the third light-emitting element are preferably EL layers that emit white light and that are formed using the same material. The EL layer includes at least a light-emitting layer. A plurality of EL layers may be included in each light-emitting element, and the EL layers may be stacked with a charge generation layer positioned therebetween. To extract light with different colors efficiently from the EL layers that emit white light in the light-emitting elements, optical path lengths between the pair of electrodes are preferably adjusted depending on the emission color to form what is called a microcavity structure.

One or both of the first display region and the second display region may have a curved surface.

The first display panel may have a first curved surface and a second curved surface. The first curved surface includes the first display region, and the second curved surface does not include the first display region. In that case, the radius of curvature of the first curved surface may be larger than the radius of curvature of the second curved surface. For example, the radius of curvature of the first curved surface is larger than the radius of curvature of the second curved surface and is less than or equal to 10000 mm, and the radius of curvature of the second curved surface is greater than or equal to 1 mm and less than or equal to 100 mm. For example, the radius of curvature of the first curved surface is greater than or equal to 10 mm and less than or equal to 10000 mm, and the radius of curvature of the second curved surface is greater than or equal to 1 mm and less than 10 mm.

The display device with any of the above structures may include a light-transmitting layer. In that case, the first display region overlaps with the region transmitting visible light with the light-transmitting layer provided therebetween. The light-transmitting layer includes a portion in which an average value of transmittance with respect to light with a wavelength of greater than or equal to 450 nm and less than or equal to 700 nm is 80% or more.

The display device with any of the above structures may include a first module and a second module. In that case, the first module includes the first display panel and at least one of a connector and an integrated circuit. The second module includes the second display panel and at least one of a connector and an integrated circuit.

One embodiment of the present invention is an electronic device including the display device with any of the above structures, and at least one of an antenna, a battery, a housing, a camera, a speaker, a microphone, and an operation button.

One embodiment of the present invention is a display panel that includes a first light-emitting element, a second light-emitting element, and a third light-emitting element. Light emitted from the first light-emitting element has a CIE 1931 chromaticity coordinate x of greater than 0.680 and less than or equal to 0.720 and a CIE 1931 chromaticity coordinate y of greater than or equal to 0.260 and less than or equal to 0.320. Light emitted from the second light-emitting element has a CIE 1931 chromaticity coordinate x of greater than or equal to 0.130 and less than or equal to 0.250 and a CIE 1931 chromaticity coordinate y of greater than 0.710 and less than or equal to 0.810. Light emitted from the third light-emitting element has a CIE 1931 chromaticity coordinate x of greater than or equal to 0.120 and less than or equal to 0.170 and a CIE 1931 chromaticity coordinate y of greater than or equal to 0.020 and less than 0.060. The first light-emitting element, the second light-emitting element, and the third light-emitting element include a hole-injection layer and a first hole-transport layer and each include a light-emitting layer. The first light-emitting element, the second light-emitting element, and the third light-emitting element share the same hole-injection layer. The first light-emitting element, the second light-emitting element, and the third light-emitting element share the same first hole-transport layer. The light-emitting layer in the first light-emitting element, that in the second light-emitting element, and that in the third light-emitting element are separated from each other. In the third light-emitting element, the first hole-transport layer is in contact with the hole-injection layer and the light-emitting layer. It is preferable that the first light-emitting element and the second light-emitting element each include a second hole-transport layer. It is preferable that in each of the first light-emitting element and the second light-emitting element, the first hole-transport layer be in contact with the hole-injection layer and the second hole-transport layer be in contact with the light-emitting layer. The hole-injection layer and the first hole-transport layer preferably contain the same material. The light-emitting layer and the second hole-transport layer preferably contain the same material. The second hole-transport layer preferably contains a material with a HOMO level shallower than a HOMO level of a material contained in the first hole-transport layer. A display device, a module, and an electronic device each including the above display panel are also embodiments of the present invention.

One embodiment of the present invention can increase the size of a display device. One embodiment of the present invention can provide a display device including a wide display region in which a seam is less likely to be noticed. One embodiment of the present invention can provide a display device that can display an image with a wide color gamut. One embodiment of the present invention can suppress display unevenness or luminance unevenness of a display device. One embodiment of the present invention can reduce the thickness or weight of a display device. One embodiment of the present invention can provide a display device that can display an image along a curved surface. One embodiment of the present invention can provide a highly browsable display device. One embodiment of the present invention can provide a novel display device.

Note that the description of these effects does not preclude the existence of other effects. One embodiment of the present invention does not necessarily achieve all the effects listed above. Other effects can be derived from the description of the specification, the drawings, and the claims.

BRIEF DESCRIPTION OF DRAWINGS

FIGS. 1A to 1C are a top view and cross-sectional views illustrating an example of a display panel.

FIG. 11 is a chromaticity diagram showing chromaticity ranges of display devices.

FIGS. 14A to 14C are top views and a cross-sectional view illustrating examples of a display panel.

FIGS. 19A and 19B are perspective views illustrating an example of a touch panel.

FIGS. 21A and 21B are perspective views illustrating an example of a touch panel.

FIGS. 23A1, 23A2, 23B, 23C, 23D, 23E, 23F, 23G, 23H, and 23I illustrate examples of electronic devices.

BEST MODE FOR CARRYING OUT THE INVENTION

Figure 2A:
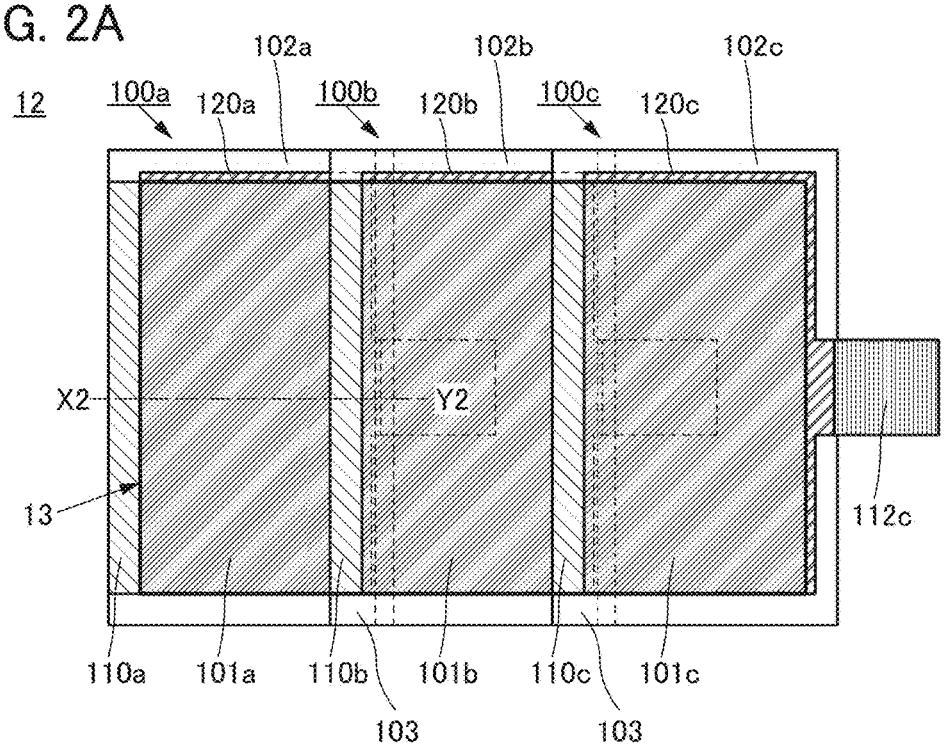
FIGS. 2A and 2B are a top view and a cross-sectional view illustrating an example of a display device.

Embodiments are described in detail with reference to the drawings. Note that the present invention is not limited to the following description. It is readily appreciated by those skilled in the art that modes and details of the present invention can be modified in various ways without departing from the spirit and scope of the present invention. Thus, the present invention should not be construed as being limited to the description in the following embodiments.

Note that in the structures of the invention described below, the same portions or portions having similar functions are denoted by the same reference numerals in different drawings, and description of such portions is not repeated. Furthermore, the same hatching pattern is applied to portions having similar functions, and the portions are not especially denoted by reference numerals in some cases.

The position, size, range, or the like of each component illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film". In addition, the term "insulating film" can be changed into the term "insulating layer".

Embodiment 1

In this embodiment, a display device of one embodiment of the present invention is described with reference to FIGS. 1A to 1C, FIGS. 2A and 2B, FIGS. 3A and 3B, FIGS. 4A to 4G, FIGS. 5A to 5E, FIGS. 6A to 6E, FIGS. 7A to 7D, FIGS. 8A to 8C, FIGS. 9A to 9C, FIGS. 10A and 10B, and FIG. 11.

When a plurality of display panels are arranged in one or more directions (e.g., in one column or in matrix), a display device with a large display region can be manufactured.

In the case where a large display device is manufactured using a plurality of display panels, each of the display panels is not required to be large. Thus, an apparatus for manufacturing the display panel does not need to be increased in size, whereby space-saving can be achieved. Furthermore, since an apparatus for manufacturing small- and medium-sized display panels can be used and a novel apparatus for manufacturing large display devices is unnecessary, manufacturing cost can be reduced. In addition, a decrease in yield caused by an increase in the size of a display panel can be suppressed.

A display device including a plurality of display panels has a larger display region than a display device including one display panel when the display panels have the same size, and has an effect of displaying more information at a time, for example.

However, each of the display panels has a non-display region that surrounds a display region. Thus, for example, in the case where output images of a plurality of display panels are used to display one image, the image appears divided to a user of the display device.

Making the non-display regions of the display panels small (using display panels with narrow frames) can prevent an image displayed on the display panels from appearing divided; however, it is difficult to totally remove the non-display regions of the display panel.

A small non-display region of the display panel leads to a decrease in the distance between an end portion of the display panel and an element in the display panel, in which case the element easily deteriorates by impurities entering from outside the display panel in some cases.

Thus, in one embodiment of the present invention, a plurality of display panels are arranged to partly overlap with one another. In two display panels overlapping with each other, at least a display panel positioned on the display surface side (upper side) includes a region transmitting visible light and a display region adjacent to each other. In one embodiment of the present invention, a display region of a display panel positioned on a lower side and the region transmitting visible light of the display panel on the upper side overlap with each other. Thus, a non-display region between the display regions of the two overlapping display panels can be reduced and even removed. As a result, a large-sized display device in which a seam between the display panels is hardly seen by the user can be obtained.

At least part of a non-display region of the display panel on the upper side transmits visible light, and can overlap with the display region of the display panel on the lower side. Furthermore, at least part of a non-display region of the display panel on the lower side can overlap with the display region of the display panel on the upper side or a region that blocks visible light thereof. It is not necessary to reduce the areas of the non-display regions because a reduction in the area of the frame of the display device (a reduction in area except a display region) is not affected by these regions.

A large non-display region of the display panel leads to an increase in the distance between the end portion of the display panel and an element in the display panel, in which case the deterioration of the element due to impurities entering from outside the display panel can be suppressed. For example, in the case where an organic EL element is used as a display element, impurities such as moisture or oxygen are less likely to enter (or less likely to reach) the organic EL element from outside the display panel as the distance between the end portion of the display panel and the organic EL element increases. Since a sufficient area of the non-display region of the display panel can be secured in the display device of one embodiment of the present invention, a highly reliable large display device can be fabricated even when a display panel including an organic EL element or the like is used.

In one embodiment of the present invention, a display panel that can display an image with a wide color gamut is used. In that case, a display device that can display an image with a wide color gamut can be manufactured. Specifically, the display panel includes a plurality of light-emitting elements. Light emitted from a first light-emitting element has a CIE 1931 chromaticity coordinate x of greater than 0.680 and less than or equal to 0.720 and a CIE 1931 chromaticity coordinate y of greater than or equal to 0.260 and less than or equal to 0.320. Light emitted from a second light-emitting element has a CIE 1931 chromaticity coordinate x of greater than or equal to 0.130 and less than or equal to 0.250 and a CIE 1931 chromaticity coordinate y of greater than 0.710 and less than or equal to 0.810. Light emitted from a third light-emitting element has a CIE 1931 chromaticity coordinate x of greater than or equal to 0.120 and less than or equal to 0.170 and a CIE 1931 chromaticity coordinate y of greater than or equal to 0.020 and less than 0.060. As each light-emitting element, an organic EL element including an EL layer between a pair of electrodes is suitable. As the pair of electrodes, a reflective electrode and a transflective electrode are suitable.

The light-emitting elements for different colors preferably include separate light-emitting layers. Since a display device of one embodiment of the present invention is composed of a plurality of display panels, each display panel can have a relatively small size. Thus, the alignment accuracy of a metal mask is high, leading to higher yield in separate coloring. In addition, since an application example of the display device of one embodiment of the present invention is a large-sized electronic device, the resolution of the display panel can be relatively low. Accordingly, the display device of one embodiment of the present invention has an advantage when employing light-emitting elements that are formed by a separate coloring method. Note that when the resolution of the display panel is high, the light-emitting layer of one light-emitting element partly overlaps with that of another light-emitting element in some cases. In this specification and the like, separation of light-emitting layers for different colors does not necessarily mean spatial separation between the light-emitting layers and sometimes means electrical insulation from each other.

The light-emitting elements may have any of a bottom-emission structure and a top-emission structure. It is particularly preferable to use top-emission light-emitting elements.

The light-emitting elements each preferably have a microcavity structure. Specifically, the optical distance between the pair of electrodes is preferably adjusted in the following manner: in the EL layers, not only the light-emitting layer but also a layer of another kind (e.g., a hole-transport layer) is formed separately for each of the light-emitting elements for different colors; and other layers are shared by the light-emitting elements for different colors. This structure simplifies the process and makes it possible to provide a display panel from which light can be efficiently extracted and which can display an image with a wide color gamut.

Structural Example 1 of Display Panel

FIG. 1A is a top view of a display panel 100.

The display panel 100 includes a display region 101 and a region 102. Here, the region 102 is a portion other than the display region 101 of the display panel 100 in a top view. The region 102 can also be referred to as a non-display region.

The region 102 includes a region 110 transmitting visible light and a region 120 blocking visible light. The region 110 transmitting visible light and the region 120 blocking visible light are each adjacent to the display region 101.

The region 110 transmitting visible light and the region 120 blocking visible light can each be provided along part of the outer end portion of the display region 101. In the display panel 100 illustrated in FIG. 1A, the region 110 transmitting visible light is provided along one side of the display region 101. The region 110 transmitting visible light may be provided along two or more sides of the display region 101. The region 110 transmitting visible light is preferably in contact with the display region 101 and provided so as to extend to an end portion of the display panel as illustrated in FIG. 1A.

In the display panel 100 in FIG. 1A, the region 120 blocking visible light is provided along two sides of the display region 101. The region 120 blocking visible light may extend close to an end portion of the display panel.

Note that in the region 102 illustrated in FIG. 1A, a region other than the region 110 transmitting visible light and the region 120 blocking visible light does not necessarily have visible light transmittance.

The display region 101 includes a plurality of pixels arranged in a matrix and can display an image. One or more display elements are provided in each pixel. As the display element, a light-emitting element such as an EL element, an electrophoretic element, a display element with use of micro electro mechanical systems (MEMS), a liquid crystal element, or the like can be used, for example.

In one embodiment of the present invention, the display panel 100 can display an image with a wide color gamut by including organic EL elements, as described above.

A material that transmits visible light is used for the region 110 transmitting visible light. A substrate, a bonding layer, or the like included in the display panel 100 may also be used, for example. The region 110 transmitting visible light preferably has a higher visible light transmittance to increase the extraction efficiency of light from the display panel under the region 110 transmitting visible light. The region 110 transmitting visible light preferably has a transmittance of higher than or equal to 70%, further preferably higher than or equal to 80%, and still further preferably higher than or equal to 90% on average with respect to light with a wavelength greater than or equal to 400 nm and less than or equal to 700 nm.

In the region 120 blocking visible light, for example, a wiring electrically connected to the pixels (specifically, transistors, display elements, or the like) included in the display region 101 is provided. In addition to such a wiring, driver circuits (e.g., a scan line driver circuit or a signal line driver circuit) for driving the pixels can be provided.

The display panel can include at least one of the scan line driver circuit and the signal line driver circuit. Alternatively, the display panel may include neither the scan line driver circuit nor the signal line driver circuit. For example, an IC serving as at least one of the scan line driver circuit and the signal line driver circuit can be electrically connected to the display panel. The IC can be mounted on a display panel by a COG method or a COF method. Alternatively, an FPC, a tape automated bonding (TAB) tape, a TCP, or the like on which the IC is mounted can be connected to a display panel.

Furthermore, the region 120 blocking visible light includes a terminal electrically connected to an FPC or the like (also referred to as a connection terminal), a wiring electrically connected to the terminal, and the like. Note that in the case where the terminal, wiring, and the like transmit visible light, the terminal, wiring, and the like can be provided to extend to the region 110 transmitting visible light.

Here, a width W of the region 110 transmitting visible light in FIG. 1A is preferably greater than or equal to 0.5 mm and less than or equal to 150 mm, further preferably greater than or equal to 1 mm and less than or equal to 100 mm, and still further preferably greater than or equal to 2 mm and less than or equal to 50 mm. In the case where the width W of the region 110 transmitting visible light is different between the display panels, or in the case where the width varies depending on the position in one display panel, the shortest length is preferably within the above range. The region 110 transmitting visible light serves as a sealing region. As the width W of the region 110 transmitting visible light is larger, the distance between the end portion of the display panel 100 and the display region 101 can become longer, in which case entry of an impurity such as water from the outside into the display region 101 can be suppressed. Note that the width W of the region 110 transmitting visible light corresponds to the shortest distance between the display region 101 and the end portion of the display panel 100 in some cases.

In the case where an organic EL element is used as the display element, for example, the width W of the region 110 transmitting visible light is set to be greater than or equal to 1 mm, whereby deterioration of the organic EL element can be effectively suppressed, which leads to an improvement in reliability. Note that also in a portion other than the region 110 transmitting visible light, the distance between the end portion of the display region 101 and the end portion of the display panel 100 is preferably in the above range.

FIGS. 1B and 1C are cross-sectional views along dashed-dotted line X1-Y1 in FIG. 1A.

The display panel 100 illustrated in FIG. 1B includes a substrate 201, a bonding layer 203, an insulating layer 205, an insulating layer 208, an element layer 209, a substrate 211, a bonding layer 221, and a connection terminal 223.

The bonding layer 203 is positioned between the substrate 201 and the insulating layer 205. The bonding layer 221 is positioned between the substrate 211 and the insulating layer 205.

The display region 101 includes the element layer 209. The element layer 209 includes a display element. The display element is positioned between the insulating layer 205 and the insulating layer 208.

In the region 120 blocking visible light, the connection terminal 223 is positioned over the insulating layer 205. The connection terminal 223 includes an exposed portion not overlapping with the bonding layer 221 or the substrate 211.

A method for manufacturing the display panel illustrated in FIG. 1B is described. First, layers to be peeled (such as the insulating layer 205, the element layer 209, the insulating layer 208, and the connection terminal 223) are formed over a formation substrate with a peeling layer provided therebetween. The substrate 211 is attached to the layers to be peeled with the use of the bonding layer 221. Then, the formation substrate is peeled with the use of the peeling layer, and the substrate 201 is attached to the layers to be peeled with the use of the bonding layer 203. In this manner, the layers to be peeled that are formed over the formation substrate can be transferred to the substrate 201.

The display panel 100 illustrated in FIG. 1C includes the substrate 201, the bonding layer 203, the insulating layer 205, the element layer 209, the substrate 211, a bonding layer 213, an insulating layer 215, a functional layer 219, the bonding layer 221, and the connection terminal 223.

The bonding layer 203 is positioned between the substrate 201 and the insulating layer 205. The bonding layer 213 is positioned between the substrate 211 and the insulating layer 215. The bonding layer 221 is positioned between the insulating layer 205 and the insulating layer 215.

The display region 101 includes the element layer 209. The display region 101 may further include the functional layer 219.

The element layer 209 includes a display element. The display element is positioned between the insulating layer 205 and the bonding layer 221.

The functional layer 219 includes at least one of a coloring layer (e.g., a color filter), a light-blocking layer (e.g., a black matrix), and a sensor (e.g., a touch sensor). The functional layer 219 is positioned between the insulating layer 215 and the bonding layer 221.

In the region 120 blocking visible light, the connection terminal 223 is positioned over the insulating layer 205. The connection terminal 223 includes an exposed portion that does not overlap with the bonding layer 221, the insulating layer 215, the bonding layer 213, or the substrate 211.

A method for manufacturing the display panel illustrated in FIG. 1C is described. First, first layers to be peeled (such as the insulating layer 205, the element layer 209, and the connection terminal 223) are formed over a first formation substrate with a first peeling layer provided therebetween. Furthermore, second layers to be peeled (the insulating layer 215 and the functional layer 219) are formed over a second formation substrate with a second peeling layer provided therebetween. The first formation substrate and the second formation substrate are attached to each other with the use of the bonding layer 221. Then, the first formation substrate and the second formation substrate are peeled with the use of the first peeling layer and the second peeling layer, respectively. To the surface that is exposed by peeling the first formation substrate, the substrate 201 is attached with the use of the bonding layer 203. To the surface that is exposed by peeling the second formation substrate, the substrate 211 is attached with the use of the bonding layer 213. In this manner, the layers to be peeled that are formed over the formation substrates can be transferred to the substrates 201 and 211.

In the method for manufacturing a display panel of one embodiment of the present invention, each of the functional elements and the like included in the display panel is formed over the formation substrate; thus, even in the case where a high-resolution display panel is manufactured, high alignment accuracy of the substrate included in the display panel is not required. Thus, even when a flexible substrate is used for the display panel, the substrate can be attached easily. In addition, since the functional element and the like can be fabricated with high temperatures, a highly reliable display panel can be obtained.

The region 110 transmitting visible light reflects or absorbs part of visible light (e.g., light with a wavelength greater than or equal to 400 nm and less than or equal to 700 nm). When the region 110 transmitting visible light reflects external light, a user of the display device can easily notice an area in which two or more display panels overlap with each other (hereinafter, also referred to as an overlapping area). The user of the display device can easily notice the overlapping area particularly when the display panel on the lower side does not perform display or performs black display. Moreover, the luminance (brightness) of display on the display panel on the lower side is different between a portion seen through the region 110 transmitting visible light and a portion seen not through the region.

The smaller the differences between layers included in the region 110 transmitting visible light are, the more the reflection of light in the region 110 transmitting visible light can be suppressed. Accordingly, the overlapping area is not easily noticed by a user of the display device. Therefore, a display device including a wide display region in which a seam is less likely to be noticed can be fabricated.

In the region 110 transmitting visible light, the difference in refractive index between two layers that are in contact with each other is preferably smaller than or equal to 0.20, further preferably smaller than or equal to 0.15, still further preferably smaller than or equal to 0.10. For example, in FIG. 1B, each of the differences in refractive index between the substrate 201 and the bonding layer 203, between the bonding layer 203 and the insulating layer 205, between the insulating layer 205 and the bonding layer 221, and between the bonding layer 221 and the substrate 211 is preferably smaller than or equal to 0.20. For example, in FIG. 1C, each of the differences in refractive index between the substrate 201 and the bonding layer 203, between the bonding layer 203 and the insulating layer 205, between the insulating layer 205 and the bonding layer 221, between the bonding layer 221 and the insulating layer 215, between the insulating layer 215 and the bonding layer 213, and between the bonding layer 213 and the substrate 211 is preferably smaller than or equal to 0.20. It is preferable to reduce the difference in refractive index between layers included in the region 110 transmitting visible light because the reflection of light due to the difference in refractive index can be suppressed. The difference in refractive index between layers included in the region 110 transmitting visible light is preferably smaller than or equal to 0.20, further preferably smaller than or equal to 0.15, still further preferably smaller than or equal to 0.10.

By reducing the number of interfaces which are included in the region 110 transmitting visible light and at which a difference in refractive index is large, the visible light transmittance in the region 110 transmitting visible light can be increased. Thus, the difference in the luminance (brightness) of display on the display panel on the lower side between a portion seen through the region 110 transmitting visible light and a portion seen not through the region can be small. Accordingly, the display unevenness or luminance unevenness of the display device can be suppressed.

The substrates 201 and 211 are preferably flexible. Using the flexible substrates can increase the flexibility of the display panel. In manufacturing the display panel of this embodiment, an insulating layer, a transistor, a display element, and the like are formed over a formation substrate and then transferred to the substrate 201 and the substrate 211. Therefore, the range of choices for the materials for the substrate 201 and the substrate 211 is wider than that in the case of forming an insulating layer, a transistor, a display element, and the like directly on the substrate 201 or the substrate 211.

The thickness of each of the substrates 201 and 211 is preferably greater than or equal to 1 µm and less than or equal to 100 µm, further preferably greater than or equal to 1 µm and less than or equal to 50 µm, still further preferably greater than or equal to 1 µm and less than or equal to 25 µm. By reducing the thicknesses of the substrates, a step can be reduced when display panels overlap with each other.

Each of the substrates 201 and 211 preferably has a transmittance of higher than or equal to 70%, further preferably higher than or equal to 80%, and still further preferably higher than or equal to 90% on average with respect to light with a wavelength longer than or equal to 450 nm and shorter than or equal to 700 nm. The higher the visible light transmittance of the substrates, the more the visible light transmittance in the region 110 transmitting visible light can be increased and the more extraction efficiency of light of the display device can be increased.

Each of the substrates 201 and 211 has a glass transition temperature preferably higher than or equal to 150° C., further preferably higher than or equal to 200° C., and still further preferably higher than or equal to 250° C. The higher the heat resistance of the substrates is, the more defects of the display panel due to preservation in high temperature environment, a pressure-bonding step of an FPC, or the like can be reduced.

The coefficient of thermal expansion of each of the substrates 201 and 211 is preferably lower than or equal to 60 ppm/° C., further preferably lower than or equal to 30 ppm/° C., still further preferably lower than or equal to 15 ppm/° C. The lower the coefficient of thermal expansion of the substrate is, the less the display panel is affected by a temperature change of an environment in which the display panel is stored. For example, even when the temperature of a storage environment is changed, generation of creases in the display panel and a crack in an inorganic film can be suppressed.

The coefficient of humidity expansion of each of the substrates 201 and 211 is preferably lower than or equal to 100 ppm/% RH, further preferably lower than or equal to 50 ppm/% RH, still further preferably lower than or equal to 20 ppm/% RH. The lower the coefficient of humidity expansion of the substrate is, the less the display panel is affected by a humidity change of an environment in which the display panel is stored. For example, even when the humidity of a storage environment is changed, generation of creases in the display panel and a crack in an inorganic film can be suppressed.

<Structure Example 1 of Display Device>

FIG. 2A is a top view of a display device 12. The display device 12 illustrated in FIG. 2A includes three display panels 100 illustrated in FIG. 1A arranged in one direction (a lateral direction). FIG. 2A illustrates an example where each of the display panels is electrically connected to an FPC.

In this embodiment, to distinguish the display panels from each other, the same components included in the display panels from each other, or the same components relating to the display panels from each other, letters are added to reference numerals in some cases. Unless otherwise specified, "a" is added to reference numerals for a display panel and components placed on the lowest side (the side opposite to the display surface side), and to one or more display panels and components placed thereover, "b", "c", and the like are added in alphabetical order from the lower side.

Furthermore, unless otherwise specified, in describing a structure in which a plurality of display panels are included, letters are not added when a common part of the display panels or the components is described.

The display device 12 in FIG. 2A includes a display panel 100a, a display panel 100b, and a display panel 100c.

The display panel 100b is placed so that part of the display panel 100b is stacked over an upper side (a display surface side) of the display panel 100a. Specifically, a region 110b transmitting visible light of the display panel 100b is provided to overlap with a display region 101a of the display panel 100a. A region 120b blocking visible light of the display panel 100b is provided so as not to overlap with the display region 101a of the display panel 100a. A display region 101b of the display panel 100b is provided to overlap with a region 102a of the display panel 100a and a region 120a blocking visible light of the display panel 100a.

Similarly, the display panel 100c is placed so as to partly overlap with an upper side (display surface side) of the display panel 100b. Specifically, a region 110c transmitting visible light of the display panel 100c is provided to overlap with the display region 101b of the display panel 100b. A region 120c blocking visible light of the display panel 100c is provided so as not to overlap with the display region 101b of the display panel 100b. A display region 101c of the display panel 100c is provided to overlap with a region 102b of the display panel 100b and the region 120b blocking visible light of the display panel 100b.

The region 110b transmitting visible light is provided to overlap with the display region 101a; thus, a user of the display device 12 can see the entire image on the display region 101a even when the display panel 100b overlaps with a display surface of the display panel 100a. Similarly, the region 110c transmitting visible light is provided to overlap with the display region 101b; thus, a user of the display device 12 can see the entire image on the display region 101b even when the display panel 100c overlaps with a display surface of the display panel 100b.

The display region 101b of the display panel 100b overlaps with upper sides of the region 102a and the region 120a blocking visible light; as a result, a non-display region does not exist between the display region 101a and the display region 101b. Similarly, the display region 101c of the display panel 100c overlaps with upper sides of the region 102b and the region 120b blocking visible light; as a result, a non-display region does not exist between the display region 101b and the display region 101c. Thus, a region where the display region 101a, the display region 101b, and the display region 101c are placed seamlessly can serve as a display region 13 of the display device 12.

Figure 2B:
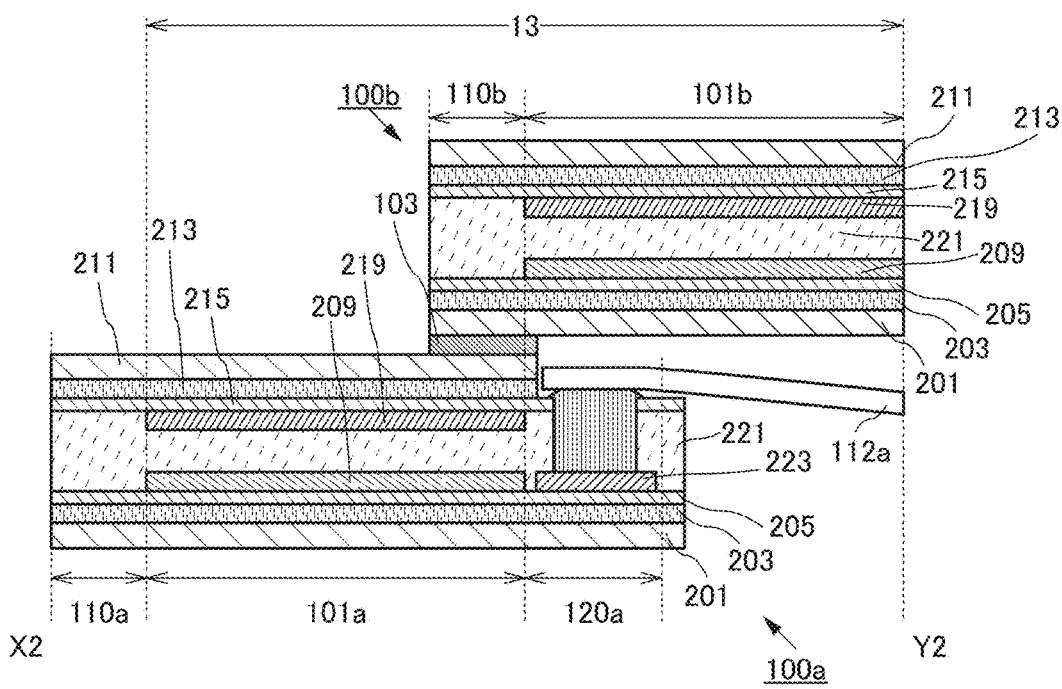

FIG. 2B is a cross-sectional view along dashed-dotted line X2-Y2 in FIG. 2A.

The display panels 100a and 100b illustrated in FIG. 2B each have the same structure as the structure of the display panel illustrated in FIG. 1C.

To reduce the step between two adjacent display panels 100, the thickness of the display panel 100 is preferably small. For example, the thickness of the display panel 100 is preferably less than or equal to 1 mm, further preferably less than or equal to 300 µm, still further preferably less than or equal to 100 µm. The display panel is preferably thin because the thickness or weight of the whole display device can also be reduced.

When air exists between the region transmitting visible light of the upper display panel and the display region of the lower display panel, part of light extracted from the display region is reflected at the interface between the display region and air and the interface between air and the region transmitting visible light, which may result in a decrease in luminance of the display. As a result, the light extraction efficiency of a region in which a plurality of display panels overlap with each other might be decreased. In addition, a difference in luminance of the display region of the lower display panel might occur between a portion overlapping with the region transmitting visible light of the upper display panel and a portion not overlapping with the region transmitting visible light of the upper display panel, so that a seam between the display panels is easily noticed by a user in some cases.

As illustrated in FIG. 2B, the display device 12 includes a light-transmitting layer 103 between the display region 101a and the region 110b transmitting visible light. The light-transmitting layer 103 has a refractive index higher than that of air and transmits visible light. Thus, air can be prevented from entering between the display region 101a and the region 110b transmitting visible light, so that the interface reflection due to a difference in refractive index can be suppressed. In addition, display unevenness or luminance unevenness of the display device can be reduced.

Note that the light-transmitting layer 103 preferably has a high visible light transmittance because the light extraction efficiency of the display device can be increased. The light-transmitting layer 103 preferably has a transmittance of higher than or equal to 80% and further preferably higher than or equal to 90% on average with respect to light with a wavelength greater than or equal to 400 nm and less than or equal to 700 nm.

The difference in refractive index between the light-transmitting layer and a layer in contact with the light-transmitting layer is preferably as small as possible because the light reflection can be suppressed. For example, the refractive index of the light-transmitting layer is higher than that of air, and preferably higher than or equal to 1.3 and lower than or equal to 1.8. The difference in refractive index between the light-transmitting layer and the layer in contact with the light-transmitting layer (e.g., a substrate included in the display panel) is preferably lower than or equal to 0.30, further preferably lower than or equal to 0.20, and still further preferably lower than or equal to 0.15.

It is preferable that the light-transmitting layer be detachably in contact with at least one of the lower display panel and the upper display panel. In the case where the display panels included in the display device are individually detachable, when malfunction occurs in one of the display panels, for example, only the defective display panel can be easily replaced with a new display panel. The continuous use of the other display panel enables the display device to be used longer and at lower cost.

When there is no need to attach and detach the display panels, the display panels are fixed to each other with the light-transmitting layer including a material having an adhesive property (an adhesive or the like).

Either of an inorganic material and an organic material can be used for the light-transmitting layer. A liquid substance, a gelatinous substance, or a solid substance can be used for the light-transmitting layer.

For the light-transmitting layer, a liquid substance such as water, an aqueous solution, a fluorine-based inactive liquid, a refractive liquid, or silicone oil can be used, for example.

In the case where the display device is inclined to the horizontal plane (a plane perpendicular to a direction in which gravity acts) or in the case where the display device is placed so as to be perpendicular to the horizontal plane, the viscosity of a liquid substance is preferably 1 mPa·s or more, further preferably 1 Pa·s or more, still further preferably 10 Pa·s or more, and yet still further preferably 100 Pa·s or more. In the case where the display device is placed so as to be parallel to the horizontal plane, for example, the viscosity of the liquid substance is not limited thereto.

The light-transmitting layer is preferably inactive because damage to another layer included in the display device can be suppressed, for example.

A material contained in the light-transmitting layer is preferably nonvolatile. Accordingly, entry of air into the interface due to volatilization of a material used for the light-transmitting layer can be suppressed.

For the light-transmitting layer, a high molecular material can be used. For example, a resin such as an epoxy resin, an acrylic resin, a silicone resin, a phenol resin, a polyimide resin, an imide resin, a polyvinyl chloride (PVC) resin, a polyvinyl butyral (PVB) resin, or an ethylene vinyl acetate (EVA) resin can be used. Alternatively, a two-component-mixture-type resin may be used. For example, an adhesive sheet or any of a variety of curable adhesives such as a reactive curable adhesive, a thermosetting adhesive, an anaerobic adhesive, and a photocurable adhesive such as an ultraviolet curable adhesive containing at least one of the above resins may be used. The adhesives do not need to be cured in the case where, for example, the display panels are not fixed to each other.

The light-transmitting layer preferably has high self-attachability to an object. In addition, the light-transmitting layer preferably has high separability against an object. After the light-transmitting layer attached to the display panel is separated from the display panel, it is preferable that the light-transmitting layer be able to be attached to the display panel again.

It is preferable that the light-transmitting layer have no adhesiveness or low adhesiveness. In that case, attachment and separation of the light-transmitting layer to and from an object can be repeated without damaging or contaminating a surface of the object.

As the light-transmitting layer, a film having attachability or a film having adhesiveness can be used, for example. In the case where an attachment film having a stacked-layer structure of an attachment layer or an adhesive layer and a base material is used, the attachment layer or the adhesive layer may function as the light-transmitting layer of the display device, and the base material may function as a substrate included in the display panel. Note that the display device may have a substrate in addition to the base material in the attachment film. The attachment film may include an anchor layer between the attachment layer or the adhesive layer and the base material. The anchor layer has a function of enhancing the adhesiveness between the attachment layer or the adhesive layer and the base material. In addition, the anchor layer has a function of smoothing a surface of the base material coated with the attachment layer or the adhesive layer. In this manner, bubbles are not easily generated between the object and the light-transmitting layer. A film in which a polyester film and a silicone resin layer having attachability are stacked can be preferably used in the display device, for example.

The thickness of the light-transmitting layer is not particularly limited and may be greater than or equal to 1 µm and less than or equal to 50 µm, for example. The thickness of the light-transmitting layer can be greater than 50 µm; however, in the case of manufacturing a flexible display device, the thickness of the light-transmitting layer is preferably set such that the flexibility of the display device is not reduced. For example, the thickness of the light-transmitting layer is preferably greater than or equal to 10 μm and less than or equal to 30 μm. The thickness of the light-transmitting layer can be less than 1 μm.

The display region 101a overlaps with the region 110b transmitting visible light with the light-transmitting layer 103 provided therebetween. Thus, entry of air between the display region 101a and the region 110b transmitting visible light can be suppressed, so that interface reflection due to a difference in refractive index can be reduced.

Accordingly, a difference in luminance of the display region 101a between a portion overlapping with the region 110b transmitting visible light and a portion not overlapping with the region 110b transmitting visible light can be suppressed, so that a seam between the display panels can be less likely to be noticed by a user of the display device. In addition, display unevenness or luminance unevenness of the display device can be suppressed.

The region 120a blocking visible light and an FPC 112a each overlap with the display region 101b. Thus, a sufficient area of a non-display region can be secured and a seamless display region can be increased in size, so that a highly reliable large display device can be fabricated.

<Structure Example 2 of Display Device>

Figure 3A:
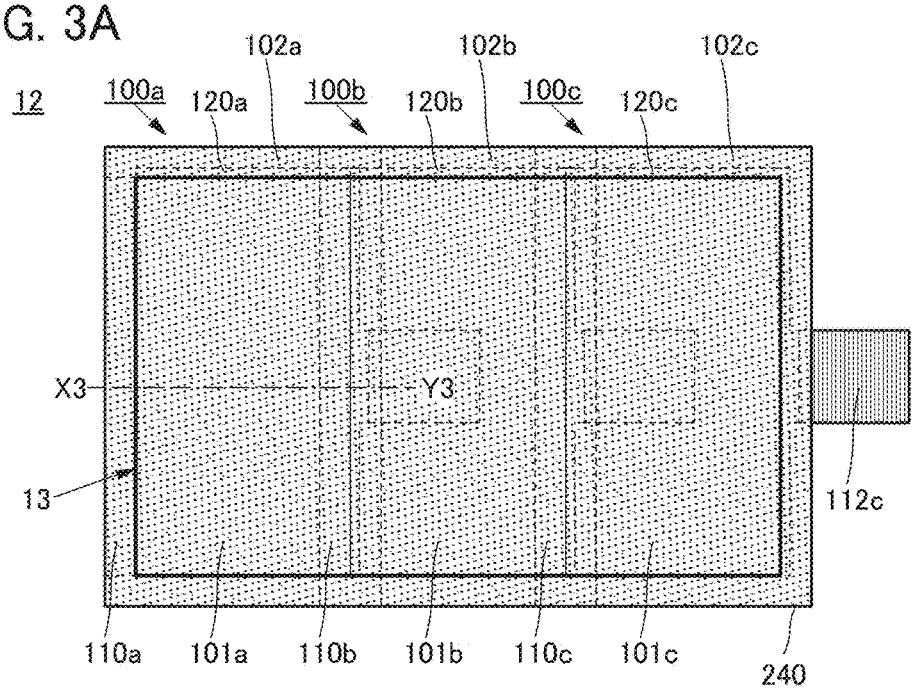
FIGS. 3A and 3B are a top view and a cross-sectional view illustrating an example of a display device.
Figure 3B:
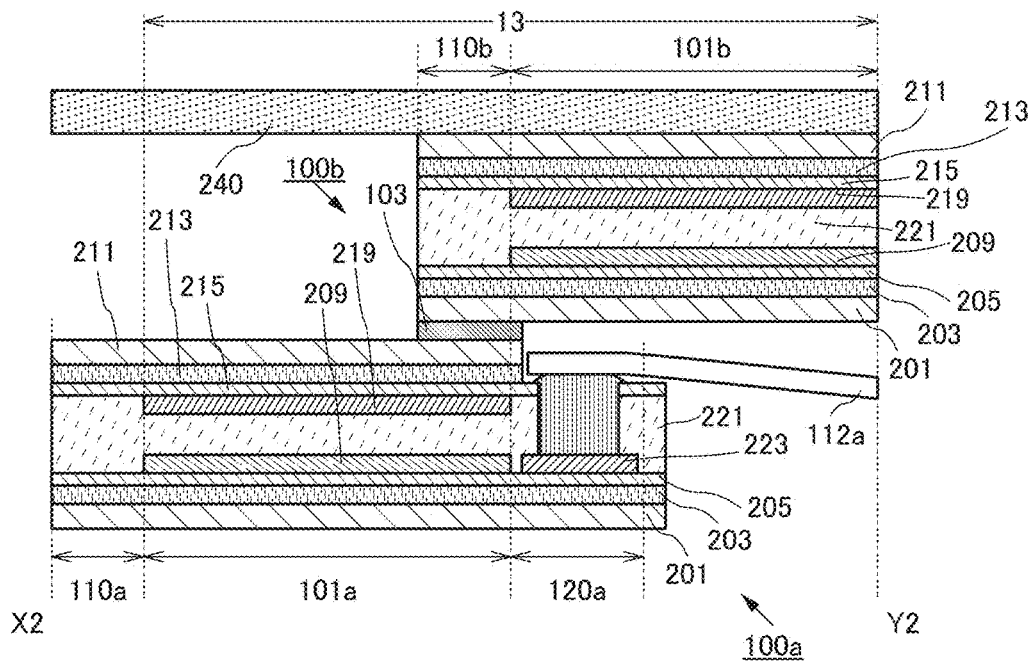

FIG. 3A is a top view of the display device 12. FIG. 3B is a cross-sectional view taken along dashed-dotted line X3-Y3 in FIG. 3A.

The display device 12 illustrated in FIGS. 3A and 3B has a structure in which an optical member 240 is placed on the outermost surface of the display device 12 illustrated in FIGS. 2A and 2B. Other components are similar to those in FIGS. 2A and 2B; thus, the detailed description thereof is omitted.

The optical member 240 is provided at least in the display region 13. FIG. 3A illustrates an example in which the optical member 240 overlaps with the entire areas of display panels. The optical member 240 and each of the display panels are preferably adhered closely. At least parts of the optical member 240 and each of the display panels may be fixed with an adhesive or the like, and the optical member 240 and each of the display panels are not necessarily fixed. For example, the optical member 240 and each of the display panels may be independently fixed to a housing included in the display device 12 or an electronic device.

As the optical member 240, one or more of a polarizing member, a retardation member, an anti-reflection member, and the like can be used. Moreover, hard coat treatment may be performed on the outermost surface of the optical member 240.

Examples of the polarizing member include a polarizing plate and a polarizing film.

Examples of the retardation member include a retardation plate and a retardation film.

Examples of the anti-reflection member include an anti-reflection (AR) film, a low-reflection (LR) film, and an anti-glare (AG) film (also referred to as a non-glare film). Furthermore, an anti-reflection plate and an anti-reflection film that each have the same function as that of any of these films are also examples of the anti-reflection member.

Examples of the structure of the optical member 240 are described with reference to FIGS. 4A to 4G.

Figure 4A:
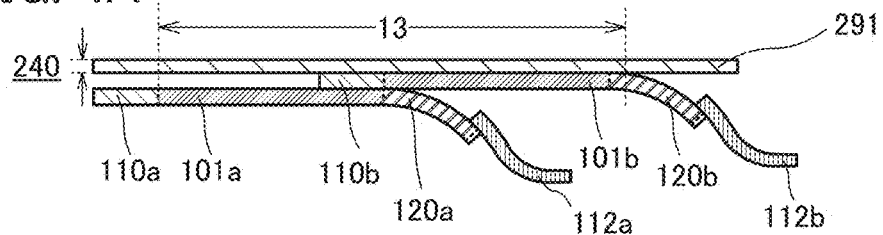
FIGS. 4A to 4G are cross-sectional views illustrating examples of a display device and examples of an optical member.

The optical member 240 illustrated in FIG. 4A includes an anti-reflection member 291.

Each of an AR film, an LR film, an AG film, and the like can be directly attached to the display panels.

When an AR film or an LR film is used for the anti-reflection member 291, the reflection of external light from a surface of the display device 12 can be suppressed.

When an AG film is used for the anti-reflection member 291, reflection of surroundings of the display device 12 on the surface of the display device can be suppressed by scattering external light.

Figure 4B:
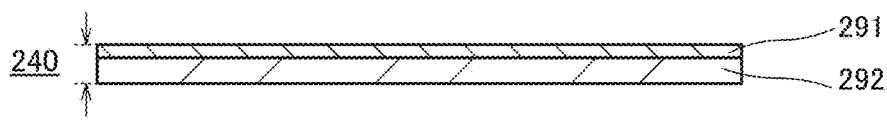

The optical member 240 illustrated in FIG. 4B includes the anti-reflection member 291 and a support member 292. The support member 292 is arranged closer to the display panel than the anti-reflection member 291 is.

The optical member 240 preferably has a structure in which one or more of a polarizing member, a retardation member, an anti-reflection member, and the like is/are attached to the support member 292 that transmits visible light.

Overlapping a plurality of display panels with each other causes a step between the display panels. Thus, in the case where one optical member 240 is attached to a plurality of display panels, air is likely to enter the interface between the optical member 240 and the display panels. Moreover, by attaching one optical member 240 to a plurality of display panels, the display panels cannot be detached in some cases. In the case where the optical members 240 are attached to the display panels one by one, effort is required, and thus manufacturing time might be increased.

The use of the support member 292 can increase the strength of the optical member 240, increase the thickness of the optical member 240, or facilitate the handling of the optical member 240, for example. Thus, the optical member 240 can be sufficiently closely attached to the display panels, and the amount of air at the interface between the optical member 240 and the display panels can be minimized. Steps between the plurality of display panels and creases of the display panels can be reduced by attaching the optical member 240 to the display panels sufficiently closely. The optical member 240 and the display panels are preferably fixed to be sufficiently closely attached to each other. The number of points for fixing the optical member 240 and the display panels is as small as possible; accordingly, the fabrication process of the display device can be simplified and the yield of the display device can be improved.

As the support member 292, for example, a plastic plate such as an acrylic plate or a polycarbonate plate, a glass plate, or the like can be used.

Figure 4C:
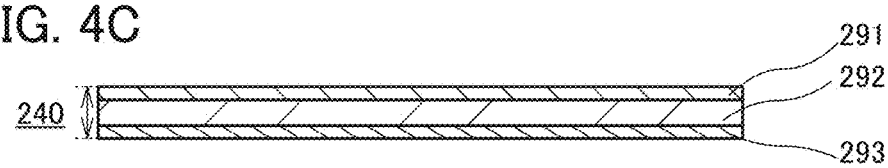

The optical member 240 illustrated in FIG. 4C includes the anti-reflection member 291, an anti-reflection member 293, and the support member 292. A layer that is positioned closest to the display panel is the anti-reflection member 293, and a layer that is positioned farthest from the display panel is the anti-reflection member 291.

When an AR film is used for the anti-reflection member 291, the reflection of external light from a surface of the display device can be reduced. Alternatively, when an AG film is used for the anti-reflection member 291, reflection of surroundings of the display device on the surface of the display device can be suppressed.

There is air between the optical member 240 and the display panels. When an AR film is used for the anti-reflection member 293, the reflection of light between the optical member 240 and the air can be suppressed.

Alternatively, when an AG film is used for the anti-reflection member 293, reflection of surroundings can be suppressed, and a user of the display device can see display easily.

Figure 4D:
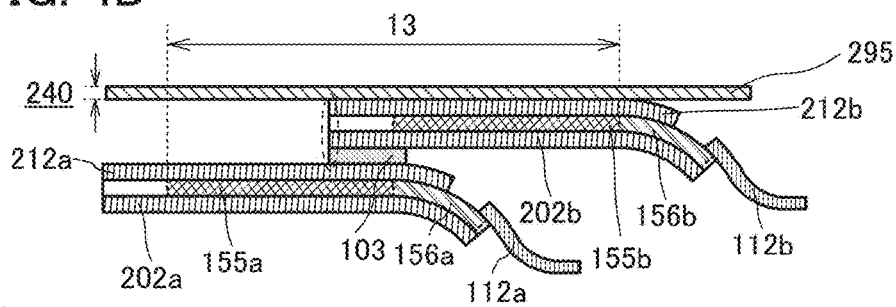

FIG. 4D illustrates an example in which a circularly polarizing plate 295 is used as the optical member 240.

The circularly polarizing plate 295 includes a linear polarizing plate and a retardation plate. The linear polarizing plate includes, for example, a linear polarizing layer between a pair of substrates. As an example of a retardation plate, a quarter-wave plate or the like can be given. The linear polarizing plate and the retardation plate are attached to each other by a bonding layer.

With the use of the circularly polarizing plate, a user of the display device can be prevented from noticing an overlapping area because of the reflection of light from surfaces of the display panels and in the display panels.

As illustrated in FIG. 4D, the circularly polarizing plate 295 preferably overlaps with a plurality of display panels. This structure can prevent a user of the display device from noticing a seam between display regions because of the reflection of light from a side surface of the display panel (see a portion surrounded by a dotted line in FIG. 4D).

When the circularly polarizing plate is used as the optical member 240, a highly optically isotropic substrate is preferably used as substrates included in the display panels.

FIG. 4D illustrates an example in which a lower display panel includes a substrate 202a and a substrate 212a that are highly optically isotropic and an upper display panel includes a substrate 202b and a substrate 212b that are highly optically isotropic. A region 155a including a display element and a region 156a including a wiring electrically connected to the display element are provided between the substrates 202a and 212a. Similarly, a region 155b including a display element and a region 156b including a wiring electrically connected to the display element are provided between the substrates 202b and 212b.

A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of a highly optically isotropic film include a triacetyl cellulose (TAC, also referred to as cellulose triacetate) film, a cycloolefin polymer (COP) film, a cycloolefin copolymer (COC) film, and an acrylic film.

Figure 4E:
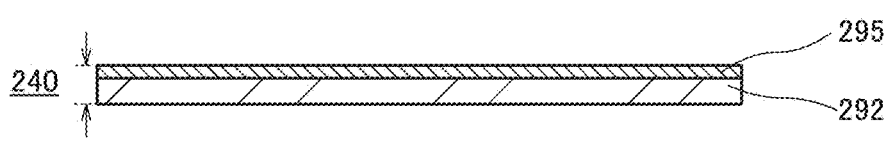

The optical member 240 illustrated in FIG. 4E includes the circularly polarizing plate 295 and the support member 292. Either the support member 292 or the circularly polarizing plate 295 may be closer to the display panel. When the support member 292 is arranged closer to the display panel than the circularly polarizing plate 295 is, the support member 292 is preferably highly optically isotropic. When the circularly polarizing plate 295 is arranged closer to the display panel than the support member 292 is, the support member 292 does not necessarily need to be optically isotropic; thus, the range of choices for the material that can be used for the support member 292 is widened.

Figure 4F:
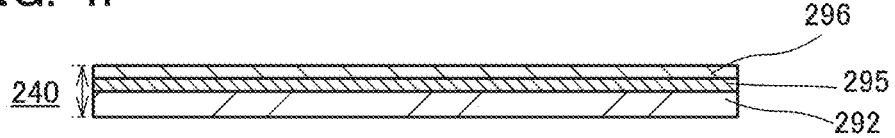
Figure 4G:
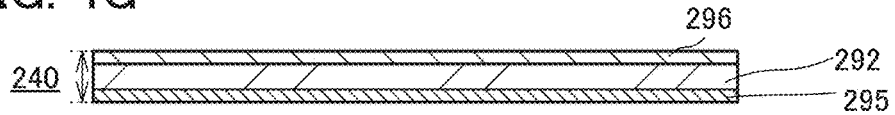

The optical member 240 illustrated in each of FIGS. 4F and 4G includes the circularly polarizing plate 295, an anti-reflection member 296, and the support member 292. In the optical member 240 illustrated in FIG. 4F, a layer that is positioned closest to the display panel is the support member 292, and a layer that is positioned farthest from the display panel is the anti-reflection member 296. In the optical member 240 illustrated in FIG. 4G, a layer that is positioned closest to the display panel is the circularly polarizing plate 295, and a layer that is positioned farthest from the display panel is the anti-reflection member 296.

An AR film is preferably used for the anti-reflection member 296. With this film, the reflection of external light from a surface of the display device can be reduced.

<Structural Example 2 of Display Panel>

Figure 5A:
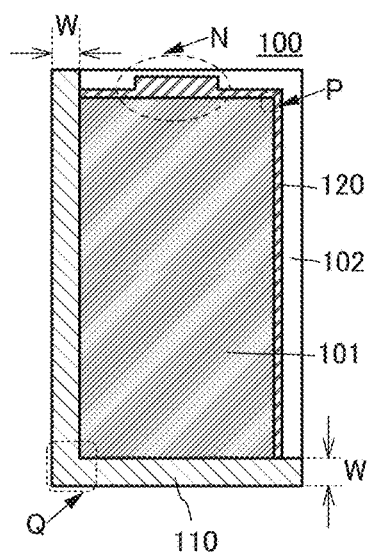
FIGS. 5A to 5E are top views illustrating examples of a display panel and perspective views illustrating an example of a display device.
Figure 5B:
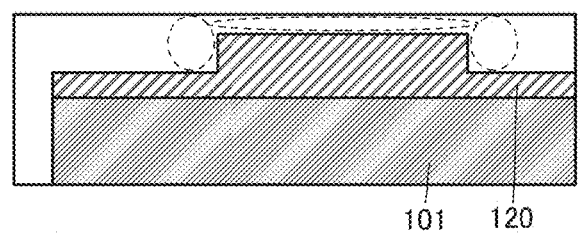

FIG. 5A is a top view of the display panel 100. FIG. 5B is an enlarged view of a region N surrounded by a dotted line in FIG. 5A.

The display panel 100 includes the display region 101 and the region 102. The region 102 includes the region 110 transmitting visible light and the region 120 blocking visible light. The region 110 transmitting visible light and the region 120 blocking visible light are each adjacent to the display region 101. In the display panel 100 in FIG. 5A, the region 110 transmitting visible light is provided along two sides of the display region 101. The width W of the region 110 transmitting visible light along one side of the display region 101 may be the same as or different from the width W of the region 110 transmitting visible light along the other side. FIG. 5A illustrates an example in which the widths are the same.

Figure 5C:
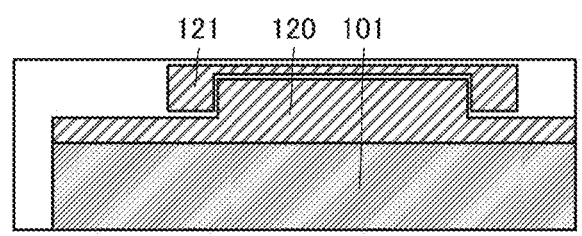

When the heat resistance of the substrate is low, the substrate may be deformed by heat in pressure bonding of an FPC. For example, a wiring is not provided in a portion surrounded by a dotted line in FIG. 5B, and thus when a pressure bond head is in contact with the portion, creases are likely to occur in the display panel. Therefore, as illustrated in FIG. 5C, a dummy wiring 121 is preferably formed near the region to which an FPC is bonded with pressure. By arranging the dummy wiring 121 in the region with which the pressure bond head is in contact, generation of creases on the display panel can be suppressed. The dummy wiring 121 is preferably formed using the same material and in the same step as those of the conductive layer included in the display panel. Thus, an increase in the number of fabrication steps due to the formation of the dummy wiring 121 can be prevented.

<Structure Example 3 of Display Device>

Figure 5D:
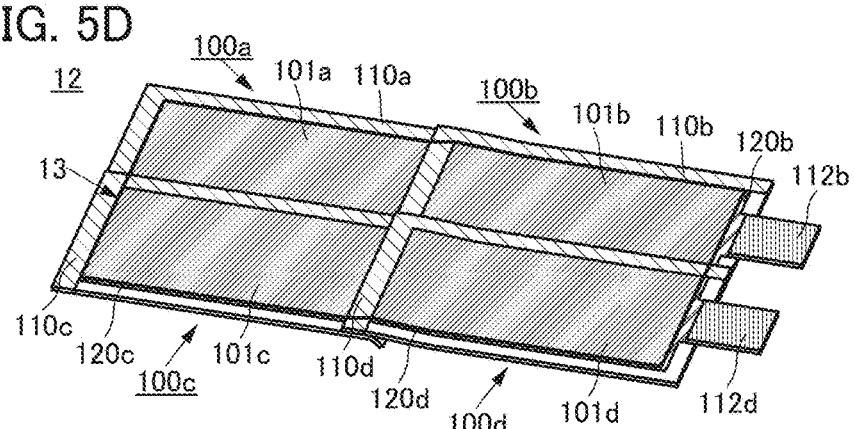
Figure 5E:
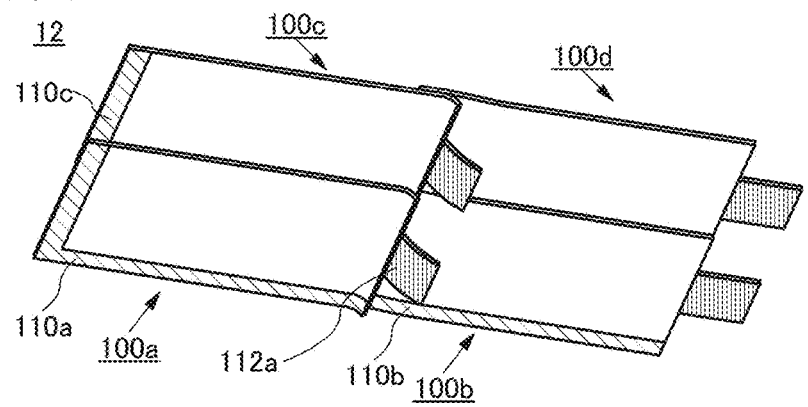

FIGS. 5D and 5E are perspective views of the display device 12 different from that in FIG. 2A. The display device 12 in FIGS. 5D and 5E includes four display panels 100 illustrated in FIG. 5A arranged in a 2×2 matrix (two display panels in the longitudinal direction and the lateral direction). FIG. 5D is a perspective view of the display device 12 on the display surface side. FIG. 5E is a perspective view of the display device 12 on the side opposite to the display surface side.

FIGS. 5D and 5E illustrate examples where each of the display panels is electrically connected to an FPC.

The display device 12 illustrated in FIGS. 5D and 5E includes the display panel 100a, the display panel 100b, the display panel 100c, and a display panel 100d.

In FIGS. 5D and 5E, short sides of the display panels 100a and 100b overlap with each other such that part of the display region 101a and part of the region 110b transmitting visible light overlap with each other. Furthermore, long sides of the display panels 100a and 100c overlap with each other such that part of the display region 101a and part of the region 110c transmitting visible light overlap with each other.

In FIGS. 5D and 5E, part of the display region 101b overlaps with part of the region 110c transmitting visible light and part of a region 110d transmitting visible light. In addition, part of the display region 101c overlaps with part of the region 110d transmitting visible light.

Thus, as illustrated in FIG. 5D, a region where the display region 101a, the display region 101b, the display region 101c, and a display region 101d are placed seamlessly can serve as the display region 13 of the display device 12.

In the center portion of the display device 12, the display panel 100b is stacked over the display panel 100a, the display panel 100c is stacked over the display panel 100b, and the display panel 100d is stacked over the display panel 100c.

Here, it is preferable that the display panel 100 have flexibility. For example, a pair of substrates included in the display panel 100 preferably have flexibility.

Thus, as illustrated in FIGS. 5D and 5E, a region near the FPC 112a of the display panel 100a can be bent so that part of the display panel 100a and part of the FPC 112a can be placed under the display region 101b of the display panel 100b adjacent to the FPC 112a. As a result, the FPC 112a can be placed without physical interference with the rear surface of the display panel 100b. Furthermore, when the display panel 100a and the display panel 100b overlap with each other and are fixed, it is not necessary to consider the thickness of the FPC 112a; thus, the top surface of the region 110b transmitting visible light and the top surface of the display panel 100a can be substantially leveled. This can make an end portion of the display panel 100b over the display region 101a less noticeable.

Moreover, each display panel 100 is made flexible, in which case the display panel 100b can be curved gently so that the top surface of the display region 101b of the display panel 100b and the top surface of the display region 101a of the display panel 100a are leveled. Thus, the display regions can be leveled except the vicinity of a region where the display panel 100a and the display panel 100b overlap with each other, so that the display quality of an image displayed on the display region 13 of the display device 12 can be improved.

Although the relation between the display panel 100a and the display panel 100b is taken as an example in the above description, the same can apply to the relation between any other two adjacent display panels.

FIGS. 6A to 6E and FIGS. 7A to 7D are examples of cross-sectional views of the two display panels attached to each other.

In FIGS. 6A to 6E, a lower display panel includes the display region 101a, a region 110a transmitting visible light, and the region 120a blocking visible light. The lower display panel is electrically connected to the FPC 112a. An upper display panel (display panel on the display surface side) includes the display region 101b, the region 110b transmitting visible light, and the region 120b that blocking visible light. The upper display panel is electrically connected to an FPC 112b.

Figure 6A:
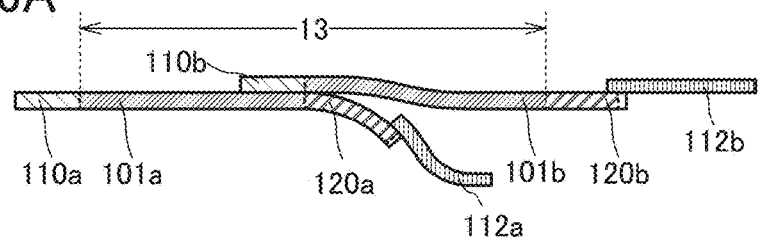
FIGS. 6A to 6E are cross-sectional views illustrating examples of a display device.

In FIG. 6A, the FPC 112a and the FPC 112b are connected to the display surface side (front surface side) of the lower display panel and the display surface side of the upper display panel, respectively.

Figure 6B:
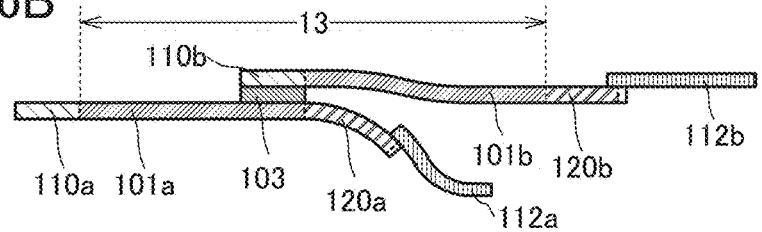

FIG. 6B illustrates an example in which two display panels are partly attached to each other with the above-described light-transmitting layer 103. FIG. 6B illustrates an example in which the width of the region 110b transmitting visible light is the same as that of the light-transmitting layer 103.

Figure 6C:
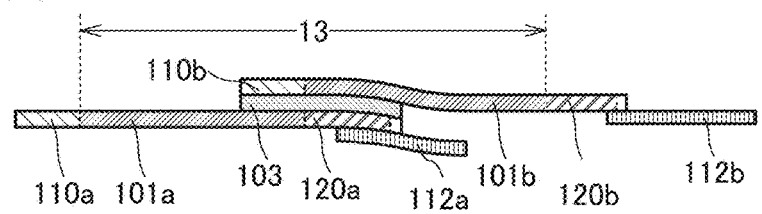

FIG. 6C illustrates an example in which the FPC 112a and the FPC 112b are connected to the side (rear surface side) opposite to the display surface of the lower display panel and the side (rear surface side) opposite to the display surface of the upper display panel, respectively.

In FIG. 6C, the light-transmitting layer 103 is provided between the region 120a blocking visible light of the lower display panel and the display region 101b of the upper display panel.

When an FPC is connected to the rear surface side of a lower display panel, an end portion of the lower display panel can be attached to the rear surface of an upper display panel; thus, the attachment area can be increased and the mechanical strength of the attached portion can be increased.

Figure 6D:
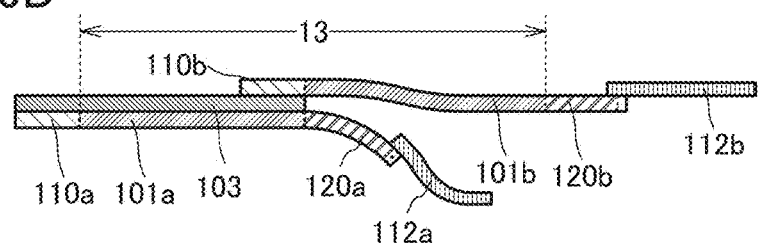

In FIG. 6D, the light-transmitting layer 103 overlaps with a region of the display region 101a not overlapping with the upper display panel. Furthermore, the region 110a transmitting visible light and the light-transmitting layer 103 overlap with each other.

Fine dirt such as dust in the air might be attached depending on a material of the light-transmitting layer. In such a case, it is preferable that the region of the display region 101a not overlapping with the upper display panel not overlap with the light-transmitting layer 103. This makes it possible to suppress unclear display of the display device due to dirt or the like attached to the light-transmitting layer 103.

Figure 6E:
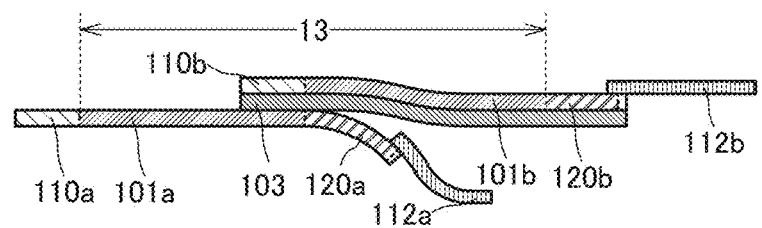

In FIG. 6E, the light-transmitting layer 103 overlaps with a region of the upper display panel not overlapping with the display region 101a.

In the structure illustrated in FIG. 6E, the light-transmitting layer is not provided on the outermost surface of the display surface of the display device; thus, unclear display of the display device due to dirt or the like attached to the light-transmitting layer 103 can be prevented. In addition, when a light-transmitting layer having attachability is provided on the rear surface of the display device, the display device can be detachably attached to a desired portion with the use of a surface of the light-transmitting layer that is not in contact with the display panel.

Figure 7A:
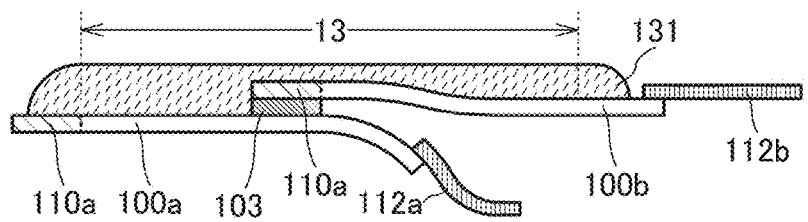
FIGS. 7A to 7D are cross-sectional views illustrating examples of a display device.

In FIG. 7A, a resin layer 131 covers front surfaces of the display panel 100a and the display panel 100b. The resin layer 131 is preferably provided to cover the display regions of the display panels 100a and 100b and a region where the display panel 100a overlaps with the display panel 100b.

Providing the resin layer 131 over these display panels 100 can increase the mechanical strength of the display device 12. In addition, the resin layer 131 is formed to have a flat surface, whereby the display quality of an image displayed on the display region 13 can be increased. For example, when a coating apparatus such as a slit coater, a curtain coater, a gravure coater, a roll coater, or a spin coater is used, the resin layer 131 with high flatness can be formed.

The refractive index of the resin layer 131 is preferably 0.8 to 1.2 times, further preferably 0.9 to 1.1 times, and still further preferably 0.95 to 1.15 times as high as the refractive index of the substrate on the display surface side of the display panel 100. Light can be extracted outside more efficiently as the difference in refractive index between the display panel 100 and the resin layer 131 becomes smaller. In addition, the resin layer 131 with such a refractive index is provided to cover a step portion between the display panel 100a and the display panel 100b, whereby the step portion is not easily noticed, and the display quality of an image displayed on the display region 13 can be increased.

The resin layer 131 transmits visible light. For the resin layer 131, for example, an organic resin such as an epoxy resin, an aramid resin, an acrylic resin, a polyimide resin, a polyamide resin, or a polyamide-imide resin can be used.

Figure 7B:
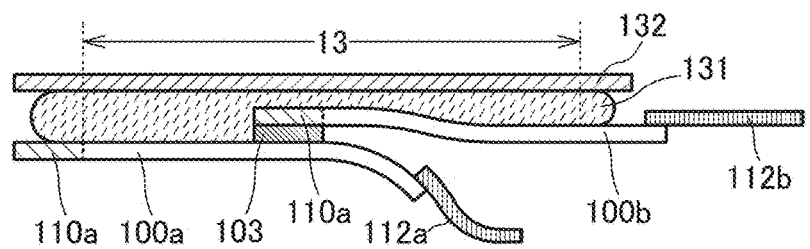

Alternatively, as illustrated in FIG. 7B, a protective substrate 132 is preferably provided over the display device 12 with the resin layer 131 provided therebetween. In that case, the resin layer 131 may serve as a bonding layer for bonding the protective substrate 132 to the display device 12.

With the protective substrate 132, the surface of the display device 12 can be protected, and moreover, the mechanical strength of the display device 12 can be increased. For the protective substrate 132, a light-transmitting material is used at least in a region overlapping with the display region 13. Furthermore, the protective substrate 132 may have a light-blocking property in a region other than the region overlapping with the display region 13 so as not to be noticed.

The protective substrate 132 may function as a touch panel. In the case where the display panel 100 is flexible and capable of being bent, the protective substrate 132 is also preferably flexible.

Furthermore, a difference in refractive index between the protective substrate 132 and the substrate on the display surface side of the display panel 100 or the resin layer 131 is preferably less than or equal to 20%, further preferably less than or equal to 10%, and still further preferably less than or equal to 5%.

As the protective substrate 132, a plastic substrate that is formed as a film can be used. For the plastic substrate, a polyester resin such as polyethylene terephthalate (PET) or polyethylene naphthalate (PEN), a polyacrylonitrile resin, a polyimide resin, a polymethyl methacrylate resin, a polycarbonate (PC) resin, a polyethersulfone (PES) resin, a polyamide resin (e.g., nylon or aramid), a polycycloolefin resin, a polystyrene resin, a polyamide imide resin, a polyvinyl chloride resin, a polyetheretherketone (PEEK) resin, a polysulfone (PSF) resin, a polyetherimide (PEI) resin, a polyarylate (PAR) resin, a polybutylene terephthalate (PBT) resin, a polytetrafluoroethylene (PTFE) resin, a silicone resin, or the like can be used. Alternatively, a substrate in which a fibrous body is impregnated with a resin (also referred to as prepreg) or a substrate whose coefficient of linear expansion is reduced by mixing an organic resin with an inorganic filler can be used. The protective substrate 132 is not limited to the resin film, and a transparent nonwoven fabric formed by processing pulp into a continuous sheet, a sheet including an artificial spider's thread fiber containing protein called fibroin, a complex in which the transparent nonwoven fabric or the sheet and a resin are mixed, a stack of a resin film and a nonwoven fabric containing a cellulose fiber whose fiber width is 4 nm or more and 100 nm or less, or a stack of a resin film and a sheet including an artificial spider's thread fiber may be used.

Note that the display device or the display panel of one embodiment of the present invention may be attached to an acrylic plate, a glass plate, a wooden plate, a metal plate, or the like. The display surface of the display device or that of the display panel or the surface opposite to the display surface thereof may be attached to these plates (in the case where the display surface is attached to any of these plates, a plate that transmits visible light is used). It is preferable that the display device or the display panel be detachably attached to any of these plates.

As the protective substrate 132, at least one of a polarizing plate, a circular polarizing plate, a retardation plate, an optical film, and the like can be used. The above-described optical member 240 can be used for the protective substrate 132.

It is preferable that not only the display panel but also a plate be hardly deformed by a temperature change in the case where a state in which the display panel is attached to the plate is held. For example, the coefficient of thermal expansion of the plate is preferably lower than or equal to 60 ppm/° C., further preferably lower than or equal to 30 ppm/° C. For example, a metal plate such as an aluminum plate or a glass epoxy plate can be favorably used.

Figure 7C:
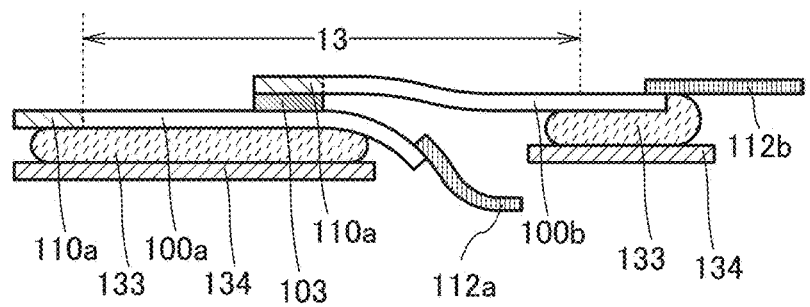

As illustrated in FIG. 7C, a resin layer 133 and a protective substrate 134 can be provided on surfaces opposite to the display surfaces of the display panels 100a and 100b.

Providing a substrate supporting the display panels on the rear surfaces of the display panels can suppress unintended warping or bending of the display panels, whereby the display surfaces can be kept smooth. Thus, the display quality of an image displayed on the display region 13 can be improved.

Note that the resin layer 133 and the protective substrate 134, which are provided on the sides opposite to the display surfaces, do not necessarily have light transmittance, and a material that absorbs or reflects visible light may be used.

Figure 7D:
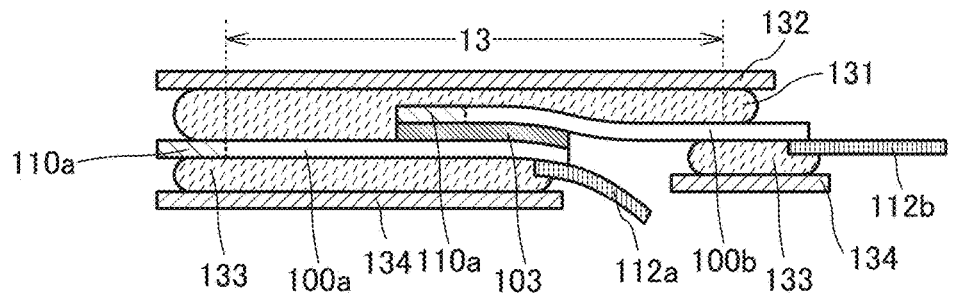

As illustrated in FIG. 7D, the resin layer 131 and the protective substrate 132 can be provided on the front surfaces of the display panels, and the resin layer 133 and the protective substrate 134 may be provided on the rear surfaces thereof. In this manner, the display panels 100a and 100b are sandwiched between the two protective substrates, whereby the mechanical strength of the display device 12 can be further increased.

It is preferable that the total thickness of the resin layer 131 and the protective substrate 132 be approximately the same as that of the resin layer 133 and the protective substrate 134. For example, it is preferable that the thicknesses of the resin layers 131 and 133 be made substantially equal to each other, and materials having the same thickness be used for the protective substrates 132 and 134. In that case, the display panels 100 can be located at the center of the stack in the thickness direction. For example, when the stack including the display panels 100 at the center in the thickness direction is bent, stress in the lateral direction applied to the display panels 100 by bending can be relieved, which prevents the display panels 100 from being damaged.

In the case where the thicknesses of the resin layer and the protective substrate differ between an end portion and a center portion of the display device, for example, the total thickness of the resin layer 131 and the protective substrate 132 and that of the resin layer 133 and the protective substrate 134 are preferably compared under the same condition that is appropriately selected from conditions such as the average thickness, the largest thickness, the smallest thickness, and the like.

In FIG. 7D, the same material is preferably used for the resin layers 131 and 133 because the manufacturing cost can be reduced. Similarly, the same material is preferably used for the protective substrates 132 and 134 because the manufacturing cost can be reduced.

As illustrated in FIGS. 7C and 7D, an opening for leading the FPC 112a is preferably provided in the resin layer 133 and the protective substrate 134, which are located on the rear surface sides of the display panels 100a and 100b. In particular, when the resin layer 133 is provided to cover part of the FPC 112a as illustrated in FIG. 7D, the mechanical strength at a connection portion between the display panel 100a and the FPC 112a can be increased, and defects such as separation of the FPC 112a can be suppressed. Similarly, the resin layer 133 is preferably provided to cover part of the FPC 112b.

Figure 8A:
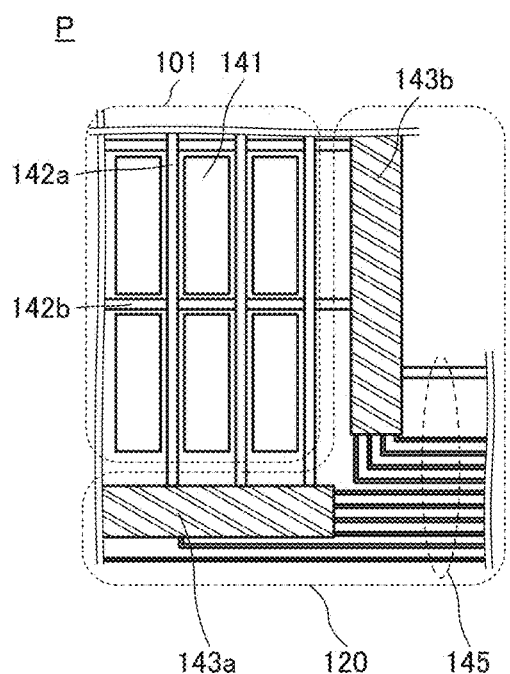
FIGS. 8A to 8C are top views and a cross-sectional view illustrating an example of a display panel.
Figure 8B:
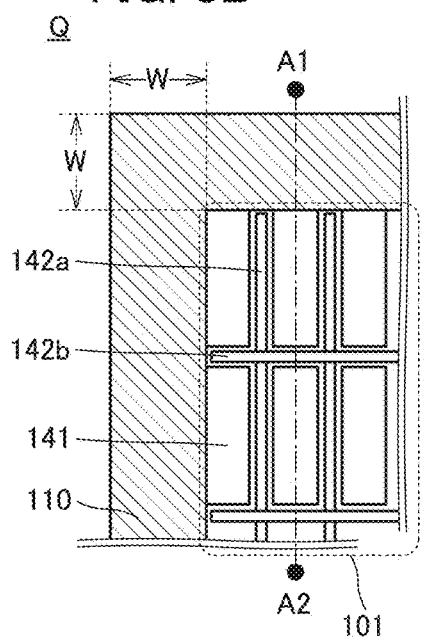

Next, a structure example of the display panel 100 is described. FIG. 8A is an example of a top view in which a region P in FIG. 5A is enlarged, and FIG. 8B is an example of a top view in which a region Q in FIG. 5A is enlarged.

As illustrated in FIG. 8A, in the display region 101, a plurality of pixels 141 are arranged in matrix. In the case where the display panel 100 capable of full color display with three colors of red, blue, and green is formed, each of the pixels 141 corresponds to a sub-pixel capable of displaying any of the three colors. A sub-pixel capable of displaying white or yellow may be provided in addition to the sub-pixels capable of displaying any of the three colors. A region including the pixels 141 corresponds to the display region 101.

A wiring 142a and a wiring 142b are electrically connected to each pixel 141. The wirings 142a each intersect with the wiring 142b, and are electrically connected to a circuit 143a. The wirings 142b are electrically connected to a circuit 143b. One of the circuits 143a and 143b can function as a scan line driver circuit, and the other can function as a signal line driver circuit. One or both of the circuits 143a and 143b are not necessarily provided.

In FIG. 8A, a plurality of wirings 145 electrically connected to the circuit 143a or the circuit 143b are provided. The wiring 145 is electrically connected to an FPC 123 in an unillustrated region and has a function of supplying a signal from the outside to the circuits 143a and 143b.

In FIG. 8A, a region including the circuit 143a, the circuit 143b, the plurality of wirings 145, and the like corresponds to the region 120 blocking visible light.

In FIG. 8B, a region outside the pixel 141 provided closest to the end corresponds to the region 110 transmitting visible light. The region 110 transmitting visible light does not include members that blocks visible light, such as the pixel 141, the wiring 142a, and the wiring 142b. Note that in the case where part of the pixel 141, the wiring 142a, or the wiring 142b transmits visible light, the part of the pixel 141, the wiring 142a, or the wiring 142b may be provided to extend to the region 110 transmitting visible light.

In the case where the width of the region 110 transmitting visible light is different between the display panels, or in the case where the width varies depending on the position in one display panel, the shortest length can be referred to as the width W. In FIG. 8B, the distance between the pixel 141 and the end portion of the substrate (that is, the width W of the region 110 transmitting visible light) in the vertical direction is the same as that in the horizontal direction, but one embodiment of the present invention is not limited thereto.

Figure 8C:
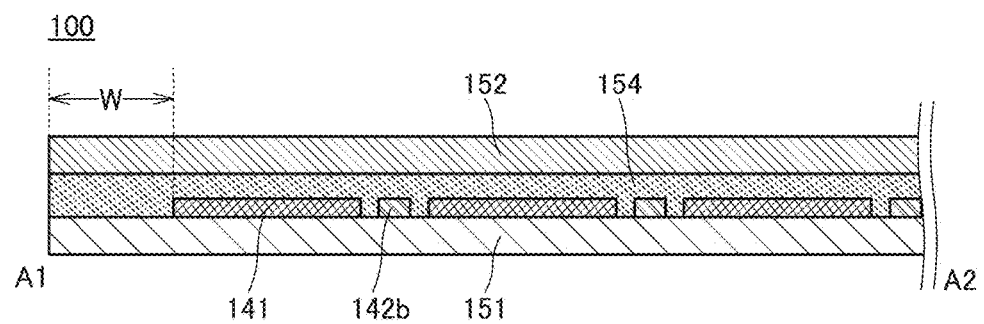

FIG. 8C is a cross-sectional view taken along line A1-A2 in FIG. 8B. The display panel 100 includes a pair of substrates (a substrate 151 and a substrate 152) that transmit visible light. The substrate 151 and the substrate 152 are bonded to each other with a bonding layer 154. Here, the substrate on which the pixel 141, the wiring 142b, and the like are formed is referred to as the substrate 151.

As illustrated in FIGS. 8B and 8C, in the case where the pixel 141 is positioned closest to the end of the display region 101, the width of the region 110 transmitting visible light is the distance between the end portion of the substrate 151 or the substrate 152 and the end portion of the pixel 141.

Note that the end portion of the pixel 141 refers to the end portion of the member that is positioned closest to the end and blocks visible light in the pixel 141. Alternatively, in the case where a light-emitting element including a layer containing a light-emitting organic compound between a pair of electrodes (also referred to as an organic EL element) is used as the pixel 141, the end portion of the pixel 141 may be any of the end portion of the lower electrode, the end portion of the layer containing a light-emitting organic compound, and the end portion of the upper electrode.

Figure 9A:
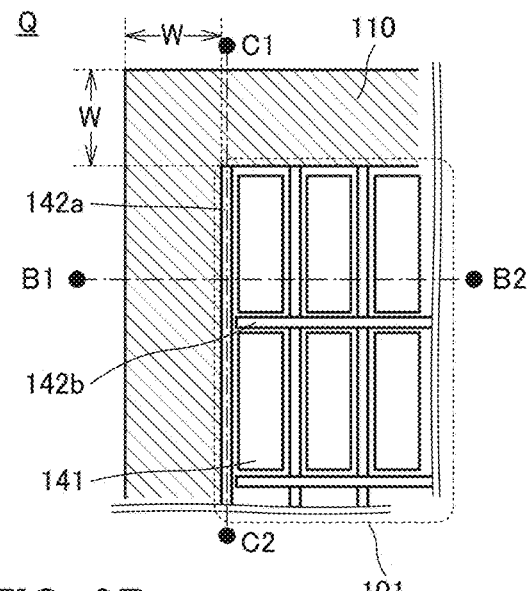
FIGS. 9A to 9C are a top view and cross-sectional views illustrating an example of a display panel.
Figure 9B:
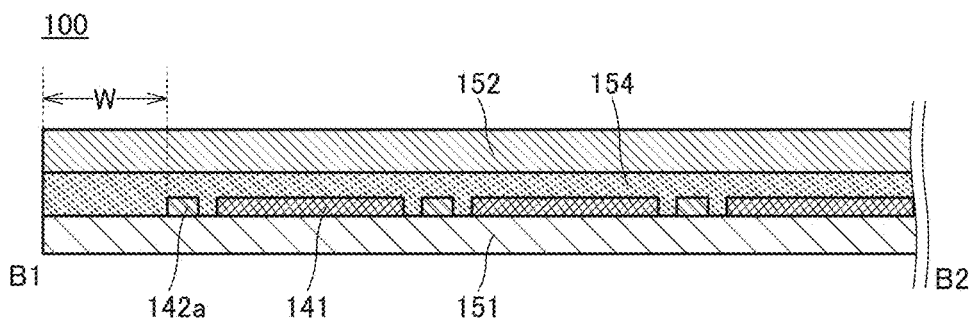

FIG. 9A is an example of a top view in which the region Q is enlarged; the position of the wiring 142a is different from that in FIG. 8B. FIG. 9B is a cross-sectional view taken along line B1-B2 in FIG. 9A, and FIG. 9C is a cross-sectional view taken along line C1-C2 in FIG. 9A.

Figure 9C:
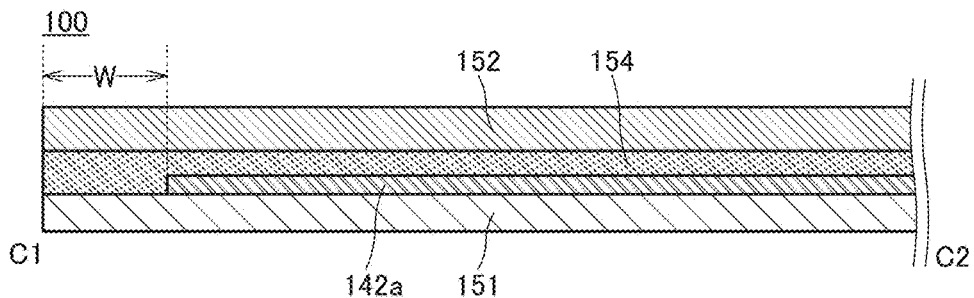

As illustrated in FIGS. 9A to 9C, in the case where the wiring 142a is positioned closest to the end of the display region 101, the width W of the region 110 transmitting visible light is the distance between the end portion of the substrate 151 or the substrate 152 and the end portion of the wiring 142a. In the case where the wiring 142a transmits visible light, the region 110 transmitting visible light may include a region where the wiring 142a is provided.

<Structure Example of Light-Emitting Element>

Figure 10A:
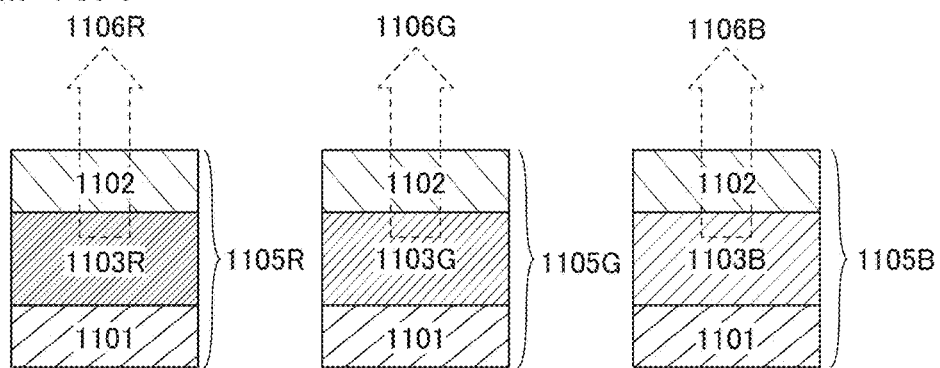
FIGS. 10A and 10B illustrate examples of a display device.
Figure 10B:
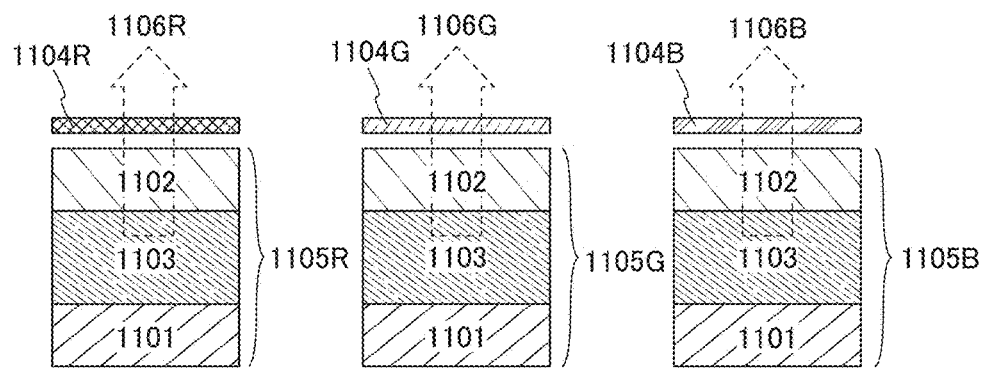

FIGS. 10A and 10B illustrate structure examples of the light-emitting element included in the display panel.

For example, the display panel includes a first light-emitting element 1105R, a second light-emitting element 1105G, and a third light-emitting element 1105B that are illustrated in FIG. 10A or 10B. The display panel may further include a color filter 1104R, a color filter 1104G, and a color filter 1104B that are illustrated in FIG. 10B.

In FIG. 10A, the first light-emitting element 1105R includes a first electrode 1101, an EL layer 1103R, and a second electrode 1102. The second light-emitting element 1105G includes the first electrode 1101, an EL layer 1103G, and the second electrode 1102. The third light-emitting element 1105B includes the first electrode 1101, and an EL layer 1103B, and the second electrode 1102. Note that the EL layers included in the three light-emitting elements contain different materials partly or entirely and are formed by a separate coloring method. This means that, for example, the EL layer 1103R can be an EL layer that emits red light, the EL layer 1103G can be an EL layer that emits green light, and the EL layer 1103B can be an EL layer that emits blue light.

At least one of the electrodes (in the case of FIG. 10A, the second electrode 1102 positioned in the arrow direction in which light is emitted from the EL layer) included in each of the light-emitting elements is preferably formed using a light-transmitting conductive material.

In FIG. 10B, the first light-emitting element 1105R, the second light-emitting element 1105G, and the third light-emitting element 1105B each include the first electrode 1101, an EL layer 1103, and the second electrode 1102. The color filter 1104R is provided in a region overlapping with the first light-emitting element 1105R. The color filter 1104G is provided in a region overlapping with the second light-emitting element 1105G. The color filter 1104B is provided in a region overlapping with the third light-emitting element 1105B. Note that the light-emitting elements share the same EL layer 1103.

The second electrode 1102 included in each of the light-emitting elements illustrated in FIG. 10B is preferably formed using a light-transmitting conductive material. Accordingly, red light 1106R of light emitted from the EL layer 1103 can be extracted from the first light-emitting element 1105R to the outside through the color filter 1104R. Furthermore, green light 1106G of the light emitted from the EL layer 1103 can be extracted from the second light-emitting element 1105G to the outside through the color filter 1104G. In addition, blue light 1106B of the light emitted from the EL layer 1103 can be extracted from the third light-emitting element 1105B to the outside through the color filter 1104B. This means that the color filter 1104R has a function of transmitting red light, the color filter 1104G has a function of transmitting green light, and the color filter 1104B has a function of transmitting blue light.

Although not illustrated in FIGS. 10A and 10B, each of the first light-emitting element 1105R, the second light-emitting element 1105G, and the third light-emitting element 1105B may be electrically connected to a transistor that controls light emission.

The EL layers illustrated in FIGS. 10A and 10B each include functional layers such as a light-emitting layer containing a light-emitting substance, a hole-injection layer, a hole-transport layer, an electron-transport layer, and an electron-injection layer. In the case of stacked EL layers, a charge generation layer is positioned between the EL layers.

The light-emitting layers included in the EL layers illustrated in FIGS. 10A and 10B can contain one or more kinds of organic compounds in addition to the light-emitting substance. Light-emitting substances of different colors may be mixed in one light-emitting layer. Alternatively, light-emitting substances of different colors may be contained in the stacked light-emitting layers. In the case where the light-emitting elements illustrated in FIGS. 10A and 10B each include a plurality of EL layers, a charge generation layer is provided between the EL layers as described above. In that case, the EL layers preferably emit light with different colors.

The first light-emitting element 1105R, the second light-emitting element 1105G, and the third light-emitting element 1105B illustrated in FIG. 10B share the EL layer 1103. In that case, light with different colors can be obtained from the light-emitting elements while the EL layer 1103 emits white light.

In the case where light emitted from the EL layer 1103 is white light obtained by mixing light with a plurality of wavelengths are mixed as illustrated in FIG. 10B, it is preferable to employ a microcavity structure by using the first electrode 1101 as a reflective electrode and the second electrode 1102 as a transflective electrode to intensify light with a specific wavelength. Note that a microcavity structure may be employed also in the case where the EL layers are separately formed for each light-emitting element as illustrated in FIG. 10A.

Since the first light-emitting element 1105R illustrated in FIG. 10A or FIG. 10B is a light-emitting element that emits red light, the thickness of the first electrode 1101 is preferably adjusted so that an optical path length between the first electrode 1101 and the second electrode 1102 may be set to an optical path length that increases the emission intensity of red light. Furthermore, since the second light-emitting element 1105G is a light-emitting element that emits green light, the thickness of the first electrode 1101 is preferably adjusted so that an optical path length between the first electrode 1101 and the second electrode 1102 may be set to an optical path length that increases the emission intensity of green light. In addition, since the third light-emitting element 1105B is a light-emitting element that emits blue light, the thickness of the first electrode 1101 is preferably adjusted so that an optical path length between the first electrode 1101 and the second electrode 1102 may be set to an optical path length that increases the emission intensity of blue light.

In the case where light emitted from the EL layer 1103 is white light as illustrated in FIG. 10B, it is desirable that red light, green light, and blue light that constitute white light have independent emission spectra that do not overlap with each other to prevent a reduction in color purity. The emission spectrum of green light and the emission spectrum of red light are especially likely to overlap with each other because their peak wavelengths are close to each other. The light-emitting substances contained in the EL layer and the stacked-layer structure of the EL layer are important in preventing such overlap of the emission spectra. Although the number of steps can be smaller in the case of a display panel including a common EL layer than in the case of a display panel including separately formed EL layers, it is difficult to select the light-emitting substances and design the stacked-layer structure of the EL layer such that overlap of different emission spectra is prevented. One embodiment of the present invention can provide not only a display panel having favorable chromaticity for each emission color, but also a display panel in which overlap of different emission spectra is prevented and chromaticity for each emission color is favorable particularly when a common light-emitting layer that emits white light is included.

The display panel described in this embodiment includes a plurality of light-emitting elements and can display a full-color image. At present, some standards are established as quality indicators for full-color displays.

For example, the sRGB standard, which is an international standard for color spaces defined by the International Electrotechnical Commission (IEC) to standardize color reproduction on devices such as displays, printers, digital cameras, and scanners, is widely used. Note that in the sRGB standard, the chromaticities (x, y) on the CIE 1931 chromaticity coordinates (x,y chromaticity coordinates) defined by the International Commission on Illumination (CIE) are (0.640, 0.330) for red (R), (0.300, 0.600) for green (G), and (0.150, 0.060) for blue (B).

In the NTSC standard, which is a color gamut standard for analog television systems defined by the National Television System Committee (NTSC) in America, the chromaticities (x, y) are (0.670, 0.330) for red (R), (0.210, 0.710) for green (G), and (0.140, 0.080) for blue (B).

In the DCI-P3 standard (defined by Digital Cinema Initiatives, LLC), which is the international unified standard used when distributing digital movies (cinema), the chromaticities (x, y) are (0.680, 0.320) for red (R), (0.265, 0.690) for green (G), and (0.150, 0.060) for blue (B).

In Recommendation ITU-R BT.2020 (hereinafter referred to as BT.2020) for ultra high definition television (UHDTV, also referred to as Super Hi-Vision), which is the standard defined by Japan Broadcasting Corporation (NHK), the chromaticities (x, y) are (0.708, 0.292) for red, (0.170, 0.797) for green, and (0.131, 0.046) for blue.

As described above, a variety of standards for displays are defined. The display panel of one embodiment of the present invention includes light-emitting elements (a light-emitting element that emits red light, a light-emitting element that emits green light, and a light-emitting element that emits blue light) that emit light whose chromaticities fall within the chromaticity ranges (a region A, a region B, and a region C) represented by color coordinates in FIG. 11. Specifically, the display panel includes at least the first light-emitting element 1105R from which the red light 1106R can be obtained, the second light-emitting element 1105G from which the green light 1106G can be obtained, and the third light-emitting element 1105B from which the blue light 1106B can be obtained. Light obtained from the first light-emitting element 1105R has chromaticity that falls within the region A in the color coordinates in FIG. 11, i.e., a CIE 1931 chromaticity coordinate x of greater than 0.680 and less than or equal to 0.720 and a CIE 1931 chromaticity coordinate y of greater than or equal to 0.260 and less than or equal to 0.320. Light obtained from the second light-emitting element 1105G has chromaticity that falls within the region B in the color coordinates in FIG. 11, i.e., a CIE 1931 chromaticity coordinate x of greater than or equal to 0.130 and less than or equal to 0.250 and a CIE 1931 chromaticity coordinate y of greater than 0.710 and less than or equal to 0.810. Light obtained from the third light-emitting element 1105B has chromaticity that falls within the region C in the color coordinates in FIG. 11, i.e., a CIE 1931 chromaticity coordinate x of greater than or equal to 0.120 and less than or equal to 0.170 and a CIE 1931 chromaticity coordinate y of greater than or equal to 0.020 and less than 0.060. Note that as illustrated in FIG. 10B, a structure in which the light-emitting elements and the color filters are used in combination and light emissions obtained from the light-emitting elements through the color filters have chromaticities that fall within in the above chromaticity ranges may be employed. A display panel including such light-emitting elements can provide high-quality full-color displays. It is needless to say that a structure that achieves the chromaticities that fall within the above chromaticity ranges without using color filters may be employed as illustrated in FIG. 10A.

Note that the peak wavelength of the emission spectrum of the first light-emitting element 1105R illustrated in FIG. 10A is preferably greater than or equal to 620 nm and less than or equal to 680 nm. The peak wavelength of the emission spectrum of the second light-emitting element 1105G illustrated in FIG. 10A is preferably greater than or equal to 500 nm and less than or equal to 530 nm. The peak wavelength of the emission spectrum of the third light-emitting element 1105B illustrated in FIG. 10A is preferably greater than or equal to 430 nm and less than or equal to 460 nm. The half widths of the emission spectra of the first light-emitting element 1105R, the second light-emitting element 1105G, and the third light-emitting element 1105B are preferably greater than or equal to 5 nm and less than or equal to 45 nm, greater than or equal to 5 nm and less than or equal to 35 nm, and greater than or equal to 5 nm and less than or equal to 25 nm, respectively. The peak wavelengths and the half widths of emission spectra of light passed through the color filters illustrated in FIG. 10B preferably have similar values.

In one embodiment of the present invention, the above chromaticities are preferably obtained so that the area ratio with respect to the BT.2020 color gamut in the CIE chromaticity coordinates (x, y) can become higher than or equal to 80%, further preferably higher than or equal to 90%, or the color gamut coverage can become higher than or equal to 75%, further preferably higher than or equal to 85%.

The chromaticities may be measured with any of a luminance colorimeter, a spectroradiometer, and an emission spectrometer, and it is sufficient that the above-described chromaticities be met in any one of the measurements. Note that it is preferable that the above-described chromaticities be met in all of the measurements.

In one embodiment of the present invention, the same material is used for the layer that constitutes the hole-transport layer and that is in contact with the hole-injection layer in each of the light-emitting elements for different colors. For example, the hole-transport layer in the light-emitting element emitting red light and that in the light-emitting element emitting green light each include a first hole-transport layer that is in contact with the hole-injection layer and a second hole-transport layer that is in contact with the light-emitting layer. The hole-transport layer in the light-emitting element emitting blue light includes only the first hole-transport layer that is in contact with both the hole-injection layer and the light-emitting layer.

Note that in an element emitting blue fluorescence, the HOMO level and the LUMO level of a host material in a light-emitting layer are deep. Depending on the material for a hole-injection layer, the HOMO level of a hole-transport layer often needs to be shallow so that electrons can be extracted from the hole-injection layer. In that case, the hole-transport layer needs to have a structure in which a layer with a shallow HOMO level and a layer with a deep HOMO level are sequentially stacked. In one embodiment of the present invention, a mixed layer of a hole-transport material and a metal oxide is used as the hole-injection layer. Use of a hole-transport material with a deep HOMO level for the mixed layer allows the hole-transport layer to be formed using a hole-transport material with a deep HOMO level. Accordingly, even when the hole-transport layer has a single-layer structure, holes can be injected into the light-emitting layer emitting blue fluorescence.

In each of the light-emitting elements for different colors, the hole-injection layer and the first hole-transport layer preferably contain the same hole-transport material.

In each of the light-emitting element emitting red light and the light-emitting element emitting green light, the second hole-transport layer can be used as a layer for adjusting the optical path length. The material used for the second hole-transport layer preferably has a shallower HOMO level than that used for the first hole-transport layer. In this manner, power consumption by the light-emitting element emitting red light and the light-emitting element emitting green light can be reduced. It is preferable that the material contained in the second hole-transport layer be also contained in the light-emitting layer of the light-emitting element emitting red light and the light-emitting layer of the light-emitting element emitting green light.

As described above, the display device of one embodiment of the present invention can display an image with a wide color gamut and can have a wide display region in which a seam is less likely to be noticed.

This embodiment can be combined with any of other embodiments as appropriate. In the case where a plurality of structure examples are described in one embodiment in this specification, some of the structure examples can be combined as appropriate.

Embodiment 2

In this embodiment, a light-emitting element and a light-emitting panel that can be used for the display device of one embodiment of the present invention are described with reference to FIGS. 12A to 12D and FIGS. 13A and 13B.

<<Basic Structure of Light-Emitting Element>>

Figure 12A:
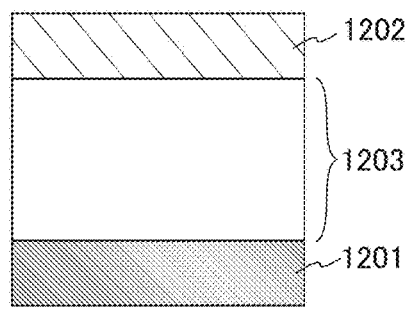
FIGS. 12A to 12D illustrate examples of a light-emitting element.

A basic structure of a light-emitting element will be described. FIG. 12A illustrates a light-emitting element including, between a pair of electrodes, an EL layer. Specifically, an EL layer 1203 is provided between a first electrode 1201 and a second electrode 1202 (single structure). The EL layer 1203 includes at least a light-emitting layer.

Figure 12B:
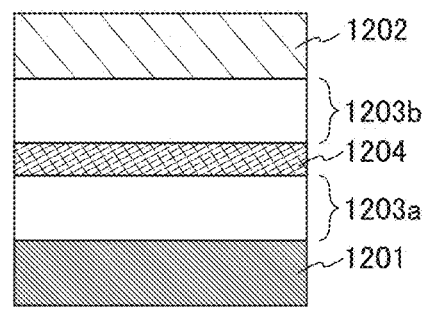

The light-emitting element may include a plurality of EL layers between the pair of electrodes. FIG. 12B illustrates a light-emitting element that has a stacked-layer structure (tandem structure) in which two EL layers (EL layers 1203a and 1203b) are provided between a pair of electrodes and a charge generation layer 1204 is provided between the two EL layers. With the use of such a tandem light-emitting element, a light-emitting panel which can be driven at low voltage with low power consumption can be obtained.

The charge generation layer 1204 has a function of injecting electrons into one of the EL layers 1203a and 1203b and injecting holes into the other of the EL layers when voltage is applied between the first electrode 1201 and the second electrode 1202. Thus, when voltage is applied to the first electrode 1201 in FIG. 12B such that the potential of the first electrode 1201 becomes higher than that of the second electrode 1202, the charge generation layer 1204 injects electrons into the EL layer 1203a and injects holes into the EL layer 1203b.

Note that in terms of light extraction efficiency, the charge generation layer 1204 preferably transmits visible light (specifically, the visible light transmittance of the charge generation layer 1204 is preferably 40% or higher). Furthermore, the charge generation layer 1204 functions even if it has lower conductivity than the first electrode 1201 or the second electrode 1202.

Figure 12C:
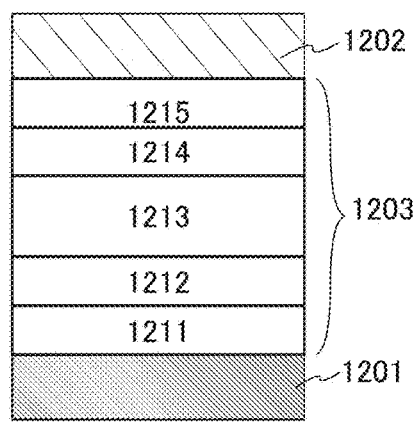

FIG. 12C illustrates a stacked-layer structure of the EL layer 1203. In this case, the first electrode 1201 is regarded as functioning as an anode. The EL layer 1203 has a structure in which a hole-injection layer 1211, a hole-transport layer 1212, a light-emitting layer 1213, an electron-transport layer 1214, and an electron-injection layer 1215 are stacked in this order over the first electrode 1201. Even in the case where a plurality of EL layers are provided as in the tandem structure illustrated in FIG. 12B, the layers in each EL layer are sequentially stacked from the anode side as described above. When the first electrode 1201 is a cathode and the second electrode 1202 is an anode, the stacking order of the layers is reversed.

The light-emitting layer 1213 contains a light-emitting substance and a plurality of substances in appropriate combination, so that fluorescence or phosphorescence of a desired emission color can be obtained. The light-emitting layer 1213 may have a stacked-layer structure having different emission colors. In that case, light-emitting substances and other substances are different between the stacked light-emitting layers. Alternatively, the plurality of EL layers (the EL layers 1203a and 1203b) in FIG. 12B may exhibit their respective emission colors. Also in that case, light-emitting substances and other substances are different between the light-emitting layers.

In the light-emitting element, for example, a micro optical resonator (microcavity) structure in which the first electrode 1201 is a reflective electrode and the second electrode 1202 is a transflective electrode can be employed in FIG. 12C, whereby light emission from the light-emitting layer 1213 in the EL layer 1203 can be resonated between the electrodes and light passing and exiting through the second electrode 1202 can be intensified.

Note that when the first electrode 1201 of the light-emitting element is a reflective electrode having a structure in which a reflective conductive material and a light-transmitting conductive material (transparent conductive film) are stacked, optical adjustment can be performed by controlling the thickness of the transparent conductive film. Specifically, when the wavelength of light from the light-emitting layer 1213 is $\lambda$, the distance between the first electrode 1201 and the second electrode 1202 is preferably adjusted to around $m\lambda/2$ (m is a natural number).

To amplify desired light (wavelength: $\lambda$) obtained from the light-emitting layer 1213, the optical path length from the first electrode 1201 to a region where desired light is obtained in the light-emitting layer 1213 (light-emitting region) and the optical path length from the second electrode 1202 to the region where desired light is obtained in the light-emitting layer 1213 (light-emitting region) are preferably adjusted to around $(2m'+1)\lambda/4$ (m' is a natural number). Here, the light-emitting region means a region where holes and electrons are recombined in the light-emitting layer 1213.

By such optical adjustment, the spectrum of specific monochromatic light from the light-emitting layer 1213 can be narrowed and light emission with high color purity can be obtained.

In that case, the optical path length between the first electrode 1201 and the second electrode 1202 is, to be exact, the total thickness from a reflective region in the first electrode 1201 to a reflective region in the second electrode 1202. However, it is difficult to exactly determine the reflective regions in the first electrode 1201 and the second electrode 1202; thus, it is assumed that the above effect can be sufficiently obtained wherever the reflective regions may be set in the first electrode 1201 and the second electrode 1202. Furthermore, the optical path length between the first electrode 1201 and the light-emitting layer emitting desired light is, to be exact, the optical path length between the reflective region in the first electrode 1201 and the light-emitting region where desired light is obtained in the light-emitting layer. However, it is difficult to precisely determine the reflective region in the first electrode 1201 and the light-emitting region where desired light is obtained in the light-emitting layer; thus, it is assumed that the above effect can be sufficiently obtained wherever the reflective region and the light-emitting region may be set in the first electrode 1201 and the light-emitting layer emitting desired light.

The light-emitting element in FIG. 12C has a microcavity structure, so that light (monochromatic light) with different wavelengths can be extracted even if the same EL layer is used. Thus, separate coloring for obtaining a plurality of emission colors (e.g., R, G, and B) is not necessary. Therefore, high resolution can be easily achieved. Note that a combination with coloring layers (color filters) is also possible. Furthermore, emission intensity of light with a specific wavelength in the front direction can be increased, whereby power consumption can be reduced.

At least one of the first electrode 1201 and the second electrode 1202 is a light-transmitting electrode (e.g., a transparent electrode or a transflective electrode). In the case where the light-transmitting electrode is a transparent electrode, the transparent electrode has a visible light transmittance of higher than or equal to 40%. In the case where the light-transmitting electrode is a transflective electrode, the transflective electrode has a visible light reflectance of higher than or equal to 20% and lower than or equal to 80%, preferably higher than or equal to 40% and lower than or equal to 70%. These electrodes preferably have a resistivity of $1\times10^{-2}$ $\Omega$cm or less.

When the first electrode 1201 or the second electrode 1202 is a reflective electrode, the visible light reflectance of the reflective electrode is higher than or equal to 40% and lower than or equal to 100%, preferably higher than or equal to 70% and lower than or equal to 100%. This electrode preferably has a resistivity of $1\times10^{-2}$ $\Omega$cm or less.

<Specific Structure and Fabrication Method of Light-Emitting Element>>

Specific structures and specific fabrication methods of light-emitting elements will be described. Here, a light-emitting element having the tandem structure in FIG. 12B and a microcavity structure will be described with reference to FIG. 12D. In the light-emitting element in FIG. 12D, the first electrode 1201 is formed as a reflective electrode and the second electrode 1202 is formed as a transflective electrode. Thus, a single-layer structure or a stacked-layer structure can be formed using one or more kinds of desired conductive materials. Note that the second electrode 1202 is formed after formation of the EL layer 1203b, with the use of a material selected as described above. For fabrication of these electrodes, a sputtering method or a vacuum evaporation method can be used.

<First Electrode and Second Electrode>

As materials used for the first electrode 1201 and the second electrode 1202, any of the materials below can be used in an appropriate combination as long as the functions of the electrodes described above can be fulfilled. For example, a metal, an alloy, an electrically conductive compound, a mixture of these, and the like can be appropriately used. Specifically, an In—Sn oxide (also referred to as ITO), an In—Si—Sn oxide (also referred to as ITSO), an In—Zn oxide, an In—W—Zn oxide, or the like can be used. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

Figure 12D:
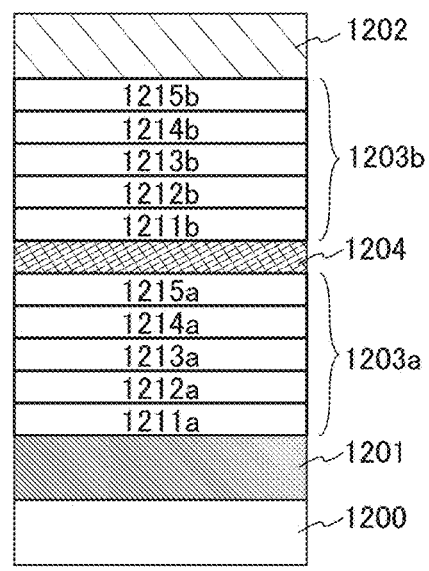

In the light-emitting element in FIG. 12D, when the first electrode 1201 is an anode, a hole-injection layer 1211a and a hole-transport layer 1212a of the EL layer 1203a are sequentially stacked over the first electrode 1201 by a vacuum evaporation method. After the EL layer 1203a and the charge generation layer 1204 are formed, a hole-injection layer 1211b and a hole-transport layer 1212b of the EL layer 1203b are sequentially stacked over the charge generation layer 1204 in a similar manner.

<Hole-Injection Layer and Hole-Transport Layer>

The hole-injection layers (1211, 1211a, and 1211b) inject holes from the first electrode 1201 that is an anode or the charge generation layer (1204) to the EL layers (1203, 1203a, and 1203b) and each contain a material with a high hole-injection property.

As examples of the material with a high hole-injection property, transition metal oxides such as molybdenum oxide, vanadium oxide, ruthenium oxide, tungsten oxide, and manganese oxide can be given. Alternatively, it is possible to use any of the following materials: phthalocyanine-based compounds such as phthalocyanine (abbreviation: H$_2$Pc) and copper phthalocyanine (abbreviation: CuPc); aromatic amine compounds such as 4,4'-bis[N-(4-diphenylaminophenyl)-N-phenylamino]biphenyl (abbreviation: DPAB) and N,N'-bis{4-[bis(3-methylphenyl)amino]phenyl}-N,N-diphenyl-(1,1'-biphenyl)-4,4'-diamine (abbreviation: DNTPD); high molecular compounds such as poly(3,4-ethylenedioxythiophene)/poly(styrenesulfonic acid) (abbreviation: PEDOT/PSS); and the like.

Alternatively, as the material with a high hole-injection property, a composite material containing a hole-transport material and an acceptor material (an electron-accepting material) can also be used. In that case, the acceptor material extracts electrons from a hole-transport material, so that holes are generated in the hole-injection layers (1211, 1211a, and 1211b) and the holes are injected into the light-emitting layers (1213, 1213a, and 1213b) through the hole-transport layers (1212, 1212a, and 1212b). Note that each of the hole-injection layers (1211, 1211a, and 1211b) may be formed to have a single-layer structure using a composite material containing a hole-transport material and an acceptor material (electron-accepting material), or a stacked-layer structure in which a layer including a hole-transport material and a layer including an acceptor material (electron-accepting material) are stacked.

The hole-transport layers (1212, 1212a, and 1212b) transport the holes, which are injected from the first electrode 1201 by the hole-injection layers (1211, 1211a, and 1211b), to the light-emitting layers (1213, 1213a, and 1213b). Note that the hole-transport layers (1212, 1212a, and 1212b) each contain a hole-transport material. It is particularly preferable that the HOMO level of the hole-transport material included in the hole-transport layers (1212, 1212a, and 1212b) be the same as or close to that of the hole-injection layers (1211, 1211a, and 1211b).

Examples of the acceptor material used for the hole-injection layers (1211a and 1211b) include an oxide of a metal belonging to any of Group 4 to Group 8 of the periodic table. As specific examples, molybdenum oxide, vanadium oxide, niobium oxide, tantalum oxide, chromium oxide, tungsten oxide, manganese oxide, and rhenium oxide can be given. Among these, molybdenum oxide is especially preferable since it is stable in the air, has a low hygroscopic property, and is easy to handle. Alternatively, organic acceptors such as a quinodimethane derivative, a chloranil derivative, and a hexaazatriphenylene derivative can be used. Specifically, 7,7,8,8-tetracyano-2,3,5,6-tetrafluoroquinodimethane (abbreviation: F$_4$-TCNQ), chloranil, 2,3,6,7,10,11-hexacyano-1,4,5,8,9,12-hexaazatriphenylene (abbreviation: HAT-CN), or the like can be used.

The hole-transport materials used for the hole-injection layers (1211, 1211a, and 1211b) and the hole-transport layers (1212, 1212a, and 1212b) are preferably substances with a hole mobility of greater than or equal to 10$^{-6}$ cm$^2$/Vs. Note that other substances may be used as long as the substances have a hole-transport property higher than an electron-transport property.

Preferred hole-transport materials are π-electron rich heteroaromatic compounds (e.g., carbazole derivatives and indole derivatives) and aromatic amine compounds, examples of which include compounds having an aromatic amine skeleton, such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA-1BP), 3-[4-(9-phenanthryl)-phenyl]-9-phenyl-9H-carbazole (abbreviation: PCPPn), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 4,4',4"-tris(carbazol-9-yl)triphenylamine (abbreviation: TCTA), 4,4',4"-tris(N,N-diphenylamino)triphenylamine (abbreviation: TDATA), and 4,4',4"-tris[N-(3-methylphenyl)-N-phenylamino]triphenylamine (abbreviation: MTDATA); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,3'-bis(9-phenyl-9H-carbazole) (abbreviation: PCCP), 3-[N-(9-phenylcarbazol-3-yl)-N-phenylamino]-9-phenyl-carbazole (abbreviation: PCzPCA1), 3,6-bis[N-(9- phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA); compounds having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II).

A high molecular compound such as poly(N-vinylcarbazole) (abbreviation: PVK), poly(-vinyltriphenylamine) (abbreviation: PVTPA), poly [N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N-bis(phenyl)benzidine] (abbreviation: Poly-TPD) can also be used.

Note that the hole-transport material is not limited to the above examples and may be one of or a combination of various known materials when used for the hole-injection layers (1211, 1211a, and 1211b) and the hole-transport layers (1212, 1212a, and 1212b). Note that the hole-transport layers (1212, 1212a, and 1212b) may each be formed of a plurality of layers. That is, for example, the hole-transport layers may each have a stacked-layer structure of a first hole-transport layer and a second hole-transport layer.

In the light-emitting element in FIG. 12D, the light-emitting layer 1213a is formed over the hole-transport layer 1212a of the EL layer 1203a by a vacuum evaporation method. After the EL layer 1203a and the charge generation layer 1204 are formed, the light-emitting layer 1213b is formed over the hole-transport layer 1212b of the EL layer 1203b by a vacuum evaporation method.

<Light-Emitting Layer>

The light-emitting layers (1213, 1213a, and 1213b) each contain a light-emitting substance. Note that as the light-emitting substance, a substance whose emission color is blue, violet, bluish violet, green, yellowish green, yellow, orange, red, or the like is appropriately used. When these light-emitting layers (1213a and 1213b) are formed using different light-emitting substances, different emission colors can be exhibited (for example, complementary emission colors are combined to achieve white light emission). Furthermore, a stacked-layer structure in which one light-emitting layer contains two or more kinds of light-emitting substances may be employed.

The light-emitting layers (1213, 1213a, and 1213b) may each contain one or more kinds of organic compounds (a host material and an assist material) in addition to a light-emitting substance (guest material). As the one or more kinds of organic compounds, one or both of the hole-transport material and the electron-transport material described in this embodiment can be used.

In the light-emitting element, it is preferable that a light-emitting substance which emits blue light (a blue-light-emitting substance) be used as a guest material in one of the light-emitting layers 1213a and 1213b and a substance which emits green light (a green-light-emitting substance) and a substance which emits red light (a red-light-emitting substance) be used in the other light-emitting layer. This manner is effective in the case where the blue-light-emitting substance (the blue-light-emitting layer) has lower light luminous efficiency or a shorter lifetime than the substances (layers) which emit other colors. Here, it is preferable that a light-emitting substance that converts singlet excitation energy into light emission in the visible light range be used as the blue-light-emitting substance and light-emitting substances that convert triplet excitation energy into light emission in the visible light range be used as the green- and red-light-emitting substances, whereby the spectrum balance between R, G, and B is improved.

There is no particular limitation on the light-emitting substances that can be used for the light-emitting layers (1213, 1213a, and 1213b), and a light-emitting substance that converts singlet excitation energy into light emission in the visible light range or a light-emitting substance that converts triplet excitation energy into light emission in the visible light range can be used. Examples of the light-emitting substance are given below.

As an example of the light-emitting substance that converts singlet excitation energy into light emission, a substance that emits fluorescence (fluorescent material) can be given. Examples of the substance that emits fluorescence include pyrene derivatives, anthracene derivatives, triphenylene derivatives, fluorene derivatives, carbazole derivatives, dibenzothiophene derivatives, dibenzofuran derivatives, dibenzoquinoxaline derivatives, quinoxaline derivatives, pyridine derivatives, pyrimidine derivatives, phenanthrene derivatives, and naphthalene derivatives. Pyrene derivatives are particularly preferable because they have a high emission quantum yield. Specific examples of pyrene derivatives include N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-diphenyl-N,N'-bis[4-(9-phenyl-9H-fluoren-9-yl)phenyl]pyrene-1,6-diamine (abbreviation: 1,6FLPAPrn), N,N'-bis(dibenzofuran-2-yl)-N,N'-diphenylpyrene-1,6-diamine (abbreviation: 1,6FrAPrn), N,N'-bis(dibenzothiophen-2-yl)-N,N'-diphenylpyrene-1,6-diamine (abbreviation: 1,6ThAPrn), N,N'-(pyrene-1,6-diyl)bis[(N-phenylbenzo[b]naphtho[1,2-d]furan)-6-amine] (abbreviation: 1,6BnfAPrn), N,N'-(pyrene-1,6-diyl)bis[(N-phenylbenzo[b]naphtho[1,2-d]furan)-8-amine] (abbreviation: 1,6BnfAPrn-02), and N,N'-(pyrene-1,6-diyl)bis[(6,N-diphenylbenzo[b]naphtho[1,2-d]furan)-8-amine] (abbreviation: 1,6BnfAPrn-03). In addition, pyrene derivatives are compounds effective for meeting the chromaticity of blue in one embodiment of the present invention.

In addition, it is possible to use 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra(tert-butyl)perylene (abbreviation: TBP), N,N"-(2-tert-butylanthracene-9,10-diyldi-4,1-phenylene)bis[N,N',N'-triphenyl-1,4-phenylenediamine] (abbreviation: DPA-BPA), N,9-diphenyl-N-[4-(9,10-diphenyl-2-anthryl)phenyl]-9H-carbazol-3-amine (abbreviation: 2PCAPPA), N-[4-

(9,10-diphenyl-2-anthryl)phenyl]-N,N',N'-triphenyl-1,4-phenylenediamine (abbreviation: 2DPAPPA), or the like.

As examples of a light-emitting substance that converts triplet excitation energy into light emission, a substance that emits phosphorescence (phosphorescent material) and a thermally activated delayed fluorescence (TADF) material that exhibits thermally activated delayed fluorescence can be given.

Examples of a phosphorescent material include an organometallic complex, a metal complex (platinum complex), and a rare earth metal complex. These substances exhibit the respective emission colors (emission peaks) and thus, any of them is appropriately selected according to need.

As examples of a phosphorescent material which emits blue or green light and whose emission spectrum has a peak wavelength at greater than or equal to 450 nm and less than or equal to 570 nm, the following substances can be given.

For example, organometallic complexes having a 4H-triazole skeleton, such as tris{2-[5-(2-methylphenyl)-4-(2,6-dimethylphenyl)-4H-1,2,4-triazol-3-yl-κN$^2$]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), and tris[3-(5-biphenyl)-5-isopropyl-4-phenyl-4H-1,2,4-triazolato]iridium(III) (abbreviation: [Ir(iPr5btz)$_3$]); organometallic complexes having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); organometallic complexes having an imidazole skeleton, such as fac-tris[1-(2,6-diisopropylphenyl)-2-phenyl-1H-imidazole]iridium(III) (abbreviation: [Ir(iPrpmi)$_3$]) and tris [3-(2,6-dimethylphenyl)-7-methylimidazo[1,2-f]phenanthridinato]iridium(III) (abbreviation: [Ir(dmpimpt-Me)$_3$]); organometallic complexes in which a phenylpyridine derivative having an electron-withdrawing group is a ligand, such as bis[2-(4',6'-difluorophenyl)pyridinato-N,C$^2$']iridium (III) tetrakis(1-pyrazolyl)borate (abbreviation: FIr6), bis[2-(4',6'-difluorophenyl)pyridinato-N,C$^2$']iridium(III) picolinate (abbreviation: FIrpic), bis[2-(3,5-bistrifluoromethylphenyl)-pyridinato-N,C$^2$']iridium(III) picolinate (abbreviation: [Ir(CF$_3$ppy)$_2$(pic)]), and bis[2-(4',6'-difluorophenyl)pyridinato-N,C$^2$']iridium(III) acetylacetonate (abbreviation: FIr(acac)); and the like can be given.

As examples of a phosphorescent material which emits green or yellow light and whose emission spectrum has a peak wavelength at greater than or equal to 495 nm and less than or equal to 590 nm, the following substances can be given.

For example, organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato) iridium(III) (abbreviation: [Ir(tBuppm)$_2$(acac)]), (acetylacetonato)bis[6-(2-norbornyl)-4-phenylpyrimidinato]iridium (III) (abbreviation: [Ir(nbppm)$_2$(acac)]), (acetylacetonato)bis[5-methyl-6-(2-methylphenyl)-4-phenylpyrimidinato] iridium(III) (abbreviation: [Ir(mpmppm)$_2$(acac)]), (acetylacetonato)bis{4,6-dimethyl-2-[6-(2,6-dimethylphenyl)-4-pyrimidinyl-κN$^3$]phenyl-κC}iridium(III) (abbreviation: [Ir(dmppm-dmp)$_2$(acac)]), and (acetylacetonato)bis(4,6-diphenylpyrimidinato)iridium(III) (abbreviation: [Ir(dppm)$_2$(acac)]); organometallic iridium complexes having a pyrazine skeleton, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having a pyridine skeleton, such as tris(2-phenylpyridinato-N,C$^2$')iridium(III) (abbreviation: [Ir(ppy)$_3$]), bis(2-phenylpyridinato-N,C$^2$')iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^2$')iridium(III) (abbreviation: [Ir(pq)$_3$]), and bis(2-phenylquinolinato-N,C$^2$')iridium(III) acetylacetonate (abbreviation: [Ir(pq)$_2$(acac)]); organometallic complexes such as bis(2,4-diphenyl-1,3-oxazolato-N,C$^2$')iridium(III) acetylacetonate (abbreviation: [Ir(dpo)$_2$(acac)]), bis{2-[4'-(perfluorophenyl)phenyl]pyridinato-N,C$^2$'}iridium(III) acetylacetonate (abbreviation: [Ir(p-PF-ph)$_2$(acac)]), and bis(2-phenylbenzothiazolato-N,C$^2$')iridium (III) acetylacetonate (abbreviation: [Ir(bt)$_2$(acac)]); and rare earth metal complexes such as tris(acetylacetonato)(monophenanthroline)terbium(III) (abbreviation: [Tb(acac)$_3$(Phen)]) can be given.

Among the above, organometallic iridium complexes having a pyridine skeleton (particularly, a phenylpyridine skeleton) or a pyrimidine skeleton are compounds effective for meeting the chromaticity of green in one embodiment of the present invention.

As examples of a phosphorescent material which emits yellow or red light and whose emission spectrum has a peak wavelength at greater than or equal to 570 nm and less than or equal to 750 nm, the following substances can be given.

For example, organometallic complexes having a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), and (dipivaloylmethanato)bis[4,6-di(naphthalen-1-yl)pyrimidinato]iridium(III) (abbreviation: [Ir(dlnpm)$_2$(dpm)]); organometallic complexes having a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium (III) (abbreviation: [Ir(tppr)$_2$(dpm)]), bis{4,6-dimethyl-2-[3-(3,5-dimethylphenyl)-5-phenyl-2-pyrazinyl-κN]phenyl-κC}(2,6-dimethyl-3,5-heptanedionato-κ$^2$O,O')iridium(III) (abbreviation: [Ir(dmdppr-P)$_2$(dibm)]), bis{4,6-dimethyl-2-[5-(4-cyano-2,6-dimethylphenyl)-3-(3,5-dimethylphenyl-2-pyrazinyl-κN]phenyl-κC}(2,2,6,6-tetramethyl-3,5-heptanedionato-κ$^2$O,O')iridium(III) (abbreviation: [Ir(dmdppr-dmCP)$_2$(dpm)]), (acetylacetonato)bis[2-methyl-3-phenylquinoxalinato-N,C$^2$']iridium(III) (abbreviation: [Ir(mpq)$_2$(acac)]), (acetylacetonato)bis(2,3-diphenylquinoxalinato-N,C$^2$')iridium(III) (abbreviation: [Ir(dpq)$_2$(acac)]), and (acetylacetonato)bis[2,3-bis(4-fluorophenyl)quinoxalinato] iridium(III) (abbreviation: [Ir(Fdpq)$_2$(acac)]); organometallic complexes having a pyridine skeleton, such as tris(1-phenylisoquinolinato-N,C$^2$')iridium(III) (abbreviation: [Ir(piq)$_3$]) and bis(1-phenylisoquinolinato-N,C$^2$')iridium(III) acetylacetonate (abbreviation: [Ir(piq)$_2$(acac)]); platinum complexes such as 2,3,7,8,12,13,17,18-octaethyl-21H,23H-porphyrinplatinum(II) (abbreviation: [PtOEP]); and rare earth metal complexes such as tris(1,3-diphenyl-1,3-propanedionato)(monophenanthroline)europium(III) (abbreviation: [Eu(DBM)$_3$(Phen)]) and tris[1-(2-thenoyl)-3,3, 3-trifluoroacetonato](monophenanthroline)europium(III) (abbreviation: [Eu(TTA)₃(Phen)]) can be given.

Among the above, organometallic iridium complexes having a pyrazine skeleton are compounds effective for meeting the chromaticity of red in one embodiment of the present invention. In particular, organometallic iridium complexes having a cyano group (e.g., [Ir(dmdppr-dmCP)₂(dpm)]) are preferable because they are stable.

Note that as the blue-light-emitting substance, a substance whose photoluminescence peak wavelength is greater than or equal to 430 nm and less than or equal to 470 nm, preferably greater than or equal to 430 nm and less than or equal to 460 nm may be used. As the green-light-emitting substance, a substance whose photoluminescence peak wavelength is greater than or equal to 500 nm and less than or equal to 540 nm, preferably greater than or equal to 500 nm and less than or equal to 530 nm may be used. As the red-light-emitting substance, a substance whose photoluminescence peak wavelength is greater than or equal to 610 nm and less than or equal to 680 nm, preferably greater than or equal to 620 nm and less than or equal to 680 nm may be used. Note that the photoluminescence may be measured with either a solution or a thin film.

With the parallel use of such compounds and microcavity effect, the above chromaticity can be more easily met. Here, a transflective electrode (a metal thin film portion) that is needed for obtaining microcavity effect preferably has a thickness of greater than or equal to 20 nm and less than or equal to 40 nm, and further preferably greater than 25 nm and less than or equal to 40 nm. However, the thickness greater than 40 nm possibly reduces the efficiency.

As the organic compounds (the host material and the assist material) used in the light-emitting layers (1213, 1213a, and 1213b), one or more kinds of substances having a larger energy gap than the light-emitting substance (the guest material) are used. Note that the hole-transport materials listed above and the electron-transport materials given below can be used as the host material and the assist material, respectively.

When the light-emitting substance is a fluorescent material, it is preferable to use, as the host material, an organic compound that has a high energy level in a singlet excited state and has a low energy level in a triplet excited state. For example, an anthracene derivative or a tetracene derivative is preferably used. Specific examples include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo carbazole[c,g] (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 5,12-diphenyltetracene, and 5,12-bis(biphenyl-2-yl)tetracene.

In the case where the light-emitting substance is a phosphorescent material, an organic compound having triplet excitation energy (energy difference between a ground state and a triplet excited state) which is higher than that of the light-emitting substance can be selected as the host material. In that case, it is possible to use a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a pyridine derivative, a bipyridine derivative, a phenanthroline derivative, an aromatic amine, a carbazole derivative, and the like.

Specific examples include metal complexes such as tris(8-quinolinolato)aluminum(III) (abbreviation: Alq), tris(4-methyl-8-quinolinolato)aluminum(III) (abbreviation: Almq₃), bis(10-hydroxybenzo[h]quinolinato)beryllium(II) (abbreviation: BeBq₂), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)-tris(1-phenyl-1H-benzimidazole) (abbreviation: TPBI), bathophenanthroline (abbreviation: BPhen), bathocuproine (abbreviation: BCP), 2,9-bis(naphthalen-2-yl)-4,7-diphenyl-1,10-phenanthroline (abbreviation: NBphen), and 9-[4-(5-phenyl-1,3,4-oxadiazol-2-yl)phenyl]-9H-carbazole (abbreviation: CO11); and aromatic amine compounds such as NPB, TPD, and BSPB.

In addition, condensed polycyclic aromatic compounds such as anthracene derivatives, phenanthrene derivatives, pyrene derivatives, chrysene derivatives, and dibenzo[g,p]chrysene derivatives can be used. Specifically, 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), 9,10-diphenyl-2-[N-phenyl-N-(9-phenyl-9H-carbazol-3-yl)amino]anthracene (abbreviation: 2PCAPA), 6,12-dimethoxy-5,11-diphenylchrysene, N,N,N',N',N",N",N''',N'''-octaphenyldibenzo[g,p]chrysene-2,7,10,15-tetraamine (abbreviation: DBC1), 9-[4-(10-phenyl-9-anthracenyl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), or the like can be used.

In the case where a plurality of organic compounds are used for the light-emitting layers (1213, 1213a, and 1213b), it is preferable to use compounds that form an exciplex in combination with a light-emitting substance. In that case, although any of various organic compounds can be combined appropriately to be used, to form an exciplex efficiently, it is particularly preferable to combine a compound that easily accepts holes (hole-transport material) and a compound that easily accepts electrons (electron-transport material). As the hole-transport material and the electron-transport material, specifically, any of the materials described in this embodiment can be used.

The TADF material is a material that can up-convert a triplet excited state into a singlet excited state (i.e., reverse intersystem crossing is possible) using a little thermal energy and efficiently exhibits light emission (fluorescence) from the singlet excited state. The TADF is efficiently obtained under the condition where the difference in energy between the triplet excited level and the singlet excited level is greater than or equal to 0 eV and less than or equal to 0.2 eV, preferably greater than or equal to 0 eV and less than or equal to 0.1 eV. Note that "delayed fluorescence" exhibited by the TADF material refers to light emission having the same spectrum as normal fluorescence and an extremely long lifetime. The lifetime is $10^{-6}$ seconds or longer, preferably $10^{-3}$ seconds or longer.

Examples of the TADF material include fullerene, a derivative thereof, an acridine derivative such as proflavine, and eosin. Other examples include a metal-containing porphyrin, such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$OEP).

Alternatively, a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (PIC-TRZ), 2-{4-[3-(N-phenyl-9H-carbazol-3-yl)-9H-carbazol-9-yl]phenyl}-4,6-diphenyl-1,3,5-triazine (PCCzPTzn), 2-[4-(10H-phenoxazin-10-yl)phenyl]-4,6-diphenyl-1,3,5-triazine (PXZ-TRZ), 3-[4-(5-phenyl-5,10-dihydrophenazin-10-yl)phenyl]-4,5-diphenyl-1,2,4-triazole (PPZ-3TPT), 3-(9,9-dimethyl-9H-acridin-10-yl)-9H-xanthen-9-one (ACRXTN), bis[4-(9,9-dimethyl-9,10-dihydroacridine)phenyl]sulfone (DMAC-DPS), or 10-phenyl-10H,10'H-spiro[acridin-9,9'-anthracen]-10'-one (ACRSA) can be used. Note that a substance in which the π-electron rich heteroaromatic ring is directly bonded to the π-electron deficient heteroaromatic ring is particularly preferable because both the donor property of the π-electron rich heteroaromatic ring and the acceptor property of the π-electron deficient heteroaromatic ring are increased and the energy difference between the singlet excited state and the triplet excited state becomes small.

Note that when a TADF material is used, the TADF material can be combined with another organic compound.

In the light-emitting element in FIG. 12D, the electron-transport layer 1214a is formed over the light-emitting layer 1213a of the EL layer 1203a by a vacuum evaporation method. After the EL layer 1203a and the charge generation layer 1204 are formed, the electron-transport layer 1214b is formed over the light-emitting layer 1213b of the EL layer 1203b by a vacuum evaporation method.

<Electron-Transport Layer>

The electron-transport layers (1214, 1214a, and 1214b) transport the electrons, which are injected from the second electrode 1202 by the electron-injection layers (1215, 1215a, and 1215b), to the light-emitting layers (1213, 1213a, and 1213b). Note that the electron-transport layers (1214, 1214a, and 1214b) each contain an electron-transport material. It is preferable that the electron-transport materials included in the electron-transport layers (1214, 1214a, and 1214b) be substances with an electron mobility of higher than or equal to $1\times 10^{-6}$ cm$^2$/Vs. Note that other substances may also be used as long as the substances have an electron-transport property higher than a hole-transport property.

Examples of the electron-transport material include metal complexes having a quinoline ligand, a benzoquinoline ligand, an oxazole ligand, and a thiazole ligand; an oxadiazole derivative; a triazole derivative; a phenanthroline derivative; a pyridine derivative; and a bipyridine derivative. In addition, a π-electron deficient heteroaromatic compound such as a nitrogen-containing heteroaromatic compound can also be used.

Specifically, it is possible to use metal complexes such as Alq$_3$, tris(4-methyl-8-quinolinolato)aluminum (abbreviation: Almq$_3$), bis(10-hydroxybenzo[h]quinolinato)beryllium (abbreviation: BeBq$_2$), BAlq, Zn(BOX)$_2$, and bis[2-(2-hydroxyphenyl)benzothiazolato]zinc (abbreviation: Zn(BTZ)$_2$), heteroaromatic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4'-tert-butylphenyl)-4-phenyl-5-(4''-biphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: Bphen), bathocuproine (abbreviation: BCP), and 4,4'-bis(5-methylbenzoxazol-2-yl)stilbene (abbreviation: BzOs), and quinoxaline derivatives and dibenzoquinoxaline derivatives such as 2-[3-(dibenzothiophen-4-yl)phenyl]dibenzo[fh]quinoxaline (abbreviation: 2mDBT-PDBq-II), 2-[3'-(dibenzothiophen-4-yl)biphenyl-3-yl]dibenzo[f,h]quinoxaline (abbreviation: 2mDBTBPDBq-II), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f/h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

Alternatively, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used.

Each of the electron-transport layers (1214, 1214a, and 1214b) is not limited to a single layer, but may be a stack of two or more layers each containing any of the above substances.

In the light-emitting element in FIG. 12D, the electron-injection layer 1215a is formed over the electron-transport layer 1214a of the EL layer 1203a by a vacuum evaporation method. Subsequently, the EL layer 1203a and the charge generation layer 1204 are formed, the components up to the electron-transport layer 1214b of the EL layer 1203b are formed and then, the electron-injection layer 1215b is formed thereover by a vacuum evaporation method.

<Electron-Injection Layer>

The electron-injection layers (1215, 1215a, and 1215b) each contain a substance having a high electron-injection property. The electron-injection layers (1215, 1215a, and 1215b) can each be formed using an alkali metal, an alkaline earth metal, or a compound thereof, such as lithium fluoride (LiF), cesium fluoride (CsF), calcium fluoride (CaF$_2$), or lithium oxide (LiO$_x$). A rare earth metal compound like erbium fluoride (ErF$_3$) can also be used. Electride may also be used for the electron-injection layers (1215, 1215a, and 1215b). Examples of the electride include a substance in which electrons are added at high concentration to calcium oxide-aluminum oxide. Any of the substances for forming the electron-transport layers (1214, 1214a, and 1214b), which are given above, can also be used.

A composite material in which an organic compound and an electron donor (donor) are mixed may also be used for the electron-injection layers (1215, 1215a, and 1215b). Such a composite material is excellent in an electron-injection property and an electron-transport property because electrons are generated in the organic compound by the electron donor. The organic compound here is preferably a material excellent in transporting the generated electrons; specifically, for example, the electron-transport materials for forming the electron-transport layers (1214, 1214*a*, and 1214*b*) (e.g., a metal complex or a heteroaromatic compound) can be used. As the electron donor, a substance showing an electron-donating property with respect to the organic compound may be used. Preferable examples are an alkali metal, an alkaline earth metal, and a rare earth metal. Specifically, lithium, cesium, magnesium, calcium, erbium, ytterbium, and the like can be given. Furthermore, an alkali metal oxide and an alkaline earth metal oxide are preferable, and lithium oxide, calcium oxide, barium oxide, and the like can be given. Alternatively, a Lewis base such as magnesium oxide can be used. Further alternatively, an organic compound such as tetrathiafulvalene (abbreviation: TTF) can be used.

In the case where light obtained from the light-emitting layer 1213*b* is amplified in the light-emitting element illustrated in FIG. 12D, for example, the optical path length between the second electrode 1202 and the light-emitting layer 1213*b* is preferably less than one fourth of the wavelength X of light emitted from the light-emitting layer 1213*b*. In that case, the optical path length can be adjusted by changing the thickness of the electron-transport layer 1214*b* or the electron-injection layer 1215*b*.

<Charge Generation Layer>

In the light-emitting element illustrated in FIG. 12D, the charge generation layer 1204 has a function of injecting electrons into the EL layer 1203*a* and injecting holes into the EL layer 1203*b* when a voltage is applied between the first electrode (anode) 1201 and the second electrode (cathode) 1202. The charge generation layer 1204 may have either a structure in which an electron acceptor (acceptor) is added to a hole-transport material or a structure in which an electron donor (donor) is added to an electron-transport material. Alternatively, both of these structures may be stacked. Note that forming the charge generation layer 1204 by using any of the above materials can suppress an increase in drive voltage caused by the stack of the EL layers.

In the case where the charge generation layer 1204 has a structure in which an electron acceptor is added to a hole-transport material, any of the materials described in this embodiment can be used as the hole-transport material. As the electron acceptor, it is possible to use 7,7,8,8-tetracyano-2,3,5,6-tetrafluoroquinodimethane (abbreviation: $F_4$-TCNQ), chloranil, and the like. In addition, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, rhenium oxide, or the like can be used.

In the case where the charge generation layer 1204 has a structure in which an electron donor is added to an electron-transport material, any of the materials described in this embodiment can be used as the electron-transport material. As the electron donor, it is possible to use an alkali metal, an alkaline earth metal, a rare earth metal, metals that belong to Groups 2 and 13 of the periodic table, or an oxide or carbonate thereof. Specifically, lithium (Li), cesium (Cs), magnesium (Mg), calcium (Ca), ytterbium (Yb), indium (In), lithium oxide, cesium carbonate, or the like is preferably used. Alternatively, an organic compound such as tetrathianaphthacene may be used as the electron donor.

For fabrication of the light-emitting element in this embodiment, a vacuum process such as an evaporation method or a solution process such as a spin coating method or an ink-jet method can be used. When an evaporation method is used, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layers, the hole-transport layers, the light-emitting layers, the electron-transport layers, the electron-injection layers) included in the EL layers and the charge generation layer of the light-emitting element can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

Note that materials that can be used for the functional layers (the hole-injection layers, the hole-transport layers, the light-emitting layers, the electron-transport layers, and the electron-injection layers) that are included in the EL layers and the charge generation layer in the light-emitting element described in this embodiment are not limited to the above materials, and other materials can be used in combination as long as the functions of the layers are fulfilled. For example, a high molecular compound (e.g., an oligomer, a dendrimer, or a polymer), a middle molecular compound (a compound between a low molecular compound and a high molecular compound with a molecular weight of 400 to 4000), an inorganic compound (e.g., a quantum dot material), or the like can be used. The quantum dot may be a colloidal quantum dot, an alloyed quantum dot, a core-shell quantum dot, a core quantum dot, or the like.

<Structure Example of Light-Emitting Panel>

Figure 13A:
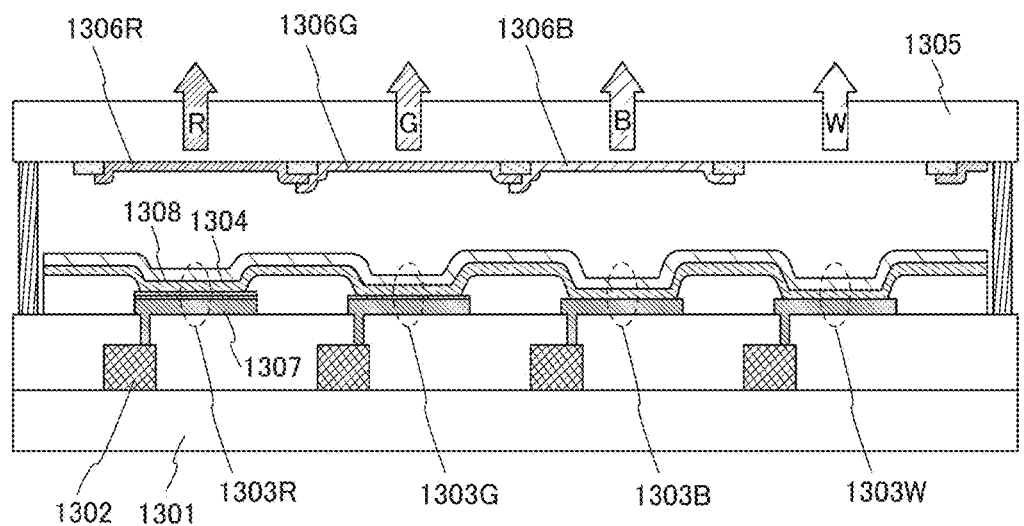
FIGS. 13A and 13B illustrate an example of a display device.

FIG. 13A illustrates a light-emitting panel of one embodiment of the present invention. The light-emitting panel illustrated in FIG. 13A is an active matrix light-emitting panel in which transistors (FETs) 1302 are electrically connected to light-emitting elements (1303R, 1303G, 1303B, and 1303W) over a first substrate 1301. These light-emitting elements (1303R, 1303G, 1303B, and 1303W) share an EL layer 1304 and each have a microcavity structure in which the optical path length between electrodes is adjusted depending on the emission color of the light-emitting element. The light-emitting panel is a top-emission light-emitting panel in which light is emitted from the EL layer 1304 through color filters (1306R, 1306G, and 1306B) formed on a second substrate 1305.

The light-emitting panel illustrated in FIG. 13A is fabricated such that a first electrode 1307 functions as a reflective electrode and a second electrode 1308 functions as a transflective electrode.

Figure 13B:
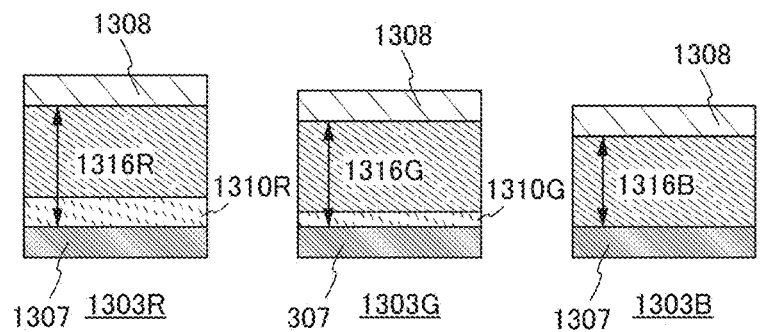

In the case where the light-emitting element 1303R functions as a red light-emitting element, the light-emitting element 1303G functions as a green light-emitting element, the light-emitting element 1303B functions as a blue light-emitting element, and the light-emitting element 1303W functions as a white light-emitting element in FIG. 13A, for example, a gap between the first electrode 1307 and the second electrode 1308 in the light-emitting element 1303R is adjusted to have an optical path length 1316R, a gap between the first electrode 1307 and the second electrode 1308 in the light-emitting element 1303G is adjusted to have an optical path length 1316G, and a gap between the first electrode 1307 and the second electrode 1308 in the light-emitting element 1303B is adjusted to have an optical path length 1316B as illustrated in FIG. 13B. Note that optical adjustment can be performed in such a manner that a conductive layer 1310R is stacked over the first electrode 1307 in the light-emitting element 1303R and a conductive layer 1310G is stacked over the first electrode 1307 in the light-emitting element 1303G as illustrated in FIG. 13B.

The second substrate 1305 is provided with the color filters (1306R, 1306G, and 1306B). Note that the color filters each transmit visible light in a specific wavelength range and blocks visible light in a specific wavelength range. Thus, as illustrated in FIG. 13A, the color filter 1306R that transmits only light in the red wavelength range is provided in a position overlapping with the light-emitting element 1303R, whereby red light emission can be obtained from the light-emitting element 1303R. Furthermore, the color filter 1306G that transmits only light in the green wavelength range is provided in a position overlapping with the light-emitting element 1303G, whereby green light emission can be obtained from the light-emitting element 1303G. Moreover, the color filter 1306B that transmits only light in the blue wavelength range is provided in a position overlapping with the light-emitting element 1303B, whereby blue light emission can be obtained from the light-emitting element 1303B. Note that the light-emitting element 1303W can emit white light without a color filter. Note that a black layer (black matrix) 1309 may be provided at an end portion of each color filter. The color filters (1306R, 1306G, and 1306B) and the black layer 1309 may be covered with an overcoat layer formed using a material transmitting visible light.

Although the light-emitting panel in FIG. 13A has a structure in which light is extracted from the second substrate 1305 side (top-emission structure), a structure in which light is extracted from the first substrate 1301 side where the FETs 1302 are formed (bottom-emission structure) may be employed. Note that in the light-emitting panel having a top-emission structure, the first substrate 1301 can be a light-blocking substrate or a light-transmitting substrate, whereas in a light-emitting panel having a bottom-emission structure, the first substrate 1301 needs to be a light-transmitting substrate.

In FIG. 13A, the light-emitting elements are the red light-emitting element, the green light-emitting element, the blue light-emitting element, and the white light-emitting element; however, the light-emitting elements of one embodiment of the present invention are not limited to the above, and a yellow light-emitting element or an orange light-emitting element may be used. Note that description in any of the other embodiments can be referred to as appropriate for materials that are used for the EL layers (a light-emitting layer, a hole-injection layer, a hole-transport layer, an electron-transport layer, an electron-injection layer, a charge generation layer, and the like) to fabricate each of the light-emitting elements. In that case, a color filter needs to be appropriately selected depending on the emission color of the light-emitting element.

With the above structure, a light-emitting panel including light-emitting elements that exhibit a plurality of emission colors can be fabricated.

This embodiment can be combined with any of other embodiments as appropriate.

Embodiment 3

In this embodiment, a display panel that can be used for the display device of one embodiment of the present invention is described with reference to the drawings.

In this embodiment, a display panel that uses an EL element as a display element is described as an example. The display panel in this embodiment can display an image with a wide color gamut by being combined with the structure described in Embodiment 1 or the like.

The display panel can have a structure in which sub-pixels of three colors of red (R), green (G), and blue (B) express one color, a structure in which sub-pixels of four colors of R, G, B, and white (W) express one color, a structure in which sub-pixels of four colors of R, G, B, and yellow (Y) express one color, or the like. There is no particular limitation on the color element and colors other than R, G, B, W, and Y (e.g., cyan or magenta) may be used.

<Example of Top View of Display Panel>

FIGS. 14A and 14B show top views of a display panel 370.

The display panels 370 illustrated in FIGS. 14A and 14B each include the region 110 transmitting visible light, a display portion 381, and a driver circuit portion 382. In the example illustrated in FIG. 14A, the region 110 transmitting visible light is adjacent to the display portion 381 and provided along two sides of the display portion 381. In the example illustrated in FIG. 14B, the region 110 transmitting visible light is adjacent to the display portion 381 and provided along three sides of the display portion 381.

<Example 1 of Cross-Sectional Structure of Display Panel>

FIG. 14C is a cross-sectional view of a display panel 370A employing a separate coloring method and having a top-emission structure. FIG. 14C corresponds to cross-sectional views along dashed-dotted lines A1-A2 and A3-A4 in each of FIGS. 14A and 14B.

The display panel 370A includes the substrate 201, the bonding layer 203, the insulating layer 205, a plurality of transistors, a capacitor 305, a conductive layer 307, an insulating layer 312, an insulating layer 313, an insulating layer 314, an insulating layer 315, a light-emitting element 304, a conductive layer 355, a spacer 316, a bonding layer 317, the substrate 211, the bonding layer 213, and the insulating layer 215.

The layers included in the region 110 transmitting visible light transmit visible light. FIG. 14C illustrates an example where the region 110 transmitting visible light includes the substrate 201, the bonding layer 203, the insulating layer 205, a gate insulating layer 311, the insulating layer 312, the insulating layer 313, the insulating layer 314, the bonding layer 317, the insulating layer 215, the bonding layer 213, and the substrate 211. In this stacked-layer structure, the materials for the layers are preferably selected such that a difference in refractive index at each interface is minimized.

The driver circuit portion 382 includes a transistor 301. The display portion 381 includes a transistor 302 and a transistor 303.

Each transistor includes a gate, the gate insulating layer 311, a semiconductor layer, a back gate, a source, and a drain. The gate (the lower gate) and the semiconductor layer overlap with each other with the gate insulating layer 311 provided therebetween. Part of the gate insulating layer 311 functions as a dielectric of the capacitor 305. The conductive layer functioning as the source or the drain of the transistor 302 serves as one electrode of the capacitor 305. The back gate (the upper gate) and the semiconductor layer overlap with each other with the insulating layer 312 and the insulating layer 313 provided therebetween.

The structure of the transistor may be different between the driver circuit portion 382 and the display portion 381. The driver circuit portion 382 and the display portion 381 may each include a plurality of kinds of transistors.

The transistors 301, 302, and 303 illustrated in FIG. 14C each include two gates, the gate insulating layer 311, a semiconductor layer, a source, and a drain. FIG. 14C illustrates an example where each transistor has a structure in which the semiconductor layer is sandwiched between the two gates. Such transistors can have higher field-effect mobility and thus have higher on-state current than other transistors. Consequently, a circuit capable of high-speed operation can be obtained. Furthermore, the area occupied by a circuit can be reduced. The use of the transistor having high on-state current can reduce signal delay in wirings and can reduce display luminance variation even in a display panel in which the number of wirings is increased because of increase in size or resolution.

The capacitor 305 includes a pair of electrodes and the dielectric therebetween. The capacitor 305 includes a conductive layer that is formed using the same material and the same step as the gate (the lower gate) of the transistor and a conductive layer that is formed using the same material and the same step as the source and the drain of the transistor.

A material through which impurities such as water and hydrogen do not easily diffuse is preferably used for at least one of the insulating layers 312, 313, and 314. Diffusion of impurities from the outside into the transistors can be effectively inhibited, leading to improved reliability of the display panel. The insulating layer 314 functions as a planarization layer. In the example illustrated in FIG. 14C, the insulating layer 314 is formed using an organic material and extends over the entire area of the display panel. Such a structure is preferable because the yield of the peeling process can be increased. Alternatively, a structure can be employed in which the insulating layer formed using an organic material is not placed in an end portion of the display panel. This structure can inhibit entry of impurities into the light-emitting element 304.

The insulating layer 205 and the substrate 201 are attached to each other with the bonding layer 203. The insulating layer 215 and the substrate 211 are attached to each other with the bonding layer 213.

In the display portion 381, the light-emitting element 304 is positioned between the insulating layer 205 and the insulating layer 215. Entry of impurities into the light-emitting element 304 from the thickness direction of the display panel 370 is suppressed. Similarly, a plurality of insulating layers covering the transistors are provided in the display portion 381, and thus entry of impurities into the transistors is suppressed.

The light-emitting element 304, the transistors, and the like are preferably provided between a pair of insulating films that are highly resistant to moisture, in which case entry of impurities such as water into these elements can be suppressed, leading to higher reliability of the display panel.

Examples of the insulating film highly resistant to moisture include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film highly resistant to moisture is lower than or equal to $1 \times 10^{-5}$ [g/(m²·day)], preferably lower than or equal to $1 \times 10^{-6}$ [g/(m²·day)], further preferably lower than or equal to $1 \times 10^{-7}$ [g/(m²·day)], still further preferably lower than or equal to $1 \times 10^{-8}$ [g/(m²·day)].

The light-emitting element 304 includes an electrode 321, an EL layer 322, and an electrode 323. The light-emitting element 304 may include an optical adjustment layer 324. The light-emitting element 304 emits light to the substrate 211 side.

The transistor, the capacitor, the wiring, and the like are provided to overlap with a light-emitting region of the light-emitting element 304, whereby an aperture ratio of the display portion 381 can be increased.

One of the electrode 321 and the electrode 323 functions as an anode and the other functions as a cathode. When a voltage higher than the threshold voltage of the light-emitting element 304 is applied between the electrode 321 and the electrode 323, holes are injected to the EL layer 322 from the anode side and electrons are injected to the EL layer 322 from the cathode side. The injected electrons and holes are recombined in the EL layer 322 and a light-emitting substance contained in the EL layer 322 emits light.

The electrode 321 is electrically connected to the source or the drain of the transistor 303, directly or through another conductive layer. The electrode 321 functions as a pixel electrode and is provided for each light-emitting element 304. Two adjacent electrodes 321 are electrically insulated from each other by the insulating layer 315.

The EL layer 322 is a layer containing a light-emitting material. As the light-emitting element 304, an organic EL element including an organic compound as a light-emitting material can be favorably used.

The EL layer 322 includes at least one light-emitting layer.

The electrode 323 functions as a common electrode and is provided for a plurality of light-emitting elements 304. A fixed potential is supplied to the electrode 323.

Note that one embodiment of the present invention is not limited to a separate coloring method, and a color filter method, a color conversion method, a quantum dot method, or the like may be employed.

For details of the light-emitting element, Embodiments 1 and 2 can also be referred to.

The connection portion 306 includes the conductive layer 307 and the conductive layer 355. The conductive layer 307 and the conductive layer 355 are electrically connected to each other. The conductive layer 307 can be formed using the same material and the same step as those of the source and the drain of the transistor. The conductive layer 355 is electrically connected to an external input terminal through which a signal or a potential from the outside is transmitted to the driver circuit portion 382. Here, an example in which an FPC 373 is provided as an external input terminal is shown. The FPC 373 and the conductive layer 355 are electrically connected to each other through a connector 319.

As the connector 319, any of various anisotropic conductive films (ACF), anisotropic conductive pastes (ACP), and the like can be used.

A flexible substrate is preferably used as each of the substrates 201 and 211. For example, glass, quartz, a resin, a metal, an alloy, or a semiconductor that is thin enough to have flexibility can be used. The substrate through which light is extracted from the light-emitting element is formed using a material that transmits the light. For example, the thickness of the substrate is preferably greater than or equal to 1 μm and less than or equal to 200 μm, further preferably greater than or equal to 1 μm and less than or equal to 100 μm, still further preferably greater than or equal to 10 μm and less than or equal to 50 μm, and particularly preferably greater than or equal to 10 μm and less than or equal to 25 μm. The thickness and hardness of the flexible substrate are set in the range where mechanical strength and flexibility can be balanced against each other. The flexible substrate may have a single-layer structure or a stacked-layer structure.

A resin, which has a specific gravity smaller than that of glass, is preferably used for the flexible substrate, in which case the display panel can be lightweight as compared with the case where glass is used.

The substrate is preferably formed using a material with high toughness. In that case, a display panel with high impact resistance that is less likely to be broken can be provided. For example, when a resin substrate or a thin metal or alloy substrate is used, the display panel can be lightweight and robust as compared with the case where a glass substrate is used.

A metal material and an alloy material, which have high thermal conductivity, are preferable because they can easily conduct heat to the whole substrate and accordingly can suppress a local temperature rise in the display panel. The thickness of a substrate using a metal material or an alloy material is preferably greater than or equal to 10 μm and less than or equal to 200 μm, further preferably greater than or equal to 20 μm and less than or equal to 50 μm.

There is no particular limitation on a material of the metal substrate or the alloy substrate, but it is preferable to use, for example, aluminum, copper, nickel, or a metal alloy such as an aluminum alloy or stainless steel. Examples of a material for a semiconductor substrate include silicon.

Furthermore, when a material with high thermal emissivity is used for the substrate, increase of the surface temperature of the display panel can be suppressed, and breakage or a decrease in reliability of the display panel can be suppressed. For example, the substrate may have a stacked-layer structure of a metal substrate and a layer with high thermal emissivity (the layer can be formed using a metal oxide or a ceramic material, for example).

Examples of materials having flexibility and a light-transmitting property include polyester resins such as PET and PEN, a polyacrylonitrile resin, an acrylic resin, a polyimide resin, a polymethyl methacrylate resin, a PC resin, a PES resin, polyamide resins (such as nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a PTFE resin, and an ABS resin. In particular, a material with a low coefficient of linear expansion is preferred, and for example, a polyamide imide resin, a polyimide resin, a polyamide resin, or PET can be suitably used. A substrate in which a fibrous body is impregnated with a resin, a substrate whose linear thermal expansion coefficient is reduced by mixing an inorganic filler with a resin, or the like can also be used.

The flexible substrate may have a stacked-layer structure in which at least one of a hard coat layer (e.g., a silicon nitride layer) by which a surface of the device is protected from damage, a layer for dispersing pressure (e.g., an aramid resin layer), and the like is stacked over a layer of any of the above-mentioned materials. A substrate that can be used as the protective substrate 132 may be used.

When a glass layer is used for the flexible substrate, a barrier property against water and oxygen can be improved and thus a highly reliable display panel can be provided.

For the bonding layer, various curable adhesives such as a photocurable adhesive (e.g., an ultraviolet curable adhesive), a reactive curable adhesive, a thermosetting adhesive, and an anaerobic adhesive can be used. Alternatively, an adhesive sheet or the like may be used.

Furthermore, the bonding layer may include a drying agent. For example, it is possible to use a substance that adsorbs moisture by chemical adsorption, such as oxide of an alkaline earth metal (e.g., calcium oxide or barium oxide). Alternatively, it is possible to use a substance that adsorbs moisture by physical adsorption, such as zeolite or silica gel. The drying agent is preferably included because entry of impurities such as moisture into the functional element can be suppressed, thereby improving the reliability of the display panel.

When a filler with a high refractive index or a light scattering member is contained in the bonding layer, the efficiency of light extraction from the light-emitting element can be improved. For example, titanium oxide, barium oxide, zeolite, or zirconium can be used.

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used. Any of a variety of display elements can be used in the display panel of one embodiment of the present invention. For example, a liquid crystal element, an electrophoretic element, a display element using MEMS, or the like may be used.

The light-emitting element may be a top-emission, bottom-emission, or dual-emission light-emitting element. A conductive film that transmits visible light is used as the electrode through which light is extracted. A conductive film that reflects visible light is preferably used as the electrode through which light is not extracted.

The structure of the transistors in the display panel is not particularly limited. For example, a planar transistor, a forward staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case deterioration of the transistor characteristics can be suppressed.

A semiconductor material used for the transistor is not particularly limited, and for example, a Group 14 element, a compound semiconductor, or an oxide semiconductor can be used. Typically, a semiconductor containing silicon, a semiconductor containing gallium arsenide, an oxide semiconductor containing indium, or the like can be used.

An oxide semiconductor is preferably used as a semiconductor where a channel of the transistor is formed. In particular, an oxide semiconductor having a wider band gap than silicon is preferably used. A semiconductor material having a wider band gap and a lower carrier density than silicon is preferably used because off-state current of the transistor can be reduced.

For example, the oxide semiconductor preferably contains at least indium (In) or zinc (Zn). Further preferably, the oxide semiconductor contains an oxide represented by an In-M-Zn oxide (M is a metal such as Al, Ti, Ga, Ge, Y, Zr, Sn, La, Ce, Hf, or Nd).

An organic insulating material or an inorganic insulating material can be used for the insulating layers included in the display panel. Examples of resins include an acrylic resin, an epoxy resin, a polyimide resin, a polyamide resin, a polyimide-amide resin, a siloxane resin, a benzocyclobutene-based resin, and a phenol resin. Examples of inorganic insulating films include a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

The conductive layers included in the display panel can each have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a light-transmitting conductive material such as indium oxide, ITO, indium oxide containing tungsten, indium zinc oxide containing tungsten, indium oxide containing titanium, ITO containing titanium, indium zinc oxide, ZnO, ZnO to which gallium is added, or indium tin oxide containing silicon may be used. Alternatively, a semiconductor such as an oxide semiconductor or polycrystalline silicon whose resistance is lowered by containing an impurity element or the like, or silicide such as nickel silicide may be used. A film including graphene may be used as well. The film including graphene can be formed, for example, by reducing a film containing graphene oxide. A semiconductor such as an oxide semiconductor containing an impurity element may be used. Alternatively, the conductive layers may be formed using a conductive paste of silver, carbon, copper, or the like or a conductive polymer such as a polythiophene. A conductive paste is preferable because it is inexpensive. A conductive polymer is preferable because it is easily applied.

Figure 15:
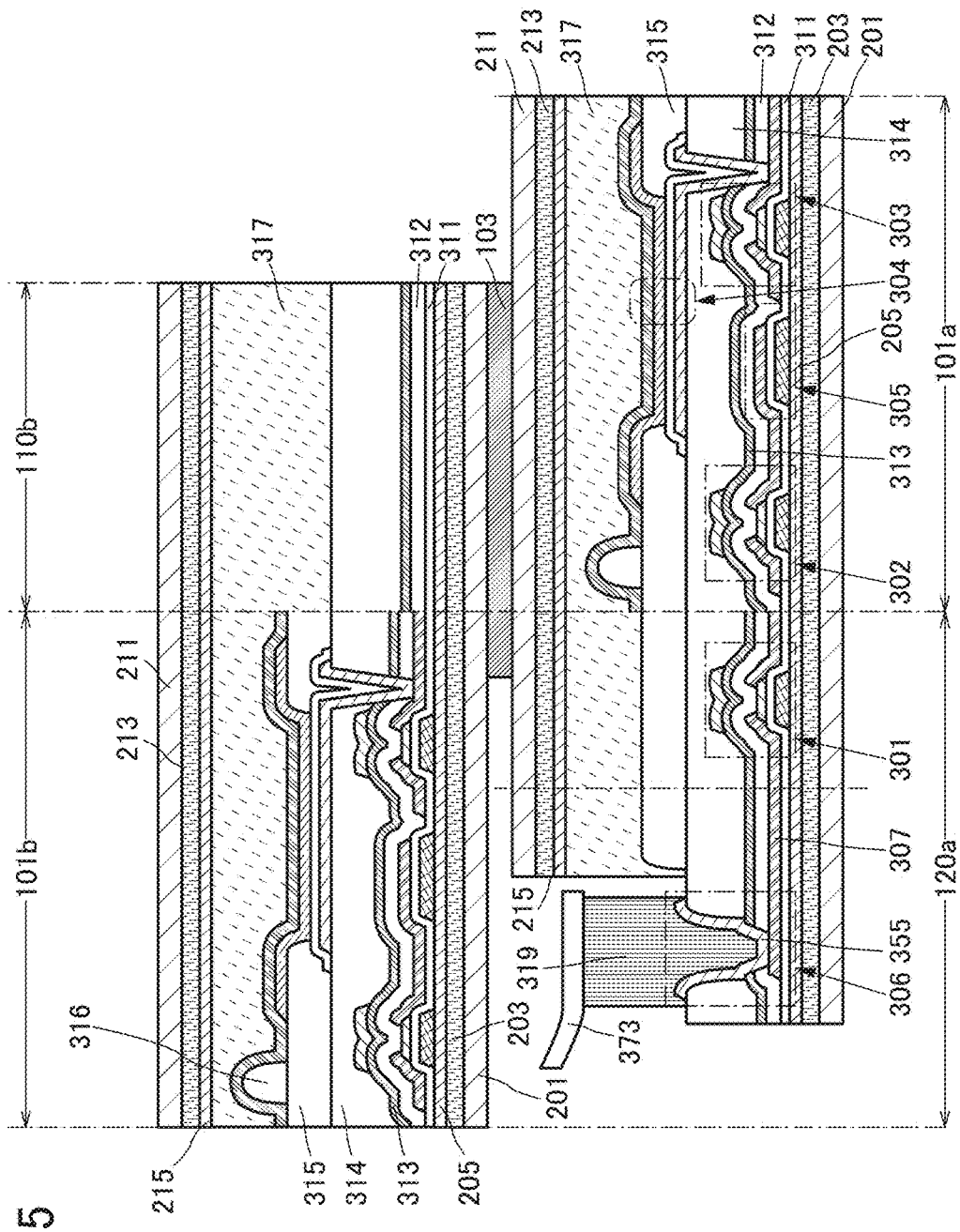
FIG. 15 is a cross-sectional view illustrating an example of a display device.

FIG. 15 is an example of a cross-sectional view of a display device including two display panels 370 illustrated in FIG. 14C that overlap with each other.

FIG. 15 illustrates the display region 101a (corresponding to the display portion 381 in FIG. 14C) and the region 120a blocking visible light (corresponding to the driver circuit portion 382 and the like in FIG. 14C) of a lower display panel, and the display region 101b (corresponding to the display portion 381 in FIG. 14C) and the region 110b transmitting visible light (corresponding to the region 110 transmitting visible light in FIG. 14C) of an upper display panel.

In the display device illustrated in FIG. 15, the display panel positioned on the display surface side (upper side) includes the region 110b transmitting visible light adjacent to the display region 101b. The display region 101a of the lower display panel and the region 110b transmitting visible light of the upper display panel overlap with each other. Thus, a non-display region between the display regions of the two display panels overlapping with each other can be reduced or even removed. Accordingly, a large display device in which a seam between display panels is less likely to be noticed by a user can be obtained.

The display device illustrated in FIG. 15 includes the light-transmitting layer 103 having a refractive index higher than that of air and transmitting visible light between the display region 101a and the region 110b transmitting visible light. In that case, air can be prevented from entering between the display region 101a and the region 110b transmitting visible light, so that the interface reflection due to a difference in refractive index can be reduced. In addition, display unevenness or luminance unevenness of the display device can be suppressed.

The light-transmitting layer 103 may overlap with the entire surface of the substrate 211 of the lower display panel or that of the substrate 201 of the upper display panel, or may overlap with only the display region 101a and the region 110b transmitting visible light. In addition, the light-transmitting layer 103 may overlap with the region 120a blocking visible light.

MODIFICATION EXAMPLE

Figure 16:
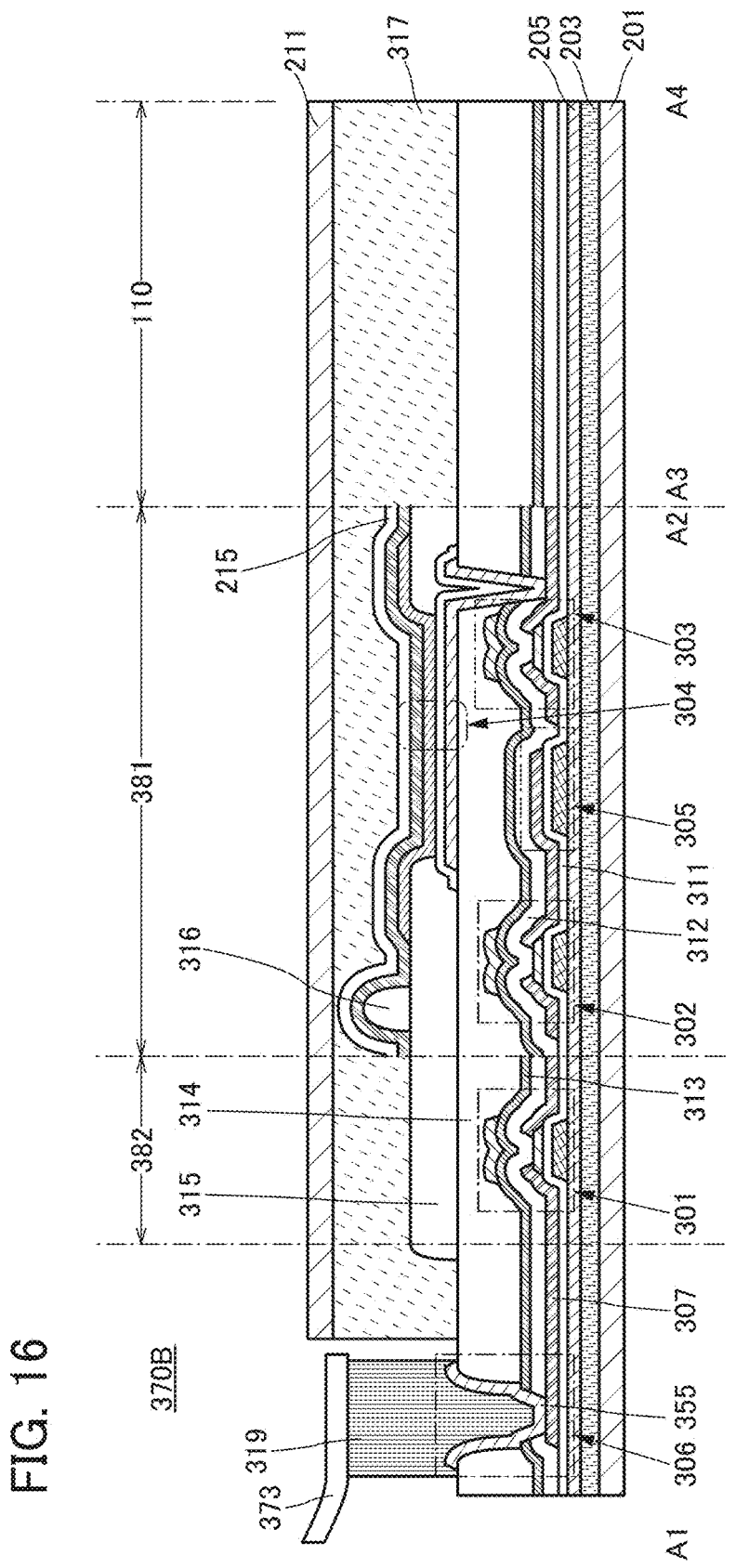
FIG. 16 is a cross-sectional view illustrating an example of a display panel.

FIG. 16 is a cross-sectional view of a display panel 370B employing a separate coloring method and having a top-emission structure.

The display panel 370B is different from the display panel 370A in that the insulating layer 215 is provided in contact with the light-emitting element 304 and that the substrate 211 is bonded with not the bonding layer 213 but the bonding layer 317.

In manufacturing the display panel 370A, the insulating layer 215 formed over a formation substrate is transferred to the substrate 201. In contrast, in manufacturing the display panel 370B, the insulating layer 215 is directly formed on the light-emitting element 304. This structure eliminates the need for the peeling process, which simplifies the manufacturing process of the display panel.

<Example 2 of Cross-Sectional Structure of Display Panel>

Figure 17:
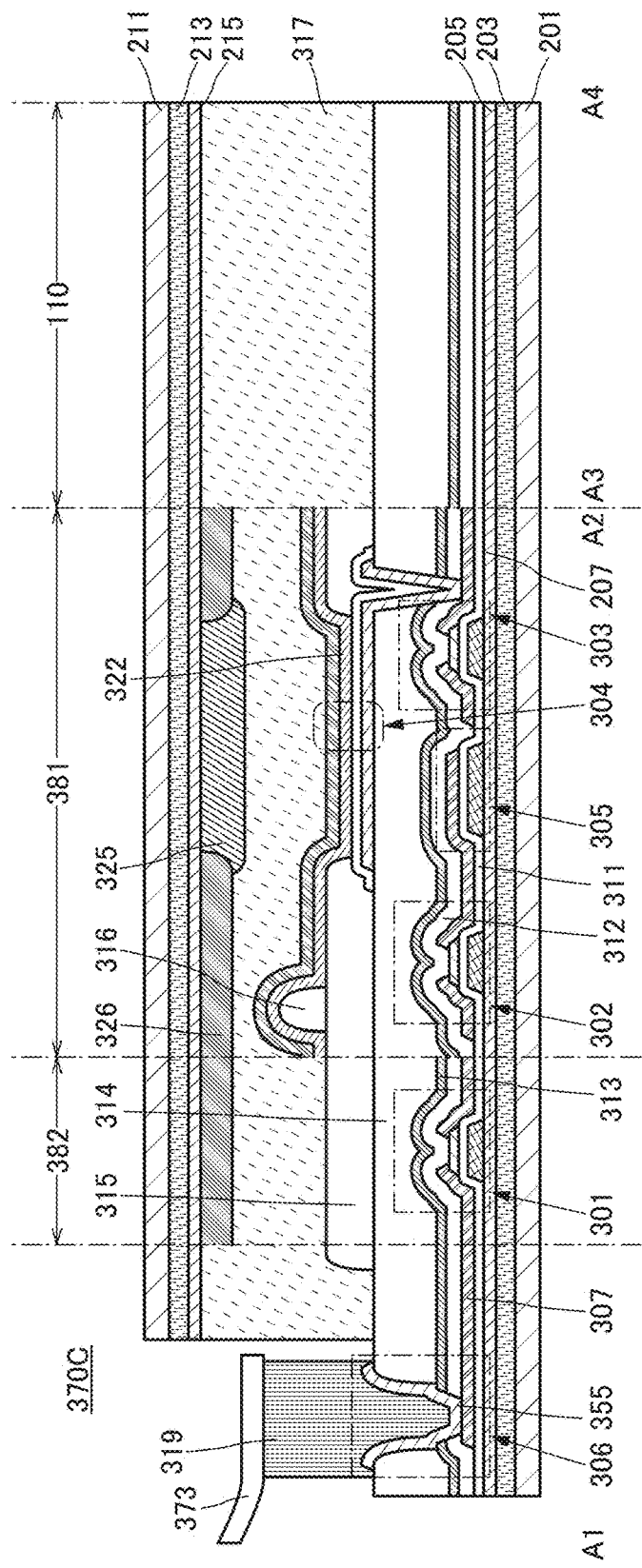
FIG. 17 is a cross-sectional view illustrating an example of a display panel.
Figure 18:
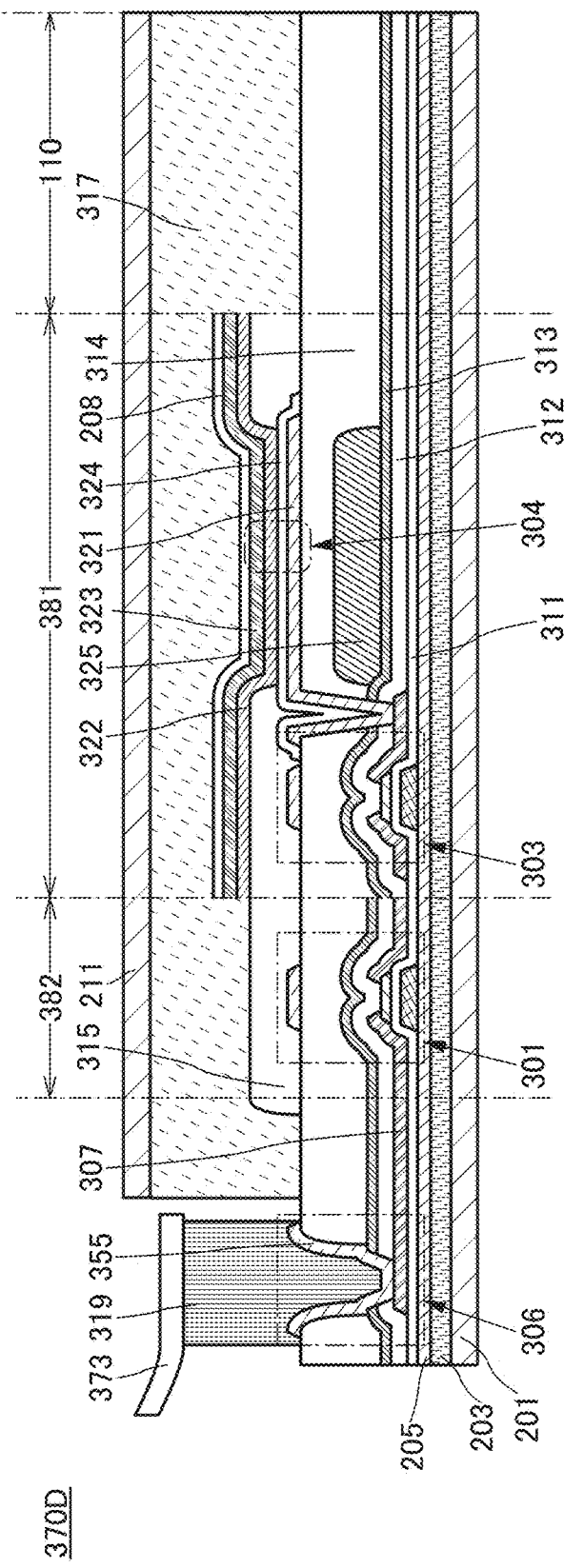
FIG. 18 is a cross-sectional view illustrating an example of a display panel.

FIG. 17 is a cross-sectional view of a display panel 370C employing a color filter method and having a top-emission structure. FIG. 18 is a cross-sectional view of a display panel 370D employing a color filter method and having a bottom-emission structure.

The display panel 370C is different from the display panel 370A in that the EL layer 322 is shared by a plurality of light-emitting elements, each transistor does not include a back gate, and a coloring layer 325 and a light-blocking layer 326 are provided.

The display panel 370D is different from the display panel 370A in that the EL layer 322 is shared by a plurality of light-emitting elements, each transistor does not include a back gate, and the coloring layer 325 is provided.

In each of the display panel 370C and the display panel 370D, the light-emitting element 304 emits light to the coloring layer 325 side.

Owing to the combination of a color filter (the coloring layer 325) and a microcavity structure (the optical adjustment layer 324), light with high color purity can be extracted from the display panel. The thickness of the optical adjustment layer 324 is varied depending on the color of the pixel.

The coloring layer is a colored layer that transmits light in a specific wavelength range. For example, a color filter that transmits light in a specific wavelength range, such as red, green, blue, or yellow light, can be used. Examples of materials that can be used for the coloring layer include a metal material, a resin material, and a resin material containing a pigment or dye.

The light-blocking layer is provided between the adjacent coloring layers. The light-blocking layer blocks light emitted from an adjacent light-emitting element to inhibit color mixture between adjacent light-emitting elements. Here, the coloring layer is provided such that its end portion overlaps with the light-blocking layer, whereby light leakage can be reduced. For the light-blocking layer, a material that blocks light from the light-emitting element can be used; for example, a black matrix can be formed using a metal material or a resin material containing a pigment or dye. Note that it is preferable to provide the light-blocking layer in a region other than a pixel portion, such as a driver circuit, in which case undesired leakage of guided light or the like can be suppressed.

A display panel may include an overcoat. The overcoat can prevent impurities and the like contained in the coloring layer 325 from being diffused into the light-emitting element 304. The overcoat is formed using a material that transmits light emitted from the light-emitting element 304. For example, it is possible to use an inorganic insulating film such as a silicon nitride film or a silicon oxide film, an organic insulating film such as an acrylic film or a polyimide film, or a stacked layer of an organic insulating film and an inorganic insulating film.

<Touch Panel>

In one embodiment of the present invention, a display panel provided with a touch sensor (also referred to as an input/output unit or a touch panel) can be manufactured.

There is no particular limitation on a sensor element included in the touch panel of one embodiment of the present invention. Note that a variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element is described as an example.

Examples of the capacitive sensor element include a surface capacitive sensor element and a projected capacitive sensor element. Examples of the projected capacitive sensor element include a self-capacitive sensor element and a mutual capacitive sensor element. The use of a mutual capacitive sensor element is preferable because multiple points can be sensed simultaneously.

The touch panel of one embodiment of the present invention can have any of a variety of structures, including a structure in which a display panel and a sensor element that are separately formed are attached to each other and a structure in which an electrode and the like included in a sensor element are provided on one or both of a substrate supporting a display element and a counter substrate.

FIG. 19A is a schematic perspective view of a touch panel 300. FIG. 19B is a developed view of the schematic perspective view of FIG. 19A. Note that only typical components are illustrated for simplicity. In FIG. 19B, some components (such as a substrate 261 and the substrate 211) are illustrated only in dashed outline.

The touch panel 300 includes an input device 310 and the display panel 370, which are provided to overlap with each other. The touch panel 300 includes the region 110 transmitting visible light. The region 110 transmitting visible light is adjacent to the display portion 381 and provided along two sides of the display portion 381.

The input device 310 includes the substrate 261, an electrode 331, an electrode 332, a plurality of wirings 341, and a plurality of wirings 342. An FPC 350 is electrically connected to each of the plurality of wirings 341 and the plurality of wirings 342. The FPC 350 is provided with an IC 351.

The display panel 370 includes the substrate 201 and the substrate 211 that are provided so as to face each other. The display panel 370 includes the display portion 381 and the driver circuit portion 382. A wiring 383 and the like are provided over the substrate 201. The FPC 373 is electrically connected to the wiring 383. The FPC 373 is provided with an IC 374.

The wiring 383 has a function of supplying a signal and power to the display portion 381 and the driver circuit portion 382. The signal and power are each input to the wiring 383 from the outside or the IC 374 through the FPC 373.

Figure 20:
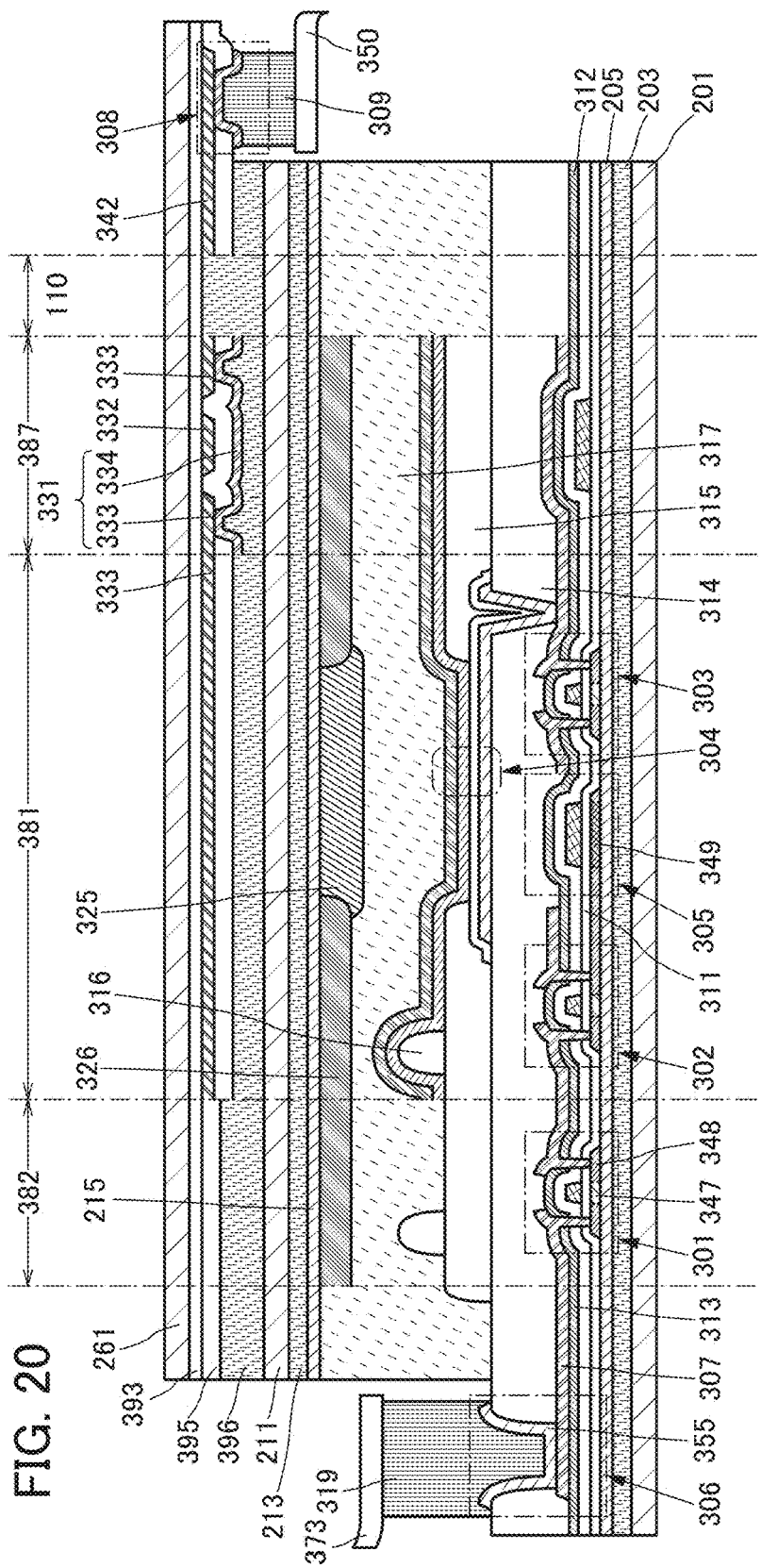
FIG. 20 is a cross-sectional view illustrating an example of a touch panel.

FIG. 20 shows an example of a cross-sectional view of the touch panel 300. FIG. 20 illustrates cross-sectional structures of the display portion 381, the driver circuit portion 382, the region 110 transmitting visible light, the region including the FPC 373, the region including the FPC 350, and the like. Furthermore, FIG. 20 illustrates a cross-sectional structure of a crossing portion 387 where a wiring formed by processing a conductive layer used for forming the gate of the transistor and a wiring formed by processing a conductive layer used for forming the source and the drain of the transistor cross each other.

The substrate 201 and the substrate 211 are attached to each other with the bonding layer 317. The substrate 211 and the substrate 261 are attached to each other with a bonding layer 396. Here, the layers from the substrate 201 to the substrate 211 correspond to the display panel 370. Furthermore, the layers from the substrate 261 to an electrode 334 correspond to the input device 310. In other words, the bonding layer 396 attaches the display panel 370 and the input device 310 to each other. Alternatively, the layers from the substrate 201 to the insulating layer 215 correspond to the display panel 370. Furthermore, the layers from the substrate 261 to the substrate 211 correspond to the input device 310. In other words, the bonding layer 213 attaches the display panel 370 and the input device 310 to each other.

The display panel 370 in FIG. 20 is different from the display panel 370A in FIG. 14C in the structures of the transistors 301, 302, and 303 and the capacitor 305.

Each transistor includes a gate, the gate insulating layer 311, a semiconductor layer, a source, and a drain. The gate and the semiconductor layer overlap with each other with the gate insulating layer 311 provided therebetween. The semiconductor layer may include low-resistance regions 348. The low-resistance regions 348 function as the source and drain of the transistor.

The conductive layer over the insulating layer 313 functions as a lead wiring. The conductive layer is electrically connected to the region 348 through an opening provided in the insulating layer 313, the insulating layer 312, and the gate insulating layer 311.

In FIG. 20, the capacitor 305 has a stacked-layer structure that includes a layer formed by processing a semiconductor layer used for forming the above-described semiconductor layer, the gate insulating layer 311, and a layer formed by processing a conductive layer used for forming the gate. Here, part of the semiconductor layer of the capacitor 305 preferably has a region 349 having a higher conductivity than a region 347 where the channel of the transistor is formed.

The region 348 and the region 349 each can be a region containing more impurities than the region 347 where the channel of the transistor is formed, a region with a high carrier concentration, a region with low crystallinity, or the like.

On the substrate 211 side of the substrate 261, the electrode 331 and the electrode 332 are provided. An example where the electrode 331 includes an electrode 333 and the electrode 334 is described here. As illustrated in the crossing portion 387 in FIG. 20, the electrodes 332 and 333 are formed on the same plane. An insulating layer 395 is provided to cover the electrode 332 and the electrode 333. The electrode 334 electrically connects two electrodes 333, between which the electrode 332 is provided, through openings formed in the insulating layer 395.

In a region near the end portion of the substrate 261, a connection portion 308 is provided. The connection portion 308 has a stack of a wiring 342 and a conductive layer formed by processing a conductive layer used for forming the electrode 334. The connection portion 308 is electrically connected to the FPC 350 through a connector 309.

The input device 310 has a structure in which the reflection of light in the region 110 transmitting visible light is suppressed. The insulating layer 395 is provided in the display portion 381 and is not provided in the region 110 transmitting visible light.

The region 110 transmitting visible light of the touch panel 300 includes the substrate 201, the bonding layer 203, the insulating layer 205, the gate insulating layer 311, the insulating layer 312, the insulating layer 314, the bonding layer 317, the insulating layer 215, the bonding layer 213, the substrate 211, the bonding layer 396, the insulating layer 393, and the substrate 261 that are stacked in this order.

Even in the case where two or more touch panels 300 overlap with each other, an area in which a plurality of touch panels 300 overlap with each other (overlapping area) is less likely to be noticed by a user of the touch panel. In addition, the difference in the luminance of display on the display portion 381 between a portion seen through the region 110 transmitting visible light and a portion seen not through the region can be small.

FIGS. 21A and 21B are schematic perspective views of a touch panel 320.

The touch panel 320 includes the region 110 transmitting visible light. The region 110 transmitting visible light is adjacent to the display portion 381 and provided along two sides of the display portion 381.

In FIGS. 21A and 21B, the substrate 211 of a display panel 379 is provided with an input device 318. The wiring 341, the wiring 342, and the like of the input device 318 are electrically connected to the FPC 350 provided for the display panel 379.

With the above structure, the FPC connected to the touch panel 320 can be provided only on one substrate side (on the substrate 201 side in this embodiment). FIGS. 21A and 21B illustrate the structure in which the touch panel 320 is provided with two FPCs. The touch panel 320 is not necessarily provided with a plurality of FPCs. When the touch panel 320 is provided with one FPC and signals are supplied to both the display panel 379 and the input device 318, the structure can be simplified.

The IC 374 has a function of driving the display panel 379. The IC 351 has a function of driving the input device 318.

This embodiment can be combined with any of other embodiments as appropriate.

Embodiment 4

In this embodiment, electronic devices and lighting devices of embodiments of the present invention are described with reference to drawings.

Examples of electronic devices include a television set, a monitor of a computer or the like, a digital camera, a digital video camera, a digital photo frame, a mobile phone (also referred to as a mobile phone device), a portable game machine, a portable information terminal, an audio reproducing device, a large game machine such as a pinball machine, and the like.

The electronic device or the lighting device of one embodiment of the present invention has flexibility and therefore can be incorporated along a curved inside/outside wall surface of a house or a building or a curved interior/exterior surface of a car.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes the antenna and a secondary battery, the antenna may be used for contactless power transmission.

In the display device of one embodiment of the present invention, the area of the display region can be increased unlimitedly by increasing the number of display panels. Thus, the display device of one embodiment of the present invention can be favorably used for digital signage, a PID, or the like. Furthermore, the shape of the display region of the display device of one embodiment of the present invention can be changed variously when the arrangement of the display panels is changed.

Figure 22A:
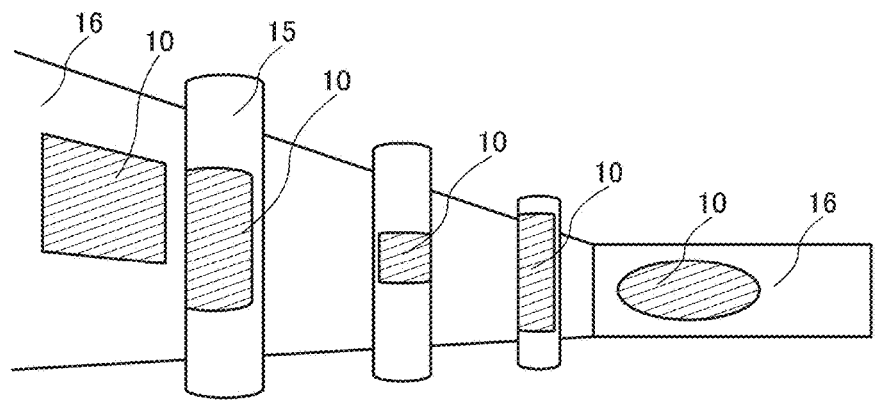
FIGS. 22A to 22F illustrate examples of electronic devices and a lighting device.

FIG. 22A illustrates an example in which a display device 10 of one embodiment of the present invention is provided for each of pillars 15 and walls 16. A flexible display panel is used as a display panel included in the display device 10, whereby the display device 10 can be placed along a curved surface.

Here, in particular, in the case where the display device of one embodiment of the present invention is used in digital signage or a PID, it is preferable to use a touch panel in a display panel because a device with such a structure does not just display a still or moving image on a display region, but can be operated by viewers intuitively. Alternatively, in the case where the display device of one embodiment of the present invention is used for providing information such as route information or traffic information, usability can be enhanced by intuitive operation. In the case of providing the display device on the walls of buildings, public facilities, or the like, a touch panel does not need to be used in the display panel.

FIGS. 22B to 22E illustrate examples of an electronic device including a display portion 7000 with a curved surface. The display surface of the display portion 7000 is bent, and images can be displayed on the bent display surface. The display portion 7000 may be flexible.

The display portion 7000 of each of the electronic devices illustrated in FIGS. 22B to 22E can be formed using the display device of one embodiment of the present invention.

Figure 22B:
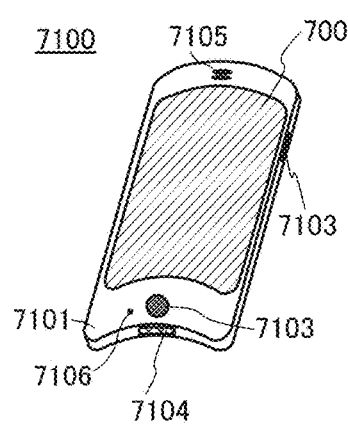

FIG. 22B illustrates an example of a mobile phone. A mobile phone 7100 includes a housing 7101, the display portion 7000, operation buttons 7103, an external connection port 7104, a speaker 7105, a microphone 7106, and the like.

The mobile phone 7100 illustrated in FIG. 22B includes a touch sensor in the display portion 7000. Moreover, operations such as making a call and inputting a letter can be performed by touch on the display portion 7000 with a finger, a stylus, or the like.

With the operation buttons 7103, the power can be turned on or off. In addition, types of images displayed on the display portion 7000 can be switched; for example, switching images from a mail creation screen to a main menu screen is performed with the operation button 7103.

Figure 22C:
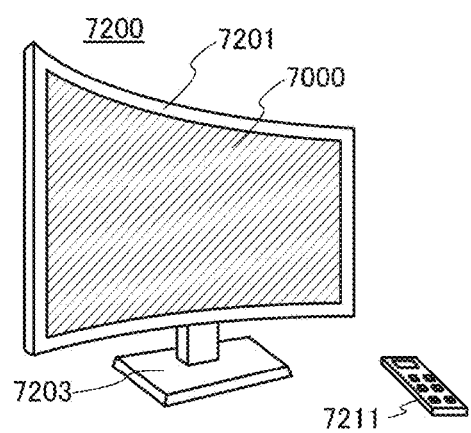

FIG. 22C illustrates an example of a television set. In a television set 7200, the display portion 7000 is incorporated into a housing 7201. Here, the housing 7201 is supported by a stand 7203.

The television set 7200 illustrated in FIG. 22C can be operated with an operation switch of the housing 7201 or a separate remote controller 7211. Furthermore, the display portion 7000 may include a touch sensor, and can be operated by touch on the display portion 7000 with a finger or the like. Furthermore, the remote controller 7211 may be provided with a display portion for displaying data output from the remote controller 7211. With operation keys or a touch panel of the remote controller 7211, channels and volume can be controlled and images displayed on the display portion 7000 can be controlled.

Note that the television set 7200 is provided with a receiver, a modem, or the like. A general television broadcast can be received with the receiver. Furthermore, when the television set is connected to a communication network with or without wires via modem, one-way (from a transmitter to a receiver) or two-way (between a transmitter and a receiver or between receivers) data communication can be performed.

Figure 22D:
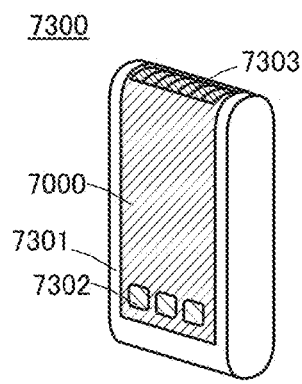

FIG. 22D illustrates an example of a portable information terminal. A portable information terminal 7300 includes a housing 7301 and the display portion 7000. The portable information terminal may also include an operation button, an external connection port, a speaker, a microphone, an antenna, a battery, or the like. The display portion 7000 is provided with a touch sensor. An operation of the portable information terminal 7300 can be performed by touching the display portion 7000 with a finger, a stylus, or the like.

Figure 22E:
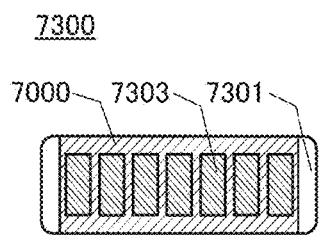

FIG. 22D is a perspective view of the portable information terminal 7300. FIG. 22E is a top view of the portable information terminal 7300.

Each of the portable information terminals illustrated in this embodiment functions as, for example, one or more of a telephone set, a notebook, and an information browsing system. Specifically, each of the portable information terminals can be used as a smartphone. Each of the portable information terminals illustrated in this embodiment is capable of executing a variety of applications such as mobile phone calls, e-mailing, reading and editing texts, music reproduction, Internet communication, and a computer game, for example.

The portable information terminal 7300 can display letters or an image on its plurality of surfaces. For example, as illustrated in FIG. 22D, three operation buttons 7302 can be displayed on one surface, and information 7303 indicated by a rectangle can be displayed on another surface. FIGS. 22D and 22E illustrate an example in which information is displayed at the top of the portable information terminal. Alternatively, information may be displayed on the side of the portable information terminal. Information may also be displayed on three or more surfaces of the portable information terminal.

Examples of the information include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed in place of the information.

For example, a user of the portable information terminal 7300 can see the display (here, the information 7303) with the portable information terminal 7300 put in a breast pocket of his/her clothes.

Specifically, a caller's phone number, name, or the like of an incoming call is displayed in a position that can be seen from above the portable information terminal 7300. Thus, the user can see the display without taking out the portable information terminal 7300 from the pocket and decide whether to answer the call.

Figure 22F:
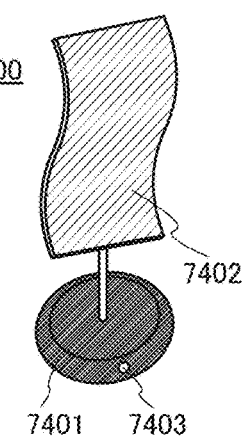

FIG. 22F illustrates an example of a lighting device having a curved light-emitting portion.

The light-emitting portion included in the lighting device illustrated in FIG. 22F can be manufactured using the display device of one embodiment of the present invention.

A lighting device 7400 illustrated in FIG. 22F includes a light-emitting portion 7402 having a wave-shaped light-emitting surface, which is a good-design lighting device.

The light-emitting portion included in the lighting device 7400 may be flexible. The light-emitting portion may be fixed on a plastic member, a movable frame, or the like so that a light-emitting surface of the light-emitting portion can be bent freely depending on the intended use.

The lighting device 7400 includes a stage 7401 provided with an operation switch 7403 and a light-emitting portion supported by the stage 7401.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a depressed shape, whereby a particular region can be brightly illuminated, or the light-emitting surface is curved to have a projecting shape, whereby a whole room can be brightly illuminated.

FIGS. 23A1, 23A2, and 23B to 23I illustrate examples of portable information terminals including a display portion 7001 having flexibility.

The display portion 7001 is manufactured using the display device of one embodiment of the present invention. For example, a display device including a display panel that can be bent with a radius of curvature of greater than or equal to 0.01 mm and less than or equal to 150 mm can be used. The display portion 7001 may include a touch sensor so that the portable information terminal can be operated by touching the display portion 7001 with a finger or the like.

FIGS. 23A1 and 23A2 are a perspective view and a side view, respectively, illustrating an example of the portable information terminal. A portable information terminal 7500 includes a housing 7501, the display portion 7001, a display portion tab 7502, operation buttons 7503, and the like.

The portable information terminal 7500 includes a rolled flexible display portion 7001 in the housing 7501.

The portable information terminal 7500 can receive a video signal with a control portion incorporated therein and can display the received video on the display portion 7001. The portable information terminal 7500 incorporates a battery. A terminal portion for connecting a connector may be included in the housing 7501 so that a video signal or power can be directly supplied from the outside with a wiring.

By pressing the operation buttons 7503, power on/off, switching of displayed images, and the like can be performed. Although FIGS. 23A1, 23A2, and 23B illustrate an example where the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

FIG. 23B illustrates the portable information terminal 7500 in a state where the display portion 7001 is pulled out. Images can be displayed on the display portion 7001 in this state. The display portion 7001 can be extracted with the use of the display portion tab 7502. In addition, the portable information terminal 7500 may perform different displays in the state where part of the display portion 7001 is rolled as illustrated in FIG. 23A1 and in the state where the display portion 7001 is pulled out as illustrated in FIG. 23B. For example, in the state illustrated in FIG. 23A1, the rolled portion of the display portion 7001 is put in a non-display state, which results in a reduction in power consumption of the portable information terminal 7500.

Note that a reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

FIGS. 23C to 23E illustrate an example of a foldable portable information terminal. FIG. 23C illustrates a portable information terminal 7600 that is opened. FIG. 23D illustrates the portable information terminal 7600 that is being opened or being folded. FIG. 23E illustrates the portable information terminal 7600 that is folded. The portable information terminal 7600 is highly portable when folded, and is highly browsable when opened because of a seamless large display area.

A display portion 7001 is supported by three housings 7601 joined together by hinges 7602. By folding the portable information terminal 7600 at a connection portion between two housings 7601 with the hinges 7602, the portable information terminal 7600 can be reversibly changed in shape from an opened state to a folded state.

FIGS. 23F and 23G illustrate an example of a foldable portable information terminal. FIG. 23F illustrates a portable information terminal 7650 that is folded so that the display portion 7001 is on the inside. FIG. 23G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby contamination of or damage to the display portion 7001 can be suppressed.

FIG. 23H illustrates an example of a flexible portable information terminal. A portable information terminal 7700 includes a housing 7701 and the display portion 7001. In addition, the portable information terminal 7700 may include buttons 7703*a* and 7703*b* that serve as input means, speakers 7704*a* and 7704*b* that serve as sound output means, an external connection port 7705, a microphone 7706, or the like. A flexible battery 7709 can be mounted on the portable information terminal 7700. The battery 7709 may overlap with the display portion 7001, for example.

The housing 7701, the display portion 7001, and the battery 7709 are flexible. Thus, it is easy to curve the portable information terminal 7700 into a desired shape or to twist the portable information terminal 7700. For example, the portable information terminal 7700 can be curved so that the display portion 7001 is on the inside or in the outside. The portable information terminal 7700 can be used in a rolled state. Since the housing 7701 and the display portion 7001 can be transformed freely in this manner, the portable information terminal 7700 is less likely to be broken even when the portable information terminal 7700 falls down or external stress is applied to the portable information terminal 7700.

The portable information terminal 7700 can be used effectively in various situations because the portable information terminal 7700 is lightweight. For example, the portable information terminal 7700 can be used in the state where the upper portion of the housing 7701 is suspended by a clip or the like, or in the state where the housing 7701 is fixed to a wall by magnets or the like.

FIG. 23I illustrates an example of a wrist-watch-type portable information terminal. A portable information terminal 7800 includes a band 7801, the display portion 7001, an input-output terminal 7802, operation buttons 7803, or the like. The band 7801 has a function of a housing. A flexible battery 7805 can be mounted on the portable information terminal 7800. The battery 7805 may overlap with the display portion 7001 or the band 7801, for example.

The band 7801, the display portion 7001, and the battery 7805 have flexibility. Thus, the portable information terminal 7800 can be easily curved to have a desired shape.

With the operation button 7803, a variety of functions such as time setting, on/off of the power, on/off of wireless communication, setting and cancellation of silent mode, and setting and cancellation of power saving mode can be performed. For example, the functions of the operation button 7803 can be set freely by the operating system incorporated in the portable information terminal 7800.

By touching an icon 7804 displayed on the display portion 7001 with a finger or the like, application can be started.

The portable information terminal 7800 can employ near field communication that is a communication method based on an existing communication standard. In that case, for example, mutual communication between the portable information terminal 7800 and a headset capable of wireless communication can be performed, and thus hands-free calling is possible.

The portable information terminal 7800 may include the input-output terminal 7802. In the case where the input-output terminal 7802 is included, data can be directly transmitted to and received from another information terminal via a connector. Charging through the input-output terminal 7802 is also possible. Note that charging of the portable information terminal described as an example in this embodiment can be performed by non-contact power transmission without using the input-output terminal.

Figure 24A:
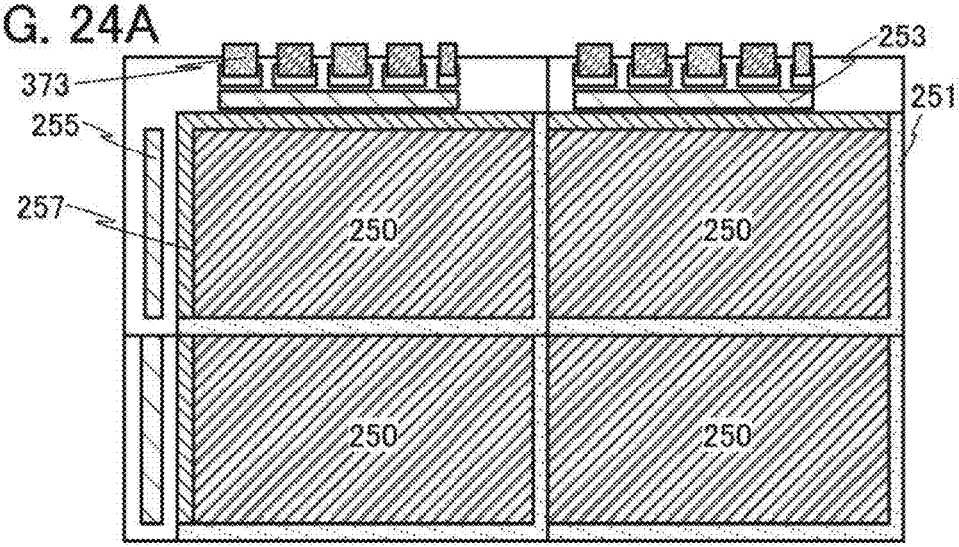
FIGS. 24A and 24B illustrate an example of a display device.
Figure 24B:
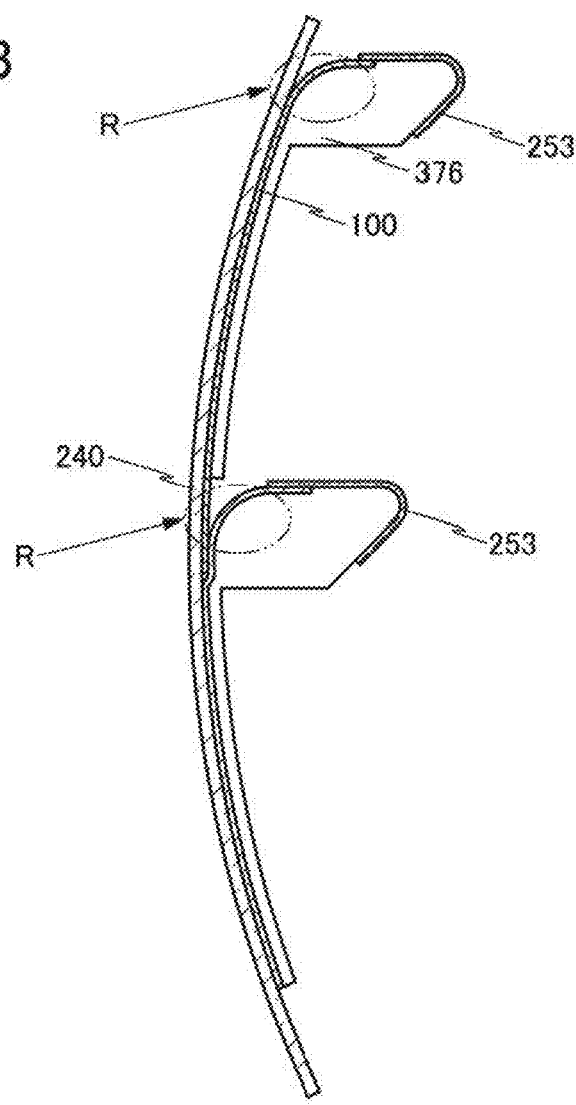

Next, a display device of one embodiment of the present invention that can be used for a display portion having a curved surface is described. FIGS. 24A and 24B are a top view and a side view illustrating a display device that includes four display panels arranged in a 2×2 matrix.

The display panels illustrated in FIG. 24A each include a light-emitting portion 250, a demultiplexer 253 functioning as a source driver, a scan driver 255, and the like. Two sides of the light-emitting portion 250 are in contact with a region 251 transmitting visible light. A lead wiring 257 is provided along the other two sides.

The display device illustrated in FIGS. 24A and 24B is formed by overlapping a plurality of display panels so that a non-display region between display regions is small. A light-transmitting layer (e.g., an adhesive) may be provided between the region 251 transmitting visible light of an upper display panel and the light-emitting portion 250 of a lower display panel.

A component that blocks visible light such as a lead wiring or a driver is not provided at all from an end portion of the light-emitting portion 250 to an end portion of the display panel along two sides of the display panel, and the region along two sides serves as the region 251 transmitting visible light. The thickness of the region 251 transmitting visible light (which can be regarded as the thickness of one display panel) is very small (for example, the thickness can be greater than or equal to 100 μm and less than or equal to 1000 μm). Therefore, although the display device in this embodiment has a region in which at most four display panels overlap with each other, a step formed on the display surface side is extremely small; thus, a seam hardly stands out.

The four display panels have flexibility. As illustrated in FIG. 24B, the light-emitting portion 250 of the display panel is gently curved. The region near the FPC 373, which is illustrated as a region R in FIG. 24B, is curved with a smaller radius of curvature than the light-emitting portion 250. As a result, the FPC 373 can be placed without physical interference with the rear surface of the upper display panel. In this way, another display panel can be provided on four sides of the display panel, whereby a large-sized display device is easily realized.

The radius of curvature of the region near the FPC 373 (i.e., the region where the light-emitting portion 250 is not provided) can be, for example, greater than or equal to 1 mm and less than or equal to 100 mm. The radius of curvature of the light-emitting portion 250 can be larger than that of the region near the FPC 373 and smaller than or equal to 10000 mm, and may be larger than or equal to 10 mm and smaller than or equal to 10000 mm, for example.

The display panel 100 in FIG. 24B is attached to one plane of a support 376 (e.g., a metal plate). The support 376 has a plurality of curved surfaces, and the display panel 100 is curved along the curved surfaces. The display panel 100 has a portion extending from the support 376. The portion overlaps with an adjacent display panel 100. A driver circuit or the like may be fixed on the other plane of the support 376. In that case, the display panel 100 is electrically connected to the driver circuit with the FPC 373.

The optical member 240 is preferably provided on the display surface side of the display panel as illustrated in FIG. 24B. The optical member 240 is preferably fixed on a housing or the like with the optical member 240 and the display panel being in intimate contact with each other. The optical member 240 consists of, for example, a support, a circularly polarizing plate, and an anti-reflection member from the display panel side.

This embodiment can be combined with any of other embodiments as appropriate.

Example 1

Figure 25:
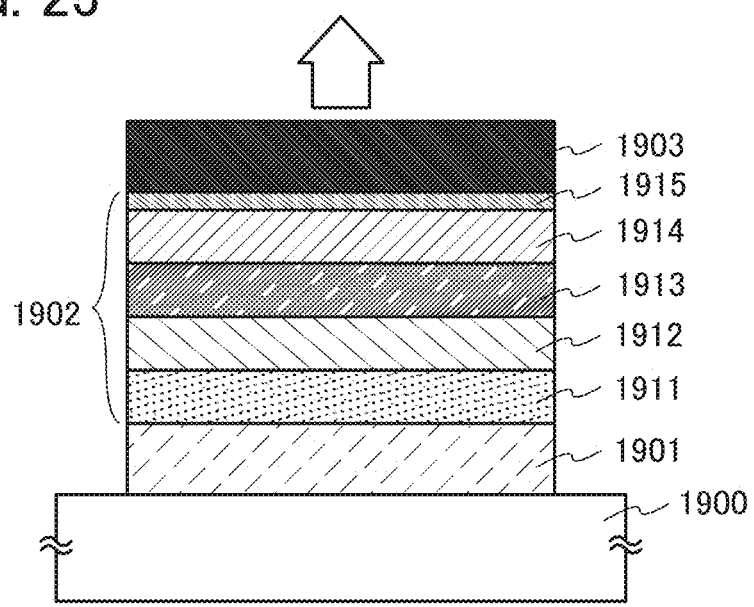
FIG. 25 illustrates a light-emitting element in Example 1.

In this example, element structures and properties of light-emitting elements that can be used in one embodiment of the present invention will be described. Note that FIG. 25 illustrates an element structure of light-emitting elements described in this example, and Table 1 shows specific structures. Chemical formulae of materials used in this example are shown below.

TABLE 1

| | First electrode | Hole-injection layer | Hole-transport layer | | Light-emitting layer | Electron-transport layer | Electron-injection layer | | Second electrode | |
|---|---|---|---|---|---|---|---|---|---|---|
| Light-emitting element 1(R) | APC\ ITSO (110 nm) | PCPPn:MoOx (1:0.5) (20 nm) | PCPPn (15 nm) | PCBBiF (55 nm) | * | 2mDBTBPDBq-II (10 nm) | NBphen (10 nm) | LiF (1 nm) | Ag:Mg (1:0.1) (25 nm) | ITO (70 nm) |
| Light-emitting element 2(G) | APC\ ITSO (110 nm) | PCPPn:MoOx (1:0.5) (7.5 nm) | PCPPn (15 nm) | PCBBiF (35 nm) | ** | 2mDBTBPDBq-II (10 nm) | NBphen (10 nm) | LiF (1 nm) | Ag:Mg (1:0.1) (25 nm) | ITO (70 nm) |
| Light-emitting element 3(B) | APC\ ITSO (110 nm) | PCPPn:MoOx (1:0.5) (17.5 nm) | PCPPn (15 nm) | | *** | 2mDBTBPDBq-II (10 nm) | NBphen (10 nm) | LiF (1 nm) | Ag:Mg (1:0.1) (25 nm) | ITO (70 nm) |

* 2mDBTBPDBq-II:PCBBiF:[Ir(dmdppr-P)$_2$(dibm)] (0.8:0.2:0.06 (70 nm))

** 2mDBTBPDBq-II:PCBBiF:[Ir(tBuppm)$_3$] (0.8:0.2:0.06 (40 nm))

*** cgDBCzPA:1,6BnfAPrn-03 (1:0.03 (25 nm))

[Chemical formula 1]
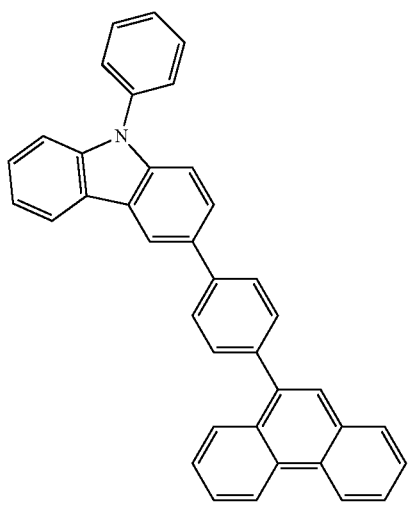
PCPPn
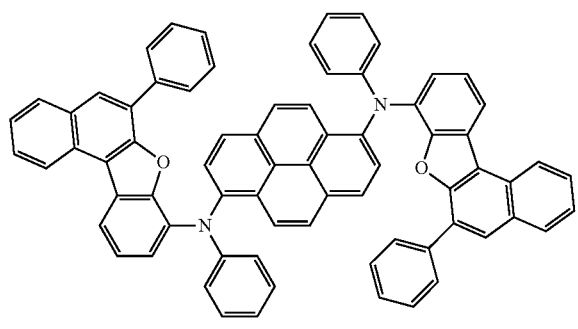
1,6BnfAPrn-03
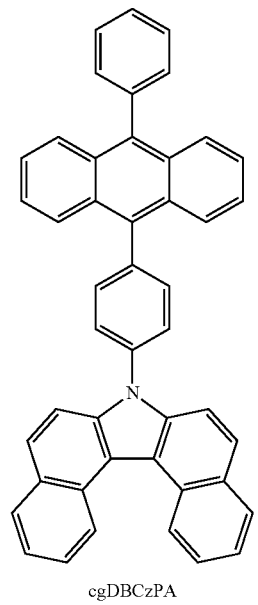
cgDBCzPA
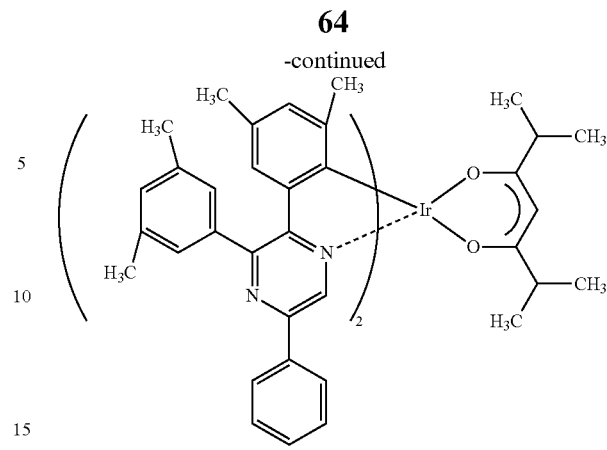
[Ir(dmdppr-P)₂(dibm)]
2mDBTBPDBq-II
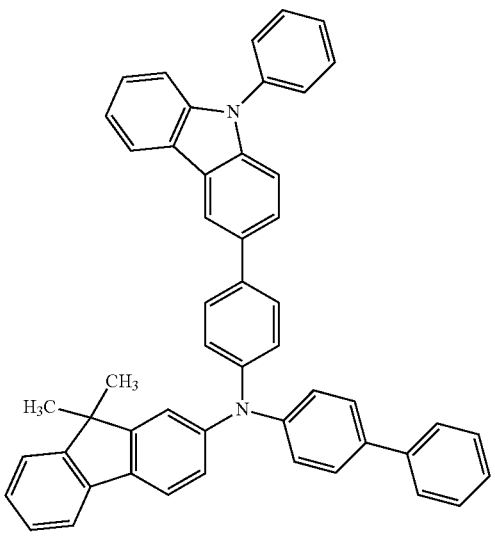
PCBBiF
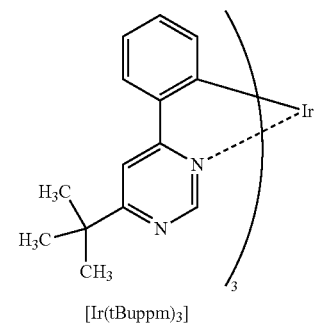
[Ir(tBuppm)₃]

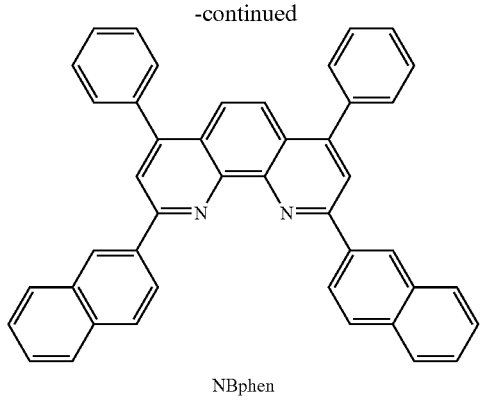

NBphen

<<Fabrication of Light-Emitting Elements>>

The light-emitting elements described in this example each included, as illustrated in FIG. 25, a first electrode 1901 over a substrate 1900, an EL layer 1902 over the first electrode 1901, and a second electrode 1903 over the EL layer 1902. In the EL layer 1902, a hole-injection layer 1911, a hole-transport layer 1912, a light-emitting layer 1913, an electron-transport layer 1914, and an electron-injection layer 1915 were stacked in this order from the first electrode 1901 side. Note that a light-emitting element 1 in this example was a light-emitting element emitting mainly red light and is also referred to as a light-emitting element 1(R). A light-emitting element 2 was a light-emitting element emitting mainly green light and is also referred to as a light-emitting element 2(G). A light-emitting element 3 was a light-emitting element emitting mainly blue light and is also referred to as a light-emitting element 3(B).

First, the first electrode 1901 was formed over the substrate 1900. The electrode area was set to 4 mm$^2$ (2 mm×2 mm). A glass substrate was used as the substrate 1900. The first electrode 1901 was formed in the following manner: an alloy film of silver (Ag), palladium (Pd), and copper (Cu) (an Ag—Pd—Cu (APC) film) was formed to a thickness of 200 nm by a sputtering method, and an ITSO film was formed to a thickness of 110 nm by a sputtering method. In this example, the first electrode 1901 functioned as an anode. The first electrode 1901 was a reflective electrode having a function of reflecting light.

As pretreatment, a surface of the substrate was washed with water, baking was performed at 200° C. for one hour, and then UV ozone treatment was performed for 370 seconds. After that, the substrate was transferred into a vacuum evaporation apparatus where the pressure had been reduced to approximately $10^{-4}$ Pa, and was subjected to vacuum baking at 170° C. for 60 minutes in a heating chamber of the vacuum evaporation apparatus, and then the substrate was cooled down for about 30 minutes.

Next, the hole-injection layer 1911 was formed over the first electrode 1901. After the pressure in the vacuum evaporation apparatus was reduced to $10^{-4}$ Pa, the hole-injection layer 1911 was formed by co-evaporation to have a weight ratio of 3-[4-(9-phenanthryl)-phenyl]-9-phenyl-9H-carbazole (abbreviation: PCPPn) to molybdenum oxide of 1:0.5. The thickness of the hole-injection layer 1911 was 20 nm in the light-emitting element 1(R), 7.5 nm in the light-emitting element 2(G), and 17.5 nm in the light-emitting element 3(B).

Then, the hole-transport layer 1912 was formed over the hole-injection layer 1911. In each of the light-emitting element 1(R), the light-emitting element 2(G), and the light-emitting element 3(B), PCPPn was deposited by evaporation to a thickness of 15 nm. In the light-emitting element 1(R) and the light-emitting element 2(G), N-(1,1'-biphenyl-4-yl)-N-[4-(9-phenyl-9H-carbazol-3-yl)phenyl]-9,9-dimethyl-9H-fluoren-2-amine (abbreviation: PCBBiF) was also deposited by evaporation. The thickness of PCBBiF was 55 nm in the light-emitting element 1(R) and 35 nm in the light-emitting element 2(G).

Next, the light-emitting layer 1913 was formed over the hole-transport layer 1912.

As the light-emitting layer 1913 of the light-emitting element 1(R), 2-[3'-(dibenzothiophen-4-yl)biphenyl-3-yl]dibenzo[f,h]quinoxaline (abbreviation: 2mDBTBPDBq-II), PCBBiF, and bis{4,6-dimethyl-2-[3-(3,5-dimethylphenyl)-5-phenyl-2-pyrazinyl-κN]phenyl-κC}(2,6-dimethyl-3,5-heptanedionato-κ$^2$O,O')iridium(III) (abbreviation: [Ir(dmdppr-P)$_2$(dibm)]) were deposited by co-evaporation to a thickness of 70 nm such that the weight ratio of 2mDBTBPDBq-II to PCBBiF to [Ir(dmdppr-P)$_2$(dibm)] was 0.8:0.2:0.06.

As the light-emitting layer 1913 of the light-emitting element 2(G), 2mDBTBPDBq-II, PCBBiF, and tris(4-t-butyl-6-phenylpyrimidinato)iridium(III) (abbreviation: [Ir(tBuppm)$_3$]) were deposited by co-evaporation to a thickness of 40 nm such that the weight ratio of 2mDBTBPDBq-II to PCBBiF to [Ir(tBuppm)$_3$] was 0.8:0.2:0.06.

As the light-emitting layer 1913 of the light-emitting element 3(B), 7-[4-(10-phenyl-9-anthryl)phenyl]-7H-dibenzo[c,g]carbazole (abbreviation: cgDBCzPA) and N,N'-(pyrene-1,6-diyl)bis[(6,N-diphenylbenzo[b]naphtho[1,2-d]furan)-8-amine] (abbreviation: 1,6BnfAPrn-03) were deposited by co-evaporation to a thickness of 25 nm such that the weight ratio of cgDBCzPA to 1,6BnfAPrn-03 was 1:0.03.

Next, the electron-transport layer 1914 was formed over the light-emitting layer 1913. The electron-transport layer 1914 was formed in the following manner: 2mDBTBPDBq-II and 2,9-bis(naphthalen-2-yl)-4,7-diphenyl-1,10-phenanthroline (abbreviation: NBphen) were sequentially deposited by evaporation to each have a thickness of 10 nm.

Then, the electron-injection layer 1915 was formed over the electron-transport layer 1914. As the electron-injection layer 1915, lithium fluoride (LiF) was deposited by evaporation to a thickness of 1 nm.

Then, the second electrode 1903 was formed over the electron-injection layer 1915 in the following manner: silver (Ag) and magnesium (Mg) were deposited by co-evaporation to a thickness of 25 nm at a volume ratio of Ag to Mg of 1:0.1, and then an indium tin oxide (ITO) was deposited to a thickness of 70 nm by a sputtering method. In this example, the second electrode 1903 functioned as a cathode. Moreover, the second electrode 1903 was a transflective electrode having functions of transmitting light and reflecting light.

Through the above steps, the light-emitting elements in each of which the EL layer was provided between the pair of electrodes were each formed over the substrate 1900. The hole-injection layer 1911, the hole-transport layer 1912, the light-emitting layer 1913, the electron-transport layer 1914, and the electron-injection layer 1915 described above were functional layers included in the EL layer of one embodiment of the present invention. Furthermore, in all the evaporation steps in the above fabrication method, evaporation was performed by a resistance-heating method.

Each of the light-emitting elements formed in this example was sealed between the substrate 1900 and a sealing substrate. The sealing between the substrate 1900 and the sealing substrate was performed in such a manner that the sealing substrate was fixed to the substrate 1900 with a sealing material in a glove box containing a nitrogen atmosphere, a sealant was applied so as to surround the light-emitting element formed over the substrate 1900, and then irradiation with 365-nm ultraviolet light at 6 J/cm$^2$ was performed and heat treatment was performed at 80° C. for 1 hour.

The light-emitting elements formed in this example each had a structure in which light was emitted in the direction indicated by the arrow from the second electrode 1903 side of the light-emitting element.

The chromaticities (x, y) of the light-emitting elements formed in this example measured with a luminance colorimeter (BM-5AS manufactured by TOPCON CORPORATION) are shown in Table 2 below. The chromaticities of the light-emitting elements 1(R), 2(G), and 3(B) were measured at luminances of 1468 cd/m$^2$, 4329 cd/m$^2$, and 310 cd/m$^2$, respectively.

TABLE 2

|  | Chromaticity coordinate x | Chromaticity coordinate y |
| --- | --- | --- |
| Light-emitting element 1(R) | 0.711 | 0.289 |
| Light-emitting element 2(G) | 0.171 | 0.794 |
| Light-emitting element 3(B) | 0.142 | 0.036 |

The above results show that, in this example, the light-emitting element 1(R) had a chromaticity coordinate x of greater than 0.680 and less than or equal to 0.720 and a chromaticity coordinate y of greater than or equal to 0.260 and less than or equal to 0.320, the light-emitting element 2(G) had a chromaticity coordinate x of greater than or equal to 0.130 and less than or equal to 0.250 and a chromaticity coordinate y of greater than 0.710 and less than or equal to 0.810, and the light-emitting element 3(B) had a chromaticity coordinate x of greater than or equal to 0.120 and less than or equal to 0.170 and a chromaticity coordinate y of greater than or equal to 0.020 and less than 0.060. The light-emitting element 1(R) had a chromaticity coordinate x of greater than 0.680 and thus had a better red chromaticity than the DCI-P3 standard. The light-emitting element 2 (G) had a chromaticity coordinate y of greater than 0.710 and thus had a better green chromaticity than the DCI-P3 standard and the NTSC standard. In addition, the light-emitting element 3(B) had a chromaticity coordinate y of less than 0.060 and thus had a better blue chromaticity than the DCI-P3 standard.

Although the chromaticities (x, y) of the light-emitting elements obtained here were chromaticities on the CIE 1931 chromaticity coordinates (x,y chromaticity coordinates), chromaticities on the CIE 1976 chromaticity coordinates (u',v' chromaticity coordinates), which are defined so that the perceived color differences may correspond to distances equivalent in the color space, can be obtained with the use of the following conversion equations (1).

[Formula 1]

$$\left. \begin{array}{l} u' = 4x/(12y - 2x + 3) \\ v' = 9y/(12y - 2x + 3) \end{array} \right\} \quad (1)$$

Figure 26:
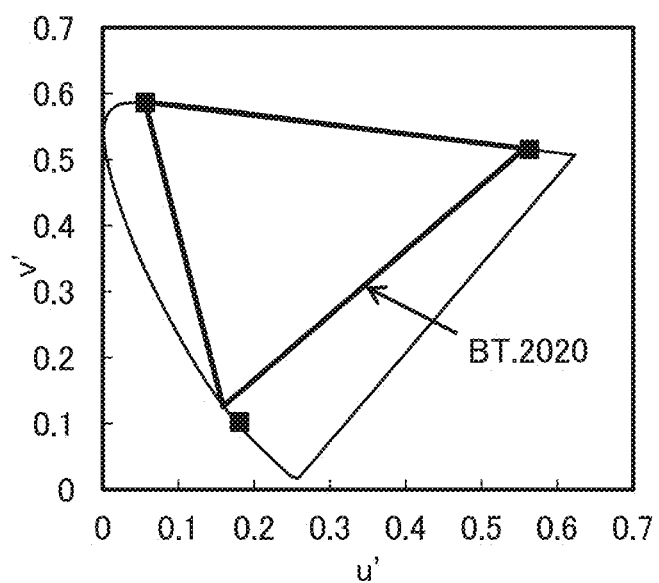
FIG. 26 is a chromaticity diagram of a light-emitting element in Example 1 obtained by calculation.

The chromaticities of the light-emitting elements in this example on the CIE 1976 chromaticity coordinates (u',v' chromaticity coordinates) are listed in Table 3 below. Table 4 shows the chromaticity coordinates in accordance with the BT.2020 standard for comparison. In addition, FIG. 26 shows a chromaticity diagram.

TABLE 3

|  | Chromaticity coordinate u' | Chromaticity coordinate v' |
| --- | --- | --- |
| Light-emitting element 1(R) | 0.563 | 0.516 |
| Light-emitting element 2(G) | 0.056 | 0.586 |
| Light-emitting element 3(B) | 0.181 | 0.103 |

TABLE 4

|  | Chromaticity coordinate u' | Chromaticity coordinate v' |
| --- | --- | --- |
| BT.2020 (R) | 0.557 | 0.517 |
| BT.2020 (G) | 0.056 | 0.587 |
| BT.2020 (B) | 0.159 | 0.126 |

On the basis of the results in Table 3, the BT.2020 area ratio and the BT.2020 coverage calculated from the chromaticities (u',v') are 106% and 97%, respectively. Note that an area A of a triangle formed by connecting the CIE chromaticity coordinates (u',v') of RGB which fulfill the BT.2020 standard and an area B of a triangle formed by connecting the CIE chromaticity coordinates (u',v') of the three light-emitting elements in this example are calculated to obtain the area ratio (B/A). The coverage is a value which represents how much percentage of the BT.2020 standard color gamut (the inside of the above triangle) can be reproduced using a combination of the chromaticities of the three light-emitting elements in this example.

In this example, the light-emitting element emitting red light, that emitting green light, and that emitting blue light were fabricated. The light-emitting layers of these light-emitting elements were formed using the respective materials and the hole-transport layers were formed to have the respective thicknesses in order to adjust the optical path lengths. At the same time, in these light-emitting elements, the electron-transport layers were formed using the same materials to have the same thickness and the electron-injection layers were also formed using the same material to have the same thickness; thus, the combination of these light-emitting elements can reduce the number of steps as compared to that in the case where these layers are formed to have structures different between the light-emitting elements. In this manner, the three light-emitting elements achieve wide-range color reproducibility despite the fact that many kinds of layers in the EL layers each had a common structure between the light-emitting elements. Note that although the thickness of the hole-injection layer was different between the colors in this example, the hole-injection layers in the light-emitting elements for the three colors may have the same thickness.

In each of the light-emitting elements in this example for the three colors, the same material was used for the layer that constituted the hole-transport layer and that was in contact with the hole-injection layer. The hole-transport layer in the light-emitting element 1(R) and that in the light-emitting element 2(G) each included the PCPPn layer that was in contact with the hole-injection layer and the PCBBiF layer that was in contact with the light-emitting layer. The hole-transport layer in the light-emitting element 3(B) included only the PCPPn layer that was in contact with both the hole-injection layer and the light-emitting layer.

Note that in an element emitting blue fluorescence, the HOMO level and the LUMO level of a host material in a light-emitting layer are deep. Depending on the material for a hole-injection layer, the HOMO level of a hole-transport layer often needs to be shallow so that electrons can be extracted from the hole-injection layer. In that case, the hole-transport layer needs to have a structure in which a layer with a shallow HOMO level and a layer with a deep HOMO level are sequentially stacked. Here, the mixed layer of PCPPn and a metal oxide was used as the hole-injection layer in the light-emitting element 3(B). The use of PCPPn with a deep HOMO level for the mixed layer allows the hole-transport layer to be formed using PCPPn with a deep HOMO level. Accordingly, even when the hole-transport layer has a single-layer structure, holes can be injected into the light-emitting layer emitting blue fluorescence.

In each of the light-emitting element 1(R) and the light-emitting element 2(G), the PCBBiF layer served as a layer for adjusting the optical path length. PCBBiF has a shallower HOMO level than PCPPn. Thus, the power consumption of the light-emitting element 1(R) and the light-emitting element 2(G) can be reduced. PCBBiF was also contained in the light-emitting layers of the light-emitting element 1(R) and the light-emitting element 2(G).

As described above, in the structure of this example, the light-emitting elements or a plurality of layers can use the same material, and the number of layers included in the light-emitting element can be reduced. It was suggested that the light-emitting elements with favorable characteristics can be manufactured at lower costs in a shorter process time, and furthermore, a display panel with favorable characteristics can be provided.

According to the above results, the use of the light-emitting elements described in this example can offer extremely wide-range color reproducibility.

Example 2

In this example, the results of fabricating the display device of one embodiment of the present invention are described.

<Display Panel>

First, the display panel used in the display device in this example is described.

Figure 27A:
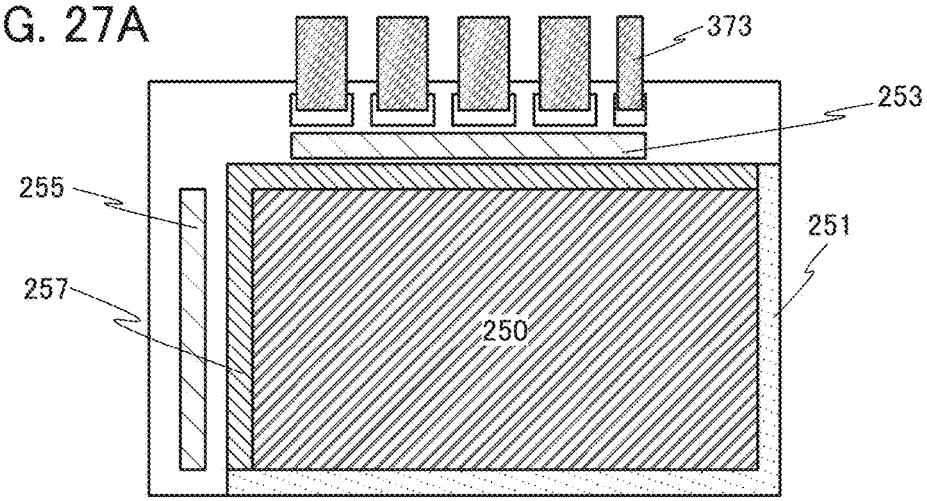
FIG. 27A is a top view illustrating a display panel in Example 2 and FIGS. 27B and 27C are a top view and a cross-sectional view illustrating a display device in Example 2.

FIG. 27A is a schematic view of the display panel in this example. The display panel illustrated in FIG. 27A was an active matrix organic EL display that had the light-emitting portion 250 with a size of 13.5 inches diagonally, 1280×720 effective pixels, a resolution of 108 ppi, and an aperture ratio of 41.3%. The display panel included the demultiplexer 253 serving as a source driver. In addition, the display panel also included the scan driver 255. Two sides of the light-emitting portion 250 were in contact with the region 251 transmitting visible light. The lead wiring 257 was provided along the other two sides.

A channel-etched transistor including a crystalline metal oxide in a semiconductor layer was used. An In—Ga—Zn-based oxide was used as the metal oxide.

Top-emission organic EL elements having a microcavity structure were used as light-emitting elements. As a color display method, a side-by-side (SBS) method was employed in which light-emitting layers for different colors are arranged side by side. The light-emitting layers of the light-emitting elements were formed separately for each color. Example 1 can be referred to for the details of the structures of the light-emitting elements for different colors. The area ratio with respect to the BT.2020 color gamut was 106%.

Figure 27B:
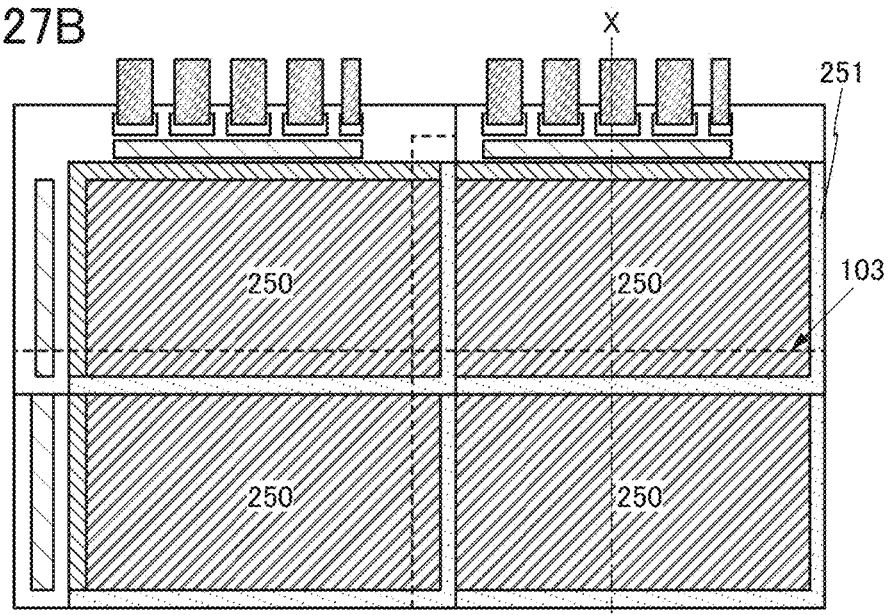
Figure 27C:
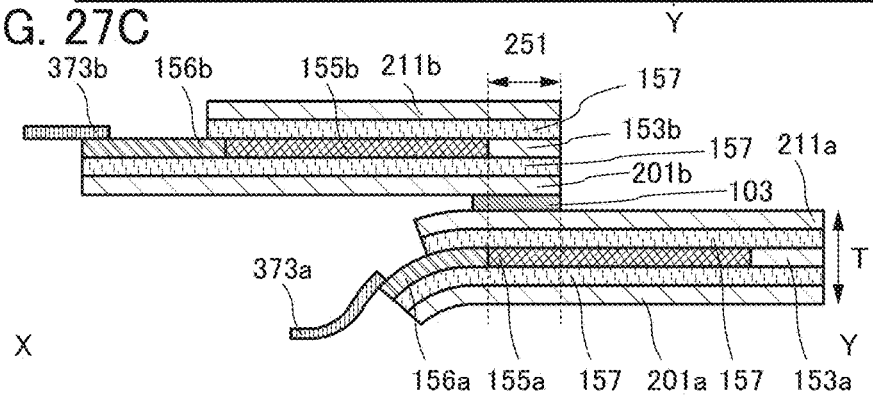

FIG. 27B is a schematic view of a display device in which four display panels overlap with each other and are arranged in a 2×2 matrix. FIG. 27C shows a schematic cross-sectional view taken along a dashed dotted line X-Y of the display device of FIG. 27B.

The display device in this example was formed by overlapping a plurality of display panels so that a non-display region between display regions was small. Specifically, the light-transmitting layer 103 was provided between the region 251 transmitting visible light of an upper display panel and the light-emitting portion 250 of a lower display panel.

A component blocking visible light such as a lead wiring or a driver was not provided at all from an end portion of the light-emitting portion 250 to an end portion of the display panel along two sides of the display panel, and the region along two sides served as the region 251 transmitting visible light. The width of the region 251 transmitting visible light of the display panel was approximately 5 mm. The thickness T of the region 251 transmitting visible light (which can be regarded as the thickness of one display panel) was very small, which was 100 µm or less. Therefore, although the display device in this example had a region in which at most four display panels overlapped with each other, a step formed on the display surface side was extremely small; thus, a seam hardly stood out.

The four display panels had flexibility. For example, as illustrate in FIG. 27C, a region near an FPC 373a of the lower display panel can be bent so that part of the lower display panel and part of the FPC 373a can be placed under the light-emitting portion 250 of the upper display panel adjacent to the FPC 373a. As a result, the FPC 373a can be placed without physical interference with the rear surface of the upper display panel. In this way, another display panel can be provided on four sides of the display panel, whereby a large-sized display device is easily realized.

In this example, an attachment film including attachment layers on both surfaces of a base material was used as the light-transmitting layer 103. With use of the attachment film, two display panels included in the display device can be detachably attached to each other. An attachment layer on one side of the light-transmitting layer 103 was attached to a substrate 211a, and an attachment layer on the other side of the light-transmitting layer 103 was attached to a substrate 201b.

In FIG. 27B, the light-transmitting layer 103 includes not only a portion overlapping with the region 251 transmitting visible light, but also a portion overlapping with the light-emitting portion 250. In FIG. 27C, the light-transmitting layer 103 overlaps with the entire region 251 transmitting visible light from an end portion of the substrate 201b, and also overlaps with part of the region 155b including a display element. Note that the light-transmitting layer 103 is not provided on a curved portion of the display panel that is close to a portion to which the FPC 373a is connected in FIG. 27C. However, the light-transmitting layer 103 may be provided on a curved portion of the display panel depending on the thickness or flexibility of the light-transmitting layer 103.

Each of the display panels was formed by attaching a substrate and an element layer with a bonding layer. For example, as illustrated in FIG. 27C, a substrate 201a, the substrate 211a, the substrate 201b, and a substrate 211b are attached to an element layer 153a, the element layer 153a, an element layer 153b, and the element layer 153b, respectively, with a bonding layer 157. As the substrates, highly optically isotropic films were used. The element layer 153a has a region 155a including a display element and a region 156a including a wiring electrically connected to the display element. Similarly, the element layer 153b has the region 155b including a display element and a region 156b including a wiring electrically connected to the display element.

<<Display Device>>

Figure 28:
FIG. 28 shows a photograph of an image displayed by a display device in Example 2.

FIG. 28 shows a photograph of an image displayed by an 81-inch diagonal multidisplay. The multidisplay was manufactured by using 36 (6×6) display panels.

In this example, the display panels were driven by respective driver circuits. A signal output from an 8K recorder was divided into 36 parts and input to respective driver circuits. The timing of scanning in the first stage of each display panel was set to be at the same time.

The multidisplay in FIG. 28 was a display device having a high resolution of 8K4K with 7690×4320 effective pixels. Note that the weight of one display panel including an FPC was approximately 26 g, and the weight of the 36 display panels was less than or equal to 1 kg (here, the weight of the display panel and an FPC is mentioned, and the weight of a frame for fixing the display panel, and the like is not included).

Figure 29A:
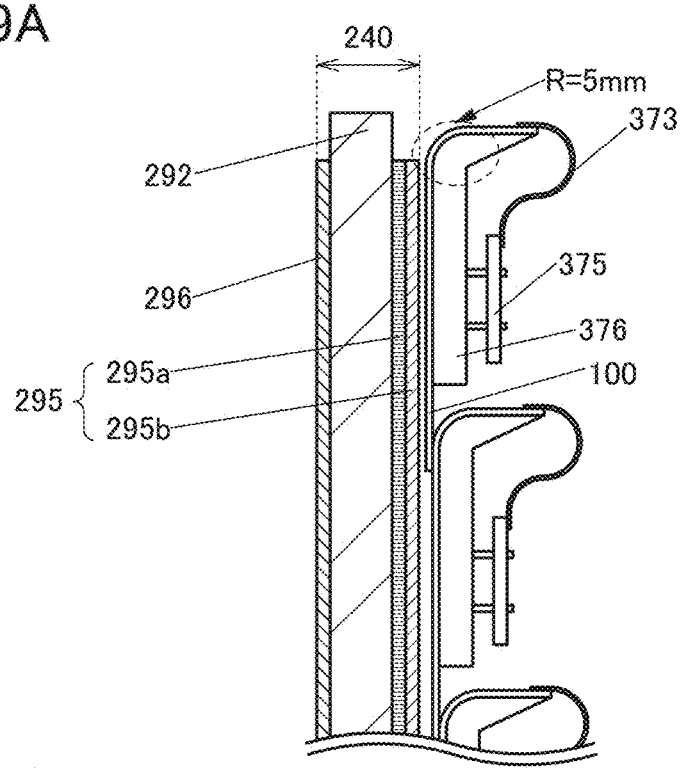
FIG. 29A is a side view illustrating a display device in Example 2 and FIG. 29B is a perspective view illustrating a circularly polarizing plate.

FIG. 29A illustrates a side view of the multidisplay. The display panel 100 was attached to one plane of a support 376 (aluminum plate). The support 376 had a curved surface whose curvature radius R was 5 mm, and the display panel 100 was curved along the curved surface. The display panel 100 had a portion extending from the support 376. The portion overlapped with an adjacent display panel 100. A driver circuit 375 was screwed on the other plane of the support 376. The display panel 100 was electrically connected to the driver circuit 375 with the FPC 373.

Figure 29B:
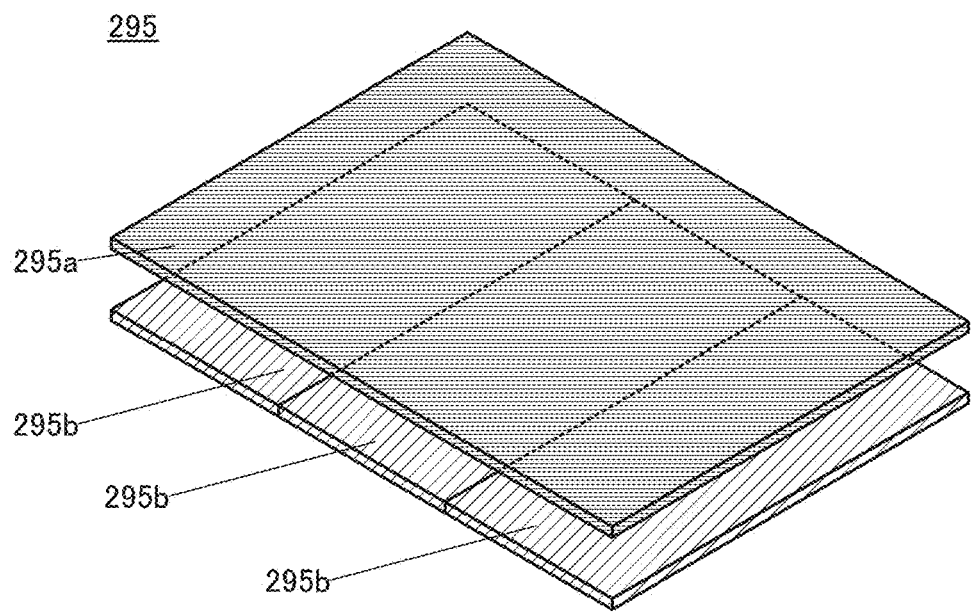

The optical member 240 included the anti-reflection member 296, the support member 292, and the circularly polarizing plate 295. In the circularly polarizing plate 295, a linear polarizing plate 295a was positioned on the viewer side and a quarter-wave plate 295b was positioned on the display panel 100 side. Here, the quarter-wave plate 295b overlapped with the linear polarizing plate 295a to have an axis that intersected an axis of the linear polarizing plate 295a at 45°. Therefore, in manufacturing a large-sized multidisplay, the circularly polarizing plate 295 needs to be formed by using a plurality of the linear polarizing plates 295a or a plurality of the quarter-wave plates 295b. Here, the quarter-wave plate 295b is thinner than the linear polarizing plate 295a and is seen through the linear polarizing plate 295a. Accordingly, a seam is less likely to be noticed in the case where a plurality of the quarter-wave plates 295b are used than in the case where a plurality of the linear polarizing plates 295a are used. In this example, the circularly polarizing plate 295 was formed by attaching three quarter-wave plates 295b to the linear polarizing plate 295a as illustrated in FIG. 29B.

The optical member 240 was screwed on a housing while the optical member 240 was closely attached to the display panels. The optical member 240 was not bonded to the display panels.

As described above, a large-sized display device capable of displaying an image with a wide color gamut was fabricated in this example. Furthermore, in this example, a display device in which an overlapping area was less likely to be noticed was fabricated using a display panel utilizing a film that was highly optically isotropic and a circularly polarizing plate. Specifically, the display device fabricated in this example had little reflection of surroundings. Furthermore, the overlapping area was not obvious and was less likely to be noticed. Thus, the reflection of light from a surface of the display device was suppressed.

REFERENCE NUMERALS

10: display device, 12: display device, 13: display region, 15: pillar, 16: wall, 100: display panel, 100a: display panel, 100b: display panel, 100c: display panel, 100d: display panel, 101: display region, 101a: display region, 101b: display region, 101c: display region, 101d: display region, 102: region, 102a: region, 102b: region, 103: light-transmitting layer, 110: region transmitting visible light, 110a: region transmitting visible light, 110b: region transmitting visible light, 110c: region transmitting visible light, 110d: region transmitting visible light, 112a: FPC, 112b: FPC, 120: region blocking visible light, 120a: region blocking visible light, 120b: region blocking visible light, 120c: region blocking visible light, 121: dummy wiring, 123: FPC, 131: resin layer, 132: protective substrate, 133: resin layer, 134: protective substrate, 141: pixel, 142a: wiring, 142b: wiring, 143a: circuit, 143b: circuit, 145: wiring, 151: substrate, 152: substrate, 153a: element layer, 153b: element layer, 154: bonding layer, 155a: region, 155b: region, 156a: region, 156b: region, 157: bonding layer, 201: substrate, 201a: substrate, 201b: substrate, 202a: substrate, 202b: substrate, 203: bonding layer, 205: insulating layer, 208: insulating layer, 209: element layer, 211: substrate, 211a: substrate, 211b: substrate, 212a: substrate, 212b: substrate, 213: bonding layer, 215: insulating layer, 219: functional layer, 221: bonding layer, 223: connection terminal, 240: optical member, 250: light-emitting portion, 251: region transmitting visible light, 257: wiring, 261: substrate, 291: anti-reflection member, 292: support member, 293: anti-reflection member, 295: circularly polarizing plate, 296: anti-reflection member, 300: touch panel, 301: transistor, 302: transistor, 303: transistor, 304: light-emitting element, 305: capacitor, 306: connection portion, 307: conductive layer, 308: connection portion, 309: connector, 310: input device, 311: gate insulating layer, 312: insulating layer, 313: insulating layer, 314: insulating layer, 315: insulating layer, 316: spacer, 317: bonding layer, 318: input device, 319: connector, 320: touch panel, 321: electrode, 322: EL layer, 323: electrode, 324: optical adjustment layer, 325: coloring layer, 326: light-blocking layer, 331: electrode, 332: electrode, 333: electrode, 334: electrode, 341: wiring, 342: wiring, 347: region, 348: region, 349: region, 350: FPC, 351: IC, 355: conductive layer, 370: display panel, 370A: display panel, 370B: display panel, 370C: display panel, 370D: display panel, 373: FPC, 373a: FPC, 374: IC, 375: driver circuit, 379: display panel, 381: display portion, 382: driver circuit portion, 383: wiring, 387: crossing portion, 393: insulating layer, 395: insulating layer, 396: bonding layer, 1101: first electrode, 1102: second electrode, 1103: EL layer, 1103B: EL layer, 1103G: EL layer, 1103R: EL layer, 1104B: color filter, 1104G: color filter, 1104R: color filter, 1105B: third light-emitting element, 1105G: second light-emitting element, 1105R: first light-emitting element, 1106B: blue light, 1106G: green light, 1106R: red light, 1201: first electrode, 1202: second electrode, 1203: EL layer, 1203a: EL layer, 1203b: EL layer, 1204: charge generation layer, 1211: hole-injection layer, 1211a: hole-injection layer, 1211b: hole-injection layer, 1212: hole-transport layer, 1212a: hole-transport layer, 1212b: hole-transport layer, 1213: light-emitting layer, 1213a: light-emitting layer, 1213b: light-emitting layer, 1214: electron-transport layer, 1214a: electron-transport layer, 1214b: electron-transport layer, 1215: electron-injection layer, 1215a: electron-injection layer, 1215b: electron-injection layer, 1301: substrate, 1302: FET, 1303B: light-emitting element, 1303G: light-emitting element, 1303R: light-emitting element, 1303W: light-emitting element, 1304: EL layer, 1305: substrate, 1306B: color filter, 1306G: color filter, 1306R: color filter, 1316B: optical path length, 1316G: optical path length, 1316R: optical path length, 1307: first electrode, 1308: second electrode, 1309: black layer, 1310G: conductive layer, 1310R: conductive layer, 1900: substrate, 1901: first electrode, 1902: EL layer, 1903: second electrode, 1911: hole-injection layer, 1912: hole-transport layer, 1913: light-emitting layer, 1914: electron-transport layer, 1915: electron-injection layer, 7000: display portion, 7001: display portion, 7100: mobile phone, 7101: housing, 7103: operation button, 7104: external connection port, 7105: speaker, 7106: microphone, 7200: television set, 7201: housing, 7203: stand, 7211: remote controller, 7300: portable information terminal, 7301: housing, 7302: operation button, 7303: information, 7400: lighting device, 7401: stage, 7402: light-emitting portion, 7403: operation switch, 7500: portable information terminal, 7501: housing, 7502: display portion tab, 7503: operation button, 7600: portable information terminal, 7601: housing, 7602: hinge, 7650: portable information terminal, 7651: non-display portion, 7700: portable information terminal, 7701: housing, 7703a: button, 7703b: button, 7704a: speaker, 7704b: speaker, 7705: external connection port, 7706: microphone, 7709: battery, 7800: portable information terminal, 7801: band, 7802: input-output terminal, 7803: operation button, 7804: icon, 7805: battery. This application is based on Japanese Patent Application Serial No. 2016-233446 filed with Japan Patent Office on Nov. 30, 2016 and Japanese Patent Application Serial No. 2017-098884 filed with Japan Patent Office on May 18, 2017, the entire contents of which are hereby incorporated by reference.

The invention claimed is:

1. A display device comprising a first display panel and a second display panel,
wherein the first display panel comprises a first display region,
wherein the second display panel comprises a second display region and a region transmitting visible light,
wherein the second display region is adjacent to the region transmitting the visible light,
wherein the first display region comprises a portion overlapping with the region transmitting the visible light,
wherein the first display panel comprises a first light-emitting element, a second light-emitting element, and a third light-emitting element,
wherein light emitted from the first light-emitting element has a CIE 1931 chromaticity coordinate x of greater than 0.680 and less than or equal to 0.720 and a CIE 1931 chromaticity coordinate y of greater than or equal to 0.260 and less than or equal to 0.320,
wherein light emitted from the second light-emitting element has a CIE 1931 chromaticity coordinate x of greater than or equal to 0.130 and less than or equal to 0.250 and a CIE 1931 chromaticity coordinate y of greater than 0.710 and less than or equal to 0.810, and
wherein light emitted from the third light-emitting element has a CIE 1931 chromaticity coordinate x of greater than or equal to 0.120 and less than or equal to 0.170 and a CIE 1931 chromaticity coordinate y of greater than or equal to 0.020 and less than 0.060.

2. The display device according to claim 1,
wherein the first light-emitting element, the second light-emitting element, and the third light-emitting element comprise an electron-transport layer between a pair of electrodes and each comprise a light-emitting layer between the pair of electrodes,
wherein the light-emitting layer in the first light-emitting element, the light-emitting layer in the second light-emitting element, and the light-emitting layer in the third light-emitting element are separated from each other, and
wherein the first light-emitting element, the second light-emitting element, and the third light-emitting element share the same electron-transport layer.

3. The display device according to claim 2,
wherein the first light-emitting element, the second light-emitting element, and the third light-emitting element comprise a hole-injection layer between the pair of electrodes, and
wherein the first light-emitting element, the second light-emitting element, and the third light-emitting element share the same hole-injection layer.

4. The display device according to claim 2,
wherein the first light-emitting element, the second light-emitting element, and the third light-emitting element each comprise a hole-transport layer between the pair of electrodes, and
wherein the hole-transport layer in the first light-emitting element, the hole-transport layer in the second light-emitting element, and the hole-transport layer in the third light-emitting element are separated from each other.

5. The display device according to claim 2,
wherein the first light-emitting element, the second light-emitting element, and the third light-emitting element each comprise a reflective electrode and a transflective electrode as the pair of electrodes.

6. The display device according to claim 1, wherein one or both of the first display region and the second display region comprise a curved surface.

7. The display device according to claim 1,
wherein the first display panel comprises a first curved surface and a second curved surface,
wherein a radius of curvature of the first curved surface is larger than a radius of curvature of the second curved surface,
wherein the first curved surface comprises the first display region, and
wherein the second curved surface does not comprise the first display region.

8. The display device according to claim 7,
wherein the radius of curvature of the first curved surface is larger than the radius of curvature of the second curved surface and is less than or equal to 10000 mm, and wherein the radius of curvature of the second curved surface is greater than or equal to 1 mm and less than or equal to 100 mm.

9. The display device according to claim 1, further comprising a light-transmitting layer,
wherein the first display region overlaps with the region transmitting the visible light with the light-transmitting layer therebetween, and
wherein the light-transmitting layer comprises a portion in which an average value of transmittance with respect to light with a wavelength of greater than or equal to 450 nm and less than or equal to 700 nm is 80% or more.

10. The display device according to claim 1, further comprising a first module and a second module,
wherein the first module comprises the first display panel and at least one of a connector and an integrated circuit, and
wherein the second module comprises the second display panel and at least one of a connector and an integrated circuit.

11. An electronic device comprising:
the display device according to claim 1, and
at least one of an antenna, a battery, a housing, a camera, a speaker, a microphone, and an operation button.

12. A display device comprising a first display panel and a second display panel,
wherein the first display panel comprises a first display region,
wherein the second display panel comprises a second display region and a region transmitting visible light,
wherein the second display region is adjacent to the region transmitting the visible light,
wherein the first display region comprises a portion overlapping with the region transmitting the visible light,
wherein the first display panel comprises a first light-emitting element, a second light-emitting element, a third light-emitting element, a first coloring layer, a second coloring layer, and a third coloring layer,
wherein light obtained from the first light-emitting element through the first coloring layer has a CIE 1931 chromaticity coordinate x of greater than 0.680 and less than or equal to 0.720 and a CIE 1931 chromaticity coordinate y of greater than or equal to 0.260 and less than or equal to 0.320,
wherein light obtained from the second light-emitting element through the second coloring layer has a CIE 1931 chromaticity coordinate x of greater than or equal to 0.130 and less than or equal to 0.250 and a CIE 1931 chromaticity coordinate y of greater than 0.710 and less than or equal to 0.810, and
wherein light obtained from the third light-emitting element through the third coloring layer has a CIE 1931 chromaticity coordinate x of greater than or equal to 0.120 and less than or equal to 0.170 and a CIE 1931 chromaticity coordinate y of greater than or equal to 0.020 and less than 0.060.

13. The display device according to claim 12,
wherein the first light-emitting element, the second light-emitting element, and the third light-emitting element comprise an electron-transport layer between a pair of electrodes and each comprise a light-emitting layer between the pair of electrodes,
wherein the light-emitting layer in the first light-emitting element, the light-emitting layer in the second light-emitting element, and the light-emitting layer in the third light-emitting element are separated from each other, and
wherein the first light-emitting element, the second light-emitting element, and the third light-emitting element share the same electron-transport layer.

14. The display device according to claim 13,
wherein the first light-emitting element, the second light-emitting element, and the third light-emitting element comprise a hole-injection layer between the pair of electrodes, and
wherein the first light-emitting element, the second light-emitting element, and the third light-emitting element share the same hole-injection layer.

15. The display device according to claim 13,
wherein the first light-emitting element, the second light-emitting element, and the third light-emitting element each comprise a hole-transport layer between the pair of electrodes, and
wherein the hole-transport layer in the first light-emitting element, the hole-transport layer in the second light-emitting element, and the hole-transport layer in the third light-emitting element are separated from each other.

16. The display device according to claim 13,
wherein the first light-emitting element, the second light-emitting element, and the third light-emitting element each comprise a reflective electrode and a transflective electrode as the pair of electrodes.

17. The display device according to claim 12, wherein one or both of the first display region and the second display region comprise a curved surface.

18. The display device according to claim 12,
wherein the first display panel comprises a first curved surface and a second curved surface,
wherein a radius of curvature of the first curved surface is larger than a radius of curvature of the second curved surface,
wherein the first curved surface comprises the first display region, and
wherein the second curved surface does not comprise the first display region.

19. The display device according to claim 18,
wherein the radius of curvature of the first curved surface is larger than the radius of curvature of the second curved surface and is less than or equal to 10000 mm, and
wherein the radius of curvature of the second curved surface is greater than or equal to 1 mm and less than or equal to 100 mm.

20. The display device according to claim 12, further comprising a light-transmitting layer,
wherein the first display region overlaps with the region transmitting the visible light with the light-transmitting layer therebetween, and
wherein the light-transmitting layer comprises a portion in which an average value of transmittance with respect to light with a wavelength of greater than or equal to 450 nm and less than or equal to 700 nm is 80% or more.

21. The display device according to claim 12, further comprising a first module and a second module,
wherein the first module comprises the first display panel and at least one of a connector and an integrated circuit, and
wherein the second module comprises the second display panel and at least one of a connector and an integrated circuit.

22. An electronic device comprising:
the display device according to claim 12, and
at least one of an antenna, a battery, a housing, a camera, a speaker, a microphone, and an operation button.

23. A display panel comprising a first light-emitting element, a second light-emitting element, and a third light-emitting element,
wherein light emitted from the first light-emitting element has a CIE 1931 chromaticity coordinate x of greater than 0.680 and less than or equal to 0.720 and a CIE 1931 chromaticity coordinate y of greater than or equal to 0.260 and less than or equal to 0.320,
wherein light emitted from the second light-emitting element has a CIE 1931 chromaticity coordinate x of greater than or equal to 0.130 and less than or equal to 0.250 and a CIE 1931 chromaticity coordinate y of greater than 0.710 and less than or equal to 0.810,
wherein light emitted from the third light-emitting element has a CIE 1931 chromaticity coordinate x of greater than or equal to 0.120 and less than or equal to 0.170 and a CIE 1931 chromaticity coordinate y of greater than or equal to 0.020 and less than 0.060,
wherein the first light-emitting element, the second light-emitting element, and the third light-emitting element comprise a hole-injection layer and a first hole-transport layer and each comprise a light-emitting layer,
wherein the first light-emitting element, the second light-emitting element, and the third light-emitting element share the same hole-injection layer,
wherein the first light-emitting element, the second light-emitting element, and the third light-emitting element share the same first hole-transport layer,
wherein the light-emitting layer in the first light-emitting element, the light-emitting layer in the second light-emitting element, and the light-emitting layer in the third light-emitting element are separated from each other, and
wherein in the third light-emitting element, the first hole-transport layer is in contact with the hole-injection layer and the light-emitting layer.

24. The display panel according to claim 23,
wherein the first light-emitting element and the second light-emitting element each comprise a second hole-transport layer, and
wherein in each of the first light-emitting element and the second light-emitting element, the first hole-transport layer is in contact with the hole-injection layer and the second hole-transport layer is in contact with the light-emitting layer.

25. The display panel according to claim 24, wherein the light-emitting layer and the second hole-transport layer comprise the same material.

26. The display panel according to claim 24, wherein the second hole-transport layer comprises a material with a HOMO level shallower than a HOMO level of a material contained in the first hole-transport layer.

27. The display panel according to claim 23, wherein the hole-injection layer and the first hole-transport layer comprise the same material.

\* \* \* \* \*